United States Patent
Zwaap et al.

(10) Patent No.: US 7,442,413 B2
(45) Date of Patent: Oct. 28, 2008

(54) METHODS AND APPARATUS FOR TREATING A WORK PIECE WITH A VAPOROUS ELEMENT

(75) Inventors: Robert F. Zwaap, Hoosick, NY (US); Troy Berens, Saratoga Springs, NY (US); John R. Tuttle, Mechanicville, NY (US)

(73) Assignee: DayStar Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/282,934

(22) Filed: Nov. 18, 2005

(65) Prior Publication Data

US 2007/0116892 A1    May 24, 2007

(51) Int. Cl.
*C23C 16/00* (2006.01)
(52) U.S. Cl. ............... 427/248.1; 427/561; 427/585; 427/587; 427/592; 118/715; 118/724
(58) Field of Classification Search ............ 427/248.1, 427/255.31, 255.32
See application file for complete search history.

(56) References Cited

U.S. PATENT DOCUMENTS

| | | | | |
|---|---|---|---|---|
| 4,154,631 A | | 5/1979 | Schoolar | 148/175 |
| 4,325,986 A | * | 4/1982 | Baron et al. | 438/62 |
| 4,526,809 A | * | 7/1985 | Hall et al. | 438/95 |
| 4,615,298 A | | 10/1986 | Yamazaki | 118/723 |
| 4,910,043 A | | 3/1990 | Freeman et al. | 427/39 |
| 5,045,409 A | | 9/1991 | Eberspacher et al. | 428/620 |
| 5,138,973 A | | 8/1992 | Davis et al. | 118/723 |
| 5,248,349 A | | 9/1993 | Foote et al. | 136/260 |
| 5,372,646 A | | 12/1994 | Foote et al. | 118/719 |
| 5,730,852 A | | 3/1998 | Bhattacharya et al. | 205/192 |
| 5,773,088 A | | 6/1998 | Bhat | 427/294 |
| 5,804,054 A | | 9/1998 | Bhattacharya et al. | 205/239 |
| 5,904,771 A | * | 5/1999 | Tasaki et al. | 117/105 |

(Continued)

FOREIGN PATENT DOCUMENTS

EP       0211529 A1    2/1987

(Continued)

OTHER PUBLICATIONS

Slocum, Alexander H., "Precision Machine Design—Topic 17—Flexures," 1993 (7 pages).

(Continued)

*Primary Examiner*—Timothy Meeks
*Assistant Examiner*—David Turocy
(74) *Attorney, Agent, or Firm*—Heslin Rothenberg Farley & Mesiti P.C.

(57) ABSTRACT

Methods and apparatus for controlling and delivering a vaporous element or compound, for example, selenium or sulfur, from a solid source to a work piece are provided. The methods and apparatus may be used in photovoltaic cell manufacturing. The apparatus may comprise a treatment chamber, for example, a box furnace or a tube furnace. The chamber may include an inner enclosure, an outer enclosure, and heating sources capable of independent thermal control, for example, in compliance with a predetermined heating schedule. The apparatus include devices and mechanisms for isolating the treatment chambers from the ambient environment. The methods and apparatus may be adapted to control metalloid vapor delivery in photovoltaic cell processing, for example, the processing of CIGS and CIGSS photovoltaic cells.

75 Claims, 28 Drawing Sheets

U.S. PATENT DOCUMENTS

| | | | |
|---|---|---|---|
| 5,910,336 A | 6/1999 | Ishihara et al. | 427/240 |
| 6,048,442 A | 4/2000 | Kushiya et al. | 204/192.28 |
| 6,092,669 A | 7/2000 | Kushiya et al. | 209/298.26 |
| 6,409,837 B1* | 6/2002 | Hillman | 118/712 |
| 6,518,086 B2 | 2/2003 | Beck et al. | 438/95 |
| 6,783,627 B1 | 8/2004 | Mahawili | 156/345.38 |
| 6,787,485 B1 | 9/2004 | Probst | 438/798 |
| 6,858,120 B2 | 2/2005 | Ahn et al. | 204/298.12 |
| 6,863,021 B2 | 3/2005 | Sneh | 118/723 |
| 2003/0230338 A1 | 12/2003 | Menezes | 136/265 |
| 2006/0222768 A1* | 10/2006 | Faguet | 427/248.1 |

FOREIGN PATENT DOCUMENTS

| | | |
|---|---|---|
| EP | 0978882 A2 | 9/2000 |
| EP | 1136586 A | 9/2001 |

OTHER PUBLICATIONS

PCT International Search Report for corresponding application # PCT/US2006/036832 filed Sep. 21, 2006, European Patent Office Searching Authority, dated Jan. 25, 2007.

Written Opinion of the International Searching Authority for corresponding application # PCT/US/2006/036832 filed Sep. 21, 2006, dated Jan. 25, 2007.

Tsuyoshi Ohashi, et al., Thin Films Prepared by Sulfurization of Precursors Consisting of Metallic and Gallium Sulfide Layers, Jpn. J. Appl. Phys. vol. 37 (1998), pp. 6530-6534.

S. Gall, et al., Material analysis of PVD-grown indium sulphide buffer layers for Cu(In,Ga) Se2-based solar cells; Dec. 10, 2004, pp. 138-141.

* cited by examiner

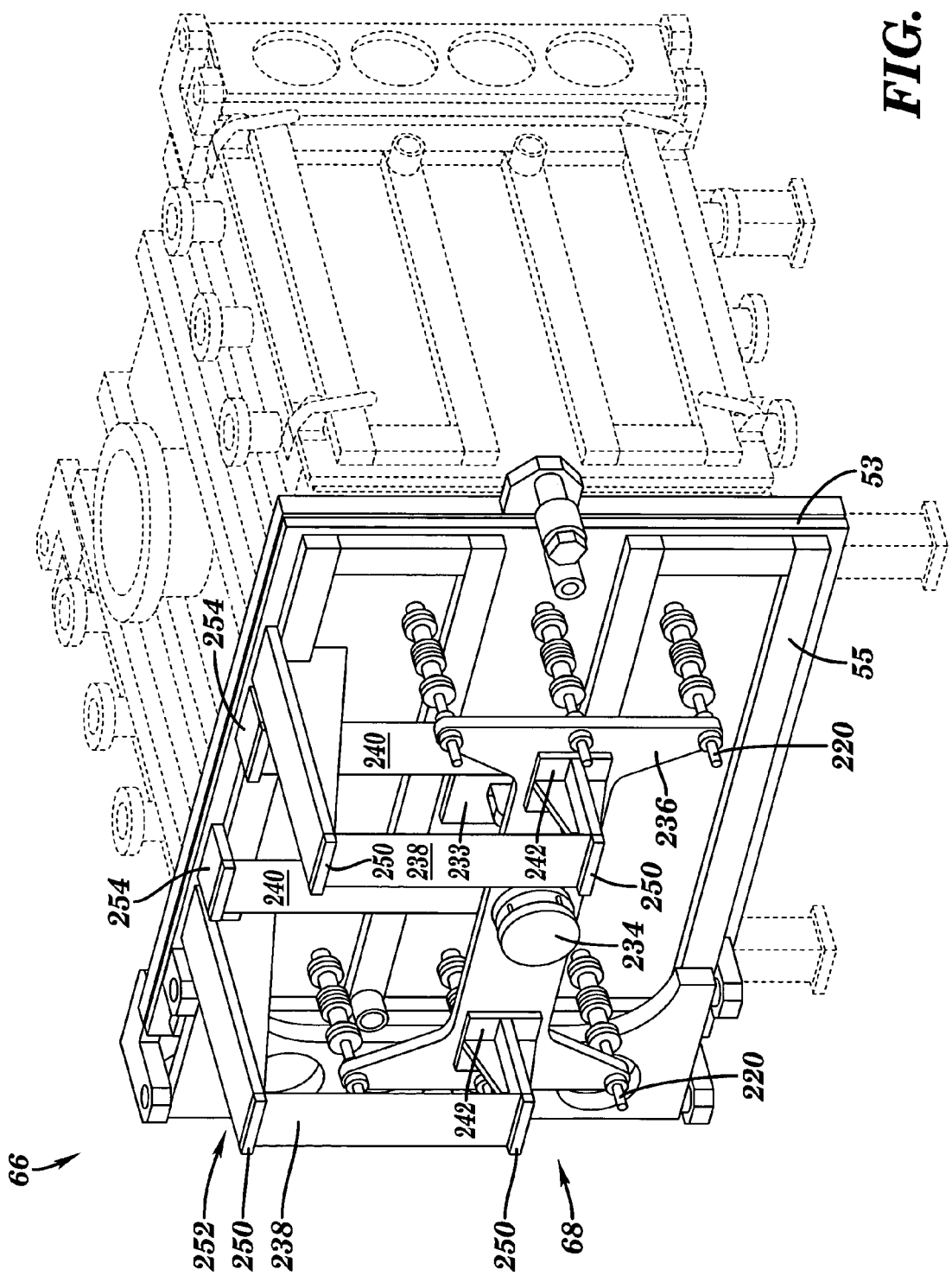

METHODS AND APPARATUS FOR TREATING A WORK PIECE WITH A VAPOROUS ELEMENT

TECHNICAL FIELD OF THE INVENTION

The present invention relates to methods and apparatus for exposing a material or work piece to a vaporous element. Specifically, the present invention provides methods and apparatus for treating a photovoltaic precursor with a vaporous element, for example, selenium or sulfur, to produce thin film CIGS or CIGSS solar cells.

BACKGROUND OF THE INVENTION

The limited availability of and environmental concerns about fossil fuels make them increasingly less attractive as a means to produce electricity. As a result of this trend, alternative energy sources, particularly solar energy, are becoming more popular. While solar energy is a reliable and dependable energy source, the costs associated with solar energy production have traditionally limited its availability and desirability as a substitute for fossil fuels. However, recent technological advances in solar cell manufacturing show promise to lower the cost of solar energy.

Solar energy proponents and researchers state that higher solar cell efficiency and lower production costs are two ways to reduce the overall cost of solar energy. In particular, solar cells with absorber materials comprised of copper, indium, gallium, and selenium and/or sulfur [hereinafter $Cu(In,Ga)(S,Se)_2$ or CIGS] show promise in higher efficiency, lower production costs, and long operational lifetimes. These absorber materials are the result of innovative thin-film manufacturing technologies that further reduce manufacturing costs by lowering raw material costs and increasing throughput and efficiencies.

As is commonly practiced in the art, these CIGS cells are manufactured in either a one-stage thermal co-evaporation process or a two-stage process. The single stage thermal co-evaporation process consists of depositing all of the CIGS elements onto a substrate and simultaneously heating that substrate temperature to approximately 450° C. to 600° C. to allow the constituent materials to form a crystal matrix in the absorber.

Although the one-step co-evaporation process is of interest to CIGS manufacturing, the two-step process may be more manufacturable and poses unique challenges of its own. In the first step of the two-step process, a material is deposited upon a substrate. The material deposited on the substrate is referred to as the "precursor." The precursor may comprise one or more of copper (Cu), indium (In), gallium (Ga), and/or selenium (Se) and/or sulfur (Se). Usually the precursor is a mixture of copper, indium, and gallium. In the second step of the two-stage process of CIGS manufacturing, selenium or sulfur is introduced into the precursor by a process known in the art as "selenization." Selenization typically includes heating the precursor in a selenium-rich (or sulfur-rich) environment until the elements react to make a crystal matrix to form the chalcopyrite CIGS material that becomes known as the "absorber." Common sources of selenium or sulfur in CIGS manufacturing include vaporizing powdered selenium or sulfur, hydrogen selenide, hydrogen sulfide, or organic compounds of selenium or sulfur with low evaporation points. This process has been accepted by researchers in solar cell manufacturing methods as an acceptable means of introducing selenium or sulfur into the absorber material; however, this technique also poses substantial risks and costs. Further, as some researchers may blend certain elements of the one-stage and two-stage process, these challenges may apply to the one-stage process as well.

Selenization is usually practiced by two methods. In one prior art method, selenium pellets are placed in a receptacle, or "boat," in a chamber and then the selenium and precursor are heated to release a selenium-containing vapor which interacts with the precursor. In the other prior art method the treatment chamber is filled with selenium or sulfur vapor or with hydrogen selenide ($H_2Se$) or hydrogen sulfide ($H_2S$) gas. Sometimes a process will involve placing hydrogen ($H_2$) gas in the treatment chamber while heating the Se or S pellets to form $H_2Se$ or $H_2S$ in situ. These two methods are essentially the only methods of selenizing photovoltaic precursors.

Due to the nature of the chemical reactions, an excess amount of Se or an over-pressure of Se is desirable during the selenization process. An excess of Se is typically necessary since the reaction of the Cu, In, Ga, and Se tends to "push" at least some of the Se out of the precursor at elevated temperature. Therefore, it is believed that, without excess Se present, any deposited Se will tend to evaporate out of the precursor matrix and not bind to the matrix as desired. Aspects of the present invention overcome this barrier by providing sufficient Se to minimize the escape of Se from, for example, the Cu—In—Ga matrix.

With regards to thermal co-evaporation, some prior art co-evaporation processes "hint" that selenization may be used to "fix" a film that might not be quite right stoichiometrically. That is, after co-evaporation, the precursor may lack sufficient Se whereby further Se addition is required to provide the desired stoichiometric quantity of Se. This further selenization is typically practiced by one of the methods discussed above.

Current CIGS manufacturing techniques also have serious health and environmental implications. As discussed below, various manufacturing techniques have been used to introduce selenium or sulfur into the absorber material matrix with varying success. Although some manufacturing methods are more reliable, the health or environmental concerns, especially in large-scale production volumes, make them undesirable for long-term use. More specifically, the use of the highly toxic hydrogen selenide and its derivatives is expensive because of needed safety precautions. While CIGS solar cells show great promise in solar cell manufacturing to reduce raw material costs, safe, reliable, and repeatable methods to introduce selenium or sulfur into the matrix are needed.

Prior art also suggests that CIGS solar cells produced by selenization processes have performance problems that may be unique to the manufacturing method. Recent studies by P. K. Johnson and A. E. Delahoy showed that solar cells produced by selenization had higher defect densities, "light-inhibited" degradation of cell efficiency of up to 97%, and a 13% reduction in Voc×FF over a 30 to 45 day period. In contrast, solar cells produced by thermal co-evaporation showed lower defect densities, lower cell efficiency reduction, and less than a 2% reduction in Voc×FF over a 30 to 45 day period. The key distinguishing feature of most selenization processes and thermal co-evaporation is that selenization usually uses a hydrogen-containing species, $H_2Se$. Although some of the decreased product performance of selenized solar cells is due to encapsulation method of the module and migration of sodium from the soda lime substrate into the absorber matrix, a good portion of the discrepancies in cell performance have to do with manufacturing method. While the enhanced product performance factors make thermal co-evaporation more desirable, selenization process methods are more suited to manufacturing high efficiency cells on large area substrates.

Additionally, $H_2Se$ is incompatible with stainless steel and other metals that have the potential to replace soda lime glass as a substrate material. This distinction is increasingly important as solar cell manufacturers look to lower manufacturing costs while increasing the number of form factors available for "finished" solar cell devices. Thus, in addition to the safety and environmental concerns, a solar cell manufacturing method that comprises 1) the low hydrogen advantages of thermal co-evaporation on long term cell performance, 2) the manufacturing capability high efficiency solar cells on large area substrates, and 3) compatibility with stainless steel and other metals is also needed.

DESCRIPTION OF THE RELATED ART

Within the art of CIGS manufacturing, the selenization process is often completed in a chamber. These chambers are either rectangular, square, or round and may or may not have shelves. An exemplary embodiment of a typical chamber is disclosed in U.S. Pat. No. 6,787,485 by Probst [herein "Probst"] and a typical selenization method is disclosed in U.S. Pat. No. 5,045,409 by Eberspacher, et al. [herein "Eberspacher"]. In particular, Probst discloses a "stack oven" with an adjustable gas atmosphere capable of operating in vacuum. Additionally, the Probst apparatus comprises heating elements and shelves that contain the process items in an arrangement that interleaves the process items and the energy sources, with at least one energy source per process item. The heating sources are arranged in a quartz glass envelope, with a liquid or gas coolant flowing through the envelope. Probst focuses on thermal uniformity of the substrates, however, unlike aspects of the present invention, Probst does not disclose 1) a high utilization rate of selenium of at least 90%, 2) a solid source of the processing vapor, 3) an enhanced means to control delivery of selenium or sulfur vapor, 4) a condenser/evaporator to deliver vapor from a solid source, 5) a vapor tight inner chamber space, nor 6) an independent thermal control of the substrates, a condenser/evaporator, and the walls of the chamber. Aspects of the present invention may provide one or more of these advantages over Probst.

Eberspacher discloses a method to form a CIS or CIGS film without using $H_2Se$, which is a highly toxic gas and is thus unsuitable for large scale manufacturing because of safety concerns. In the disclosed method of Eberspacher, a mixture of copper and indium or copper, indium, and gallium are deposited on a substrate by sputtering. A selenium film is then deposited by thermal evaporation. The substrate is then heated in the presence of hydrogen, $H_2Se$, or $H_2S$ to form the crystalline matrix for the solar cell absorber material. While the inventor's aim was to totally eliminate the use of $H_2Se$, the inventor admits in the specification that a low concentration of $H_2Se$ is needed to improve cell performance. Eberspacher further discloses a "conventional thermal evaporation method" which takes place in an oven with a gas inlet and outlet, but, unlike aspects of the present invention, does not disclose 1) a solid source of the processing vapor, 2) a high utilization rate of selenium of at least 90%, 3) a means to control delivery of selenium or sulfur vapor, 4) a condenser/evaporator to deliver vapor from a solid source, 5) a vapor tight inner chamber space, nor 6) an independent thermal control of the substrates, a condenser/evaporator, and the walls of the chamber. Aspects of the present invention may provide one or more of these advantages over Eberspacher.

U.S. Pat. Nos. 6,092,669 and 6,048,442 Kushiya, et al. [collectively herein "Kushiya"] discloses a method and apparatus for producing a thin-film solar cell. Specifically, Kushiya discusses processing the solar cells by heating them in an atmosphere of selenium or sulfur. According to Kushiya, the substrates are heated in an electric furnace with an undisclosed reactive gas at a temperature not higher than 600° C. Unlike aspects of the present invention, Kushiya does not disclose 1) a solid source of the processing vapor, 2) a high utilization rate of selenium of at least 90%, 3) a means to control delivery of selenium or sulfur vapor, 4) a condenser/evaporator to deliver vapor from a solid source, 5) a vapor tight inner chamber space, nor 5) an independent thermal control of the substrates, a condenser/evaporator, and the walls of the chamber. Aspects of the present invention may provide one or more of these advantages over Kushiya.

U.S. Pat. No. 6,518,086 of Beck, et al. [herein "Beck"] discloses a two-stage process to produce a CIGS or CIGSS film on a substrate for semiconductor applications. While referencing the prior art, Beck discusses the exemplary inventions of the two best known methods of selenization: (1) vapor deposition of the constituent elements followed by heating (see U.S. Pat. No. 5,141,564 issued to Chen, et al. (herein "Chen")) and (2) a two-stage process wherein selenium or sulfur is added to the absorber crystal matrix by heating copper indium alloys with $H_2Se$ or Se vapor (see U.S. Pat. No. 4,798,660 issued to Ermer, et al. (herein "Ermer") and U.S. Pat. No. 4,915,745 issued to Pollock, et al.) Beck distinguishes the first CIGS process of the Chen species as undesirable for industrial scale manufacturing because of high temperatures to form the absorber matrix. Beck further distinguishes the second selenization process of the Ermer species as undesirable because of the use of highly toxic $H_2Se$, low selenium utilization, and poor adhesion to molybdenum coated substrates.

Beck discloses depositing a precursor layer of copper, indium, gallium, selenium, or sulfur in some combination to a substrate. These substrates are then heated in either an inert atmosphere comprising argon, xenon, helium, or nitrogen or under a selenium or sulfur vapor. The selenium vapor can come from evaporating selenium from a "boat" inside the chamber, $H_2Se$, or diethylselenide. Similar to recognized methods of selenization, Beck selenizes its precursor by heating the selenium-containing boat and precursor in the treatment chamber to produce the Se vapor and holds the boat and precursor at temperature until selenization is complete. Contrary to aspect of the present invention, Beck does not disclose 1) a high utilization rate of selenium of at least 90%, 2) a means to control delivery of selenium or sulfur vapor, 3) a condenser/evaporator to deliver vapor from a solid source, 4) a vapor tight inner chamber space, nor 5) an independent thermal control of the substrates, a condenser/evaporator, and the walls of the chamber. Aspects of the present invention may provide one or more of these advantages over Beck.

While the disclosed prior art is not exhaustive, it is representative of what is known and practiced for selenization. In particular, in contrast with aspects of the present invention, prior art vacuum chamber apparatuses and treatment methods do not disclose 1) an independent control of substrate temperature, 2) a high utilization rate of selenium of at least 90%, 3) high throughput capability with enhanced thermal management, 4) controlled release and capture of selenium to the same place repeatedly, 5) independent control of the vapor pressure delivery of sulfur or selenium, 6) vacuum compatible selenium delivery and temperature control, 7) distinct temperature zones and valves to allow use of traditional elastomer seals and vacuum gauges, and 8) future process automation upgrade capability. Aspects of the present invention provide these other advantages and benefits not found in the prior art.

SUMMARY OF ASPECTS OF THE INVENTION

The present invention provides methods and apparatus for treating materials with vaporous elements and compounds that enhances the versatility and adaptability of the treatment process. Though aspects of the invention may be utilized in the manufacture and processing of photovoltaic material, aspects of the invention are not limited to processing photovoltaic material, but can be applied to the treatment of any material where the control and regulation of treatment temperature impacts the cost, quality, or performance of the product produced.

One aspect of the invention is a method for treating a work piece, for example, a CIG photovoltaic precursor, with one or more vaporous element. The method includes introducing the work piece and an element-containing material to an enclosure; heating the work piece to a first temperature; independent of the heating of the work piece, heating the element-containing material to a temperature sufficient to volatilize the element and release an element-containing vapor into the enclosure; reacting at least some of the element-containing vapor with the work piece; regulating the temperature of the element-containing material at a temperature sufficient to condense at least some of the element from the element-containing vapor on the element-containing material; and cooling the work piece to provide an element-treated work piece. In one aspect, the element comprises elemental sulfur or selenium or combinations of sulfur, selenium, tellurium, indium, gallium, or sodium. In another aspect, cooling the element-containing material may comprise cooling the element-containing material wherein substantially all of the unreacted element-containing vapor condenses on the element-containing material.

Another aspect of the invention is an apparatus for treating a work piece with a vaporous element, the apparatus including an enclosure; means for supporting the work piece in the enclosure; means for varying the temperature of the work piece; an element-containing material in the enclosure; means for varying the temperature of the element-containing material to produce an element-containing vapor, the means for varying the temperature of the element-containing material being independent of the means for varying the temperature of the work piece; and means for exposing at least some of the work piece to the element-containing vapor. In one aspect, the enclosure comprises an inner enclosure, and wherein the apparatus further comprises an outer enclosure enclosing the inner enclosure.

Another aspect of the invention is a method for preparing a treatment chamber for treating a work piece with a volatilizable element, the method including introducing a solid element-containing material to the treatment chamber, the treatment chamber comprising an internal cavity; heating the solid element-containing material to volatilize the element and produce an element-containing vapor in the internal cavity; regulating the temperature of a surface exposed to the internal cavity to a temperature at which the element-containing vapor condenses; and condensing at least some of the volatilized element from the element-containing vapor onto the surface. In one aspect, the method further includes regulating the temperature of the solid element-containing material to a temperature below the volatilization temperature of the element, for example, whereby at least some of the element from the element-containing vapor condenses onto the solid element-containing material.

A still further aspect of the invention is a treatment chamber isolation apparatus, the treatment chamber having an opening, the isolation apparatus including a sealing assembly having a support structure; at least one cover plate adapted to engage the treatment chamber opening; a plurality of rods having a first end adapted to engage the support structure and a second end adapted to engage the at least one cover plate; and means for compressing the sealing assembly against the treatment chamber wherein the at least one cover plate engages the treatment chamber opening to provide at least some isolation of the treatment chamber. In one aspect, the first ends of the plurality of rods are resiliently mounted to the support structure, for example, by means of springs and/or flexures.

Another aspect of the invention is a treatment chamber isolation apparatus, the treatment chamber having a cylindrical enclosure having an open first end, a closed second end, and an internal flange mounted between the first end and the second end, the apparatus including a sealing plate adapted to engage the internal flange; a support rod having a first end and a second end mounted to the sealing plate; a plate mounted to the second end of the support rod; and at least one actuator adapted to displace the plate whereby the sealing plate engages the internal flange of the cylindrical enclosure and substantially isolates at least part of the cylindrical enclosure. In one aspect, the treatment chamber isolation apparatus may further comprise a cylindrical extension mounted to the open first end of the cylindrical enclosure.

Another aspect of the invention is a material delivery device including a cylindrical body having at least one outer surface; a volatilizable material applied to the at least one outer surface; means for varying the temperature of the at least one outer surface to regulate the volatilization of the volatilizable material. In one aspect, the means for varying the temperature comprises a heat exchanger having a working fluid passing through it.

Another aspect of the invention is a method of delivering a volatile material including providing a cylindrical body having at least one outer surface; applying a volatilizable material to the at least one outer surface; and regulating the temperature of the at least one outer surface to vary the amount of material volatilized. In one aspect, applying a volatilizable material to at least one outer surface of the cylindrical body may comprise exposing the at least one outer surface to a vapor containing a volatilized material; and cooling the at least one outer surface to condense at least some of the volatilized material from the vapor on to the at least one outer surface. In one aspect, regulating the heating of the at least one surface may comprise regulating the flow and/or temperature of a coolant though a passage in the cylindrical body.

A further aspect of the invention is a treatment chamber valve actuation device including an actuation plate; at least one actuation rod mounted to the actuation plate, the at least one actuation rod adapted to penetrate a wall of the chamber and engage a valve mechanism within the chamber; an actuator adapted to displace the actuation plate wherein the plurality of actuation rods are displaced and actuate the valve mechanism; and at least one flexible plate mounted between the actuation plate and the treatment chamber. In one aspect, the at least one flexible plate may comprise a plurality of flexures mounted between the actuation plate and the treatment furnace.

A still further aspect of the invention is a CIGS photovoltaic cell having a low-hydrogen content or substantially no hydrogen content. In one aspect, the photovoltaic cell may comprise a substrate; and an absorber deposited on to the substrate, the absorber comprising copper, indium, gallium, and less than 5% hydrogen. In one aspect, the absorber contains less than 1% hydrogen, or is even hydrogen free. In another aspect, the substrate may be a metallic substrate, for example, a steel, stainless steel, or titanium substrate.

These and further aspects of the invention are illustrated in described with respect to the attached figures.

BRIEF DESCRIPTION OF FIGURES

The subject matter, which is regarded as the invention, is particularly pointed out and distinctly claimed in the claims at the conclusion of the specification. The foregoing and other objects, features, and advantages of the invention will be readily understood from the following detailed description of aspects of the invention taken in conjunction with the accompanying figures in which:

FIG. 13 is a perspective view of the valve actuating assembly shown in FIG. 9.

DETAILED DESCRIPTION OF ASPECTS OF THE INVENTION

The present invention comprises systems, apparatus, and methods that provide improved means for fabricating photovoltaic material that overcome many of the disadvantages of prior art systems and methods. Though aspects of the invention are particularly applicable to the handling and treatment of photovoltaic materials, aspects of the invention may be applied to many different photovoltaic and non-photovoltaic materials.

Figure 1:
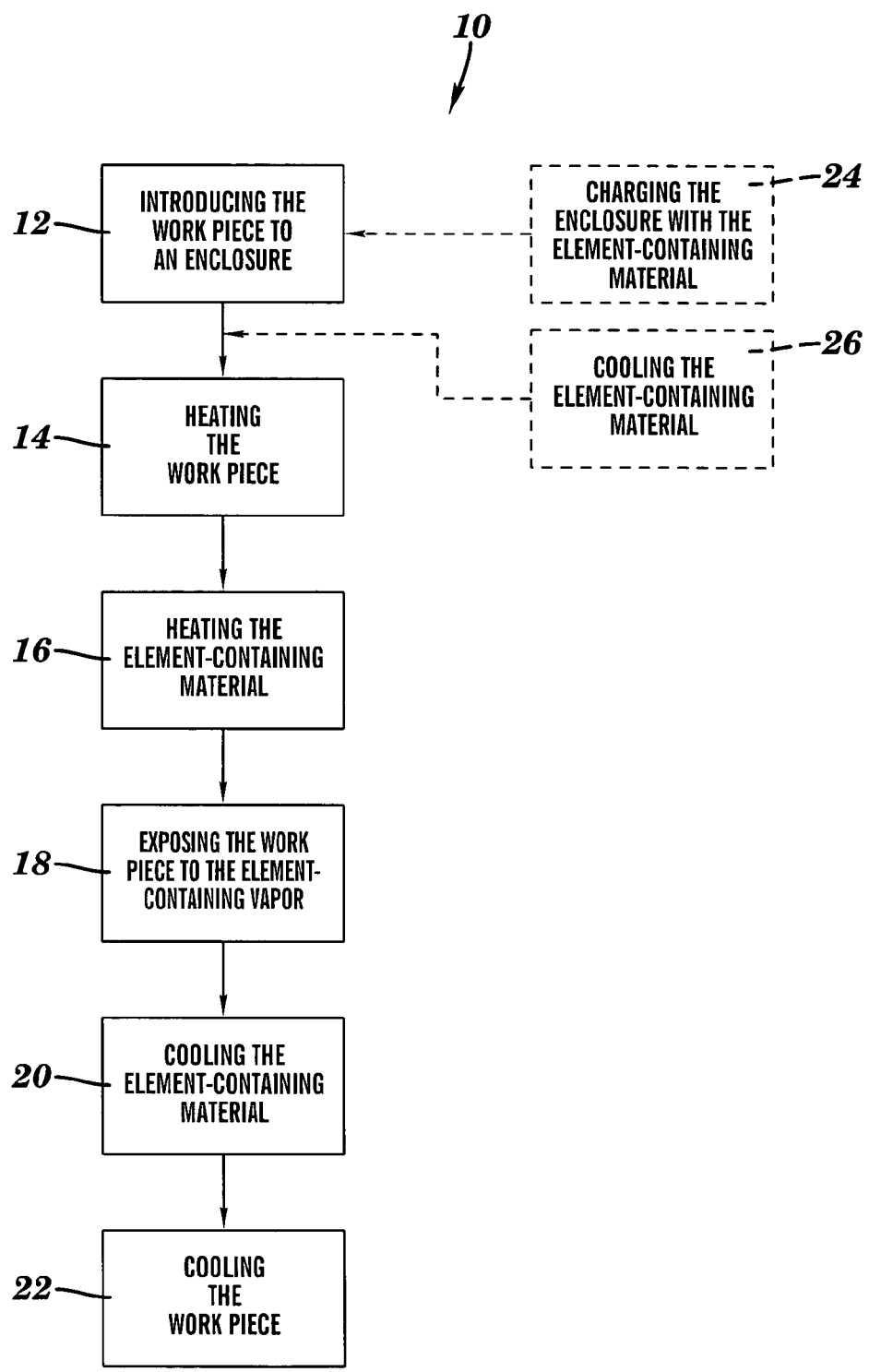
FIG. 1 is a schematic block diagram of a process for treating a work piece according to one aspect of the invention.

FIG. 1 is a schematic block diagram of a process 10 for treating a material according to one aspect of the invention. The material may comprise any material that is treated with a gas or vapor, for example, an element-containing vapor. In one aspect, the material comprises a photovoltaic precursor, for example, a precursor deposited on a substrate. The treatment gas may comprise any vaporous material. However, in one aspect, the treatment vapor comprises a chalcogen-containing vapor, for example, a sulfur-, selenium-, or tellurium-containing vapor; or an indium-, gallium-, or sodium-containing vapor. Though the material being treated may comprise any material or substance, to facilitate the disclosure of the invention, in some aspects, the material being treated may be referred to as a "work piece." However, the use of the expression "work piece" is not intended to limit the scope of the materials to which aspects of the invention may be applied.

Process 10 includes a series of steps starting with step 12 of introducing the work piece to an enclosure, for example, into a treatment oven or furnace, such as treatment furnace illustrated in FIGS. 3 through 9 or FIGS. 18A through 23, though any type of appropriate treatment furnace may be used. The work piece introduced to the enclosure may comprise any material that may be treated with a gas, for example, an element-containing vapor. According to one aspect of the invention, step 12 may be practiced by simply positioning the work piece on to the bottom surface of an enclosure, on to a support structure (or "boat"), or on to a shelf positioned in an enclosure. However, as will be discussed below, step 12 may be practiced by positioning one or more work pieces, for example, photovoltaic precursors deposited on substrates, into one or more individual, isolated enclosures, for example, into one or more quartz tubes. These individual, isolated enclosures permit the operator to individually regulate the treatment conditions within the individual enclosures, for example, tube, to, among other things, allow the operator to vary or control the treatment conditions within the enclosure.

Figure 2:
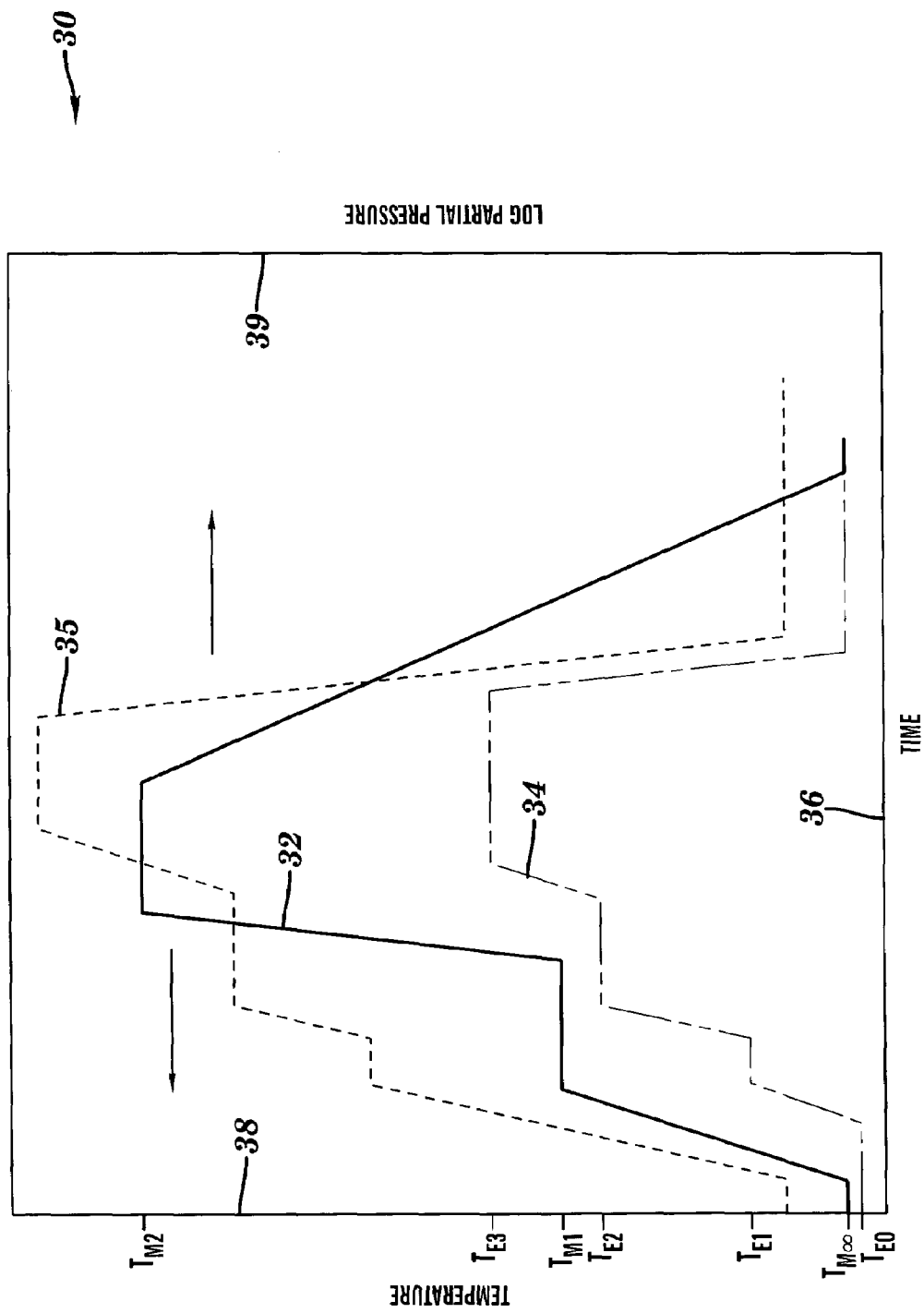
FIG. 2 is a plot of a heating schedule for the treated work piece and the treatment material according to one aspect of the invention.

In step 14, the work piece is heated to a first temperature for treatment. One heating schedule that may be used to heat the work piece is illustrated in FIG. 2. The work piece may be heated to a first temperature to raise the work piece at least partially to treatment element temperature. FIG. 2 is a plot 30 of a heating schedule curve 32 for a work piece and the heating schedule curve 34 and the log of the partial pressure curve 35 for a treatment element, for example, Se, according to one aspect of the invention. The abscissa 36 of plot 30 is the time of treatment, typically, in minutes; the left-hand ordinate 38 of plot 30 is the temperature, typically, degrees C.; and the right-hand ordinate 39 is the log of the partial pressure of the treatment element. According to heating schedule 32, the temperature of the work pieces may be increased from ambient temperature, $T_{M\infty}$, for example, room temperature, for instance, about 20 degrees C., to a first treatment temperature, $T_{M1}$, for example, to a temperature greater than 100 degrees C. For example, when the work piece being treated is a Cu—In—Ga precursor, and treatment element is Se, temperature $T_{M1}$ may be between about 100 to about 400 degrees C. This rate at which the temperature may be increased from $T_{M\infty}$ and $T_{M1}$ may vary. For example, when the work piece being treated is a photovoltaic precursor deposited on a substrate, a slow rise in temperature may prevent the precursor from cracking and delaminating from the substrate. The rate of temperature increase may typically be between about 5 degrees C. per minute (° C./m) to about 100 degrees C. per second (° C./s), for example, about 20° C./m. The work piece to be treated may typically be held at temperature $T_{M1}$, for at least about 30 seconds to about 90 minutes, for example, at least about 30 minutes.

After heating the work piece, the element-containing material, for example, selenium or sulfur, is heated per step 16, for example, by means of the heating schedule illustrated in FIG. 2, to release treatment-material-containing vapor into the enclosure. According to one aspect of the invention, the treatment material is heated independently of the heating of the work piece being treated. The temperature of the treatment material, for example, Se, is elevated to a temperature at or above the temperature at which treatment material vapor is released, for example, at or above the vapor temperature at the prevailing pressures. FIG. 2 also illustrates a typical heating schedule 34 for heating the treatment material. The treatment material may be any material that can be volatilized upon heating, including materials having multiple elements, that is, compounds. However, to facilitate the disclosure of the invention, in the following discussion the treatment material may be referred to as "the element-containing material" or "the element containing gas or vapor." It is to be understood that in one aspect of the invention an element-containing material or element containing gas or vapor may comprise more than one element, for example, the element-containing material may be a mixture of elements or a compound.

With reference to FIG. 2, according to one aspect of the invention, the temperature of the treatment element, as indicated by curve 34, is increased from an initial temperature $T_{E0}$ to $T_{E1}$. As shown in FIG. 2, initial temperature $T_{E0}$ may typically be less than or equal to ambient temperature $T_{M\infty}$. For example, as will be described more fully below in the discussion of the heat exchanger, at the start of the treatment sequence, the temperature of the treatment element may be maintained at the temperature of the heat exchanger. Therefore, in one aspect of the invention, $T_{E0}$ may be less than 60 degrees C., for example, about 50 degrees C. In one aspect of the invention, the initial temperature of the treatment element, $T_{E0}$, is kept below the temperature at which the element begins to volatilize. For example, when the treatment element is Se, which begins to volatilize at about 100 degrees C., the initial treatment element temperature may be kept below 100 degrees C., for example, about 50 degrees C. The temperature $T_{E0}$ may vary broadly, for example, depending upon the vapor pressure of the treatment element. For example, for materials having high vapor pressures at lower temperatures, the temperature $T_{E0}$ may be less than room temperature, for example, even less than 0 degrees C. The rate of temperature increase from $T_{E0}$ to $T_{E1}$ may vary, but may typically be between about 5° C./m to about 100° C./s, for example, about 20° C./m. The treatment element may typically be held at temperature $T_{E1}$ for at least about 30 seconds to about 90 minutes, for example, at least about 15 minutes.

According to aspects of the present invention, the timing of the initiation of the changes in temperature shown in FIG. 2 may vary depending upon the work piece being treated, the treatment element, and the treatment device being used, among other factors. Specifically, the relative time frame and time sequences of the increases and decreases in temperature may deviate from the relative time frames shown in FIG. 2. For example, though in one aspect shown in FIG. 2, the temperature of the work piece 32 may be increased before the temperature of the treatment element 34 is increased, in one aspect, the temperature of the treatment element 34 may be increased before or substantially at the same time as the temperature of the work piece 32 is increased. In one aspect of the invention, the temperature of the treatment element 34 is maintained below the temperature of the work piece 32.

In one aspect, after holding the treatment element at temperature $T_{E1}$ for about 15 minutes, the temperature of the treatment element may be increased to a temperature $T_{E2}$, for example, for Se, $T_{E2}$ may be about 100 to about 400 degrees C. The rise in temperature from $T_{E1}$ to $T_{E2}$ may be between about 5° C./m to about 100° C./s, for example, at least about 20° C./m. The treatment element may typically be held at temperature $T_{E2}$ for at least about 30 seconds to about 90 minutes, for example, at least about 30 minutes.

With reference again to FIG. 1, after heating the treatment element to release a treatment element-containing vapor into the enclosure per step 16, the one or more work pieces are exposed to the treatment element vapor, per step 18, whereby at least some of the work pieces are treated with the treatment element. Treating the work piece with the element-containing vapor may comprise reacting the element with the work piece or providing an overpressure of the element-containing vapor to the work piece. In one aspect, providing an overpressure comprises providing a vapor pressure of the element-containing vapor, for example, Se vapor, that is greater than the vapor pressure of the element, for example, Se, present in the work piece. This overpressure may minimize or prevent the volatilization and the net loss of element from the work piece. Step 18 may simply be practiced by allowing the work pieces positioned in the enclosure to be exposed to the treatment element vapor for a predetermined time periods, for example, 5 seconds to 5 hours. The treatment time for which the work piece is exposed to the element containing vapor may typically range from about 30 seconds to about 90 minutes.

As shown in FIG. 2, while the treatment element is held at temperature $T_{E2}$, the temperature of the work piece being treated, as indicated by curve 32, may be increased, for example, rapidly, from temperature $T_{M1}$ to $T_{M2}$, for instance, to a temperature where the treatment element begins to react with the treated material, for example, at a temperature of about 400 to about 600 degrees C. Se reacts rapidly with a Cu—In—Ga matrix to form a Cu—In—Ga—Se matrix. The rise in temperature of the treated material from $T_{M1}$ to $T_{M2}$ may be at a rate of between about 5° C./m to about 100° C./s, for example, about 20.0° C./m. Shortly thereafter, the temperature of the treatment element, for example, Se, is increased from $T_{E2}$ to $T_{E3}$ to enhance the volatilization of the treatment element and release sufficient vaporous treatment element to complete the reaction. For example, for Se, the temperature $T_{E3}$ may be about 200 to about 550 degrees C. The rise in temperature of the treatment element from $T_{E2}$ to $T_{E3}$ may be at a rate of between about 5° C./m to about 100° C./s, for example, about 20° C./m. The treated work piece may be held at temperature $T_{M2}$ to provide for sufficient reaction of the treatment element with the treated work piece. This treatment time may be at least about 30 seconds to 90 minutes.

With reference to FIG. 1, in step 20, upon completion of the treatment of the work piece, the temperature of the treatment element is reduced, for example, by active cooling, for instance, by means of a cooling heat exchanger. According to one aspect of the invention, the reduction of the treatment element temperature substantially terminates the release of treatment-element-containing vapor from the treatment element, for example, the Se. The reduction of the treatment element temperature may also allow at least some of the treatment-element-containing vapor to condense onto the treatment element. In one aspect, substantially all of the treatment element vapor may condense onto the treatment element, for example, whereby the loss of treatment element to, for example, condensation onto the enclosure, is minimized. According to one aspect of the invention, due to this condensation or "recapture" of treatment element, the utilization rate of the treatment element, for example, Se or S, is very high. For example, in one aspect utilization rate is at least about 90% or more, in some instances at least about 95% or more. This temperature reduction of the treatment element is shown as curve 34 in FIG. 2.

Again, with reference to FIG. 1, before, during, or after the practice of cooling the treatment element per step 20, the temperature of the work piece being treated may be reduced as indicated by step 22 in FIG. 1. Upon cooling, the treated work pieces may be further handled or processed as desired. The cooling of the work pieces may be practiced actively, for example, by means of a cooling heat exchanger and/or forced convection, or through unforced, natural convection and/or radiation.

This decrease in the temperature of the treated work piece is also shown in FIG. 2. As indicated by curve 32, the temperature of the treated work piece is cooled, for example, slowly, from $T_{M2}$ to about room temperature. This cooling may be practiced to prevent damage to the work piece; for example, when the work piece is a photovoltaic material, cooling is carried out relatively slowly to prevent cracking of the work piece or delamination from the substrate. The rate of cooling may range from between about 5° C./m to about 100° C./s, for example, about 5.0° C./m.

As shown in FIG. 2, before, during, or after the treated work piece is being cooled to room temperature, the treatment element is cooled from temperature $T_{E3}$ to a lower temperature per curve 34, for example, to a temperature below the temperature at which the element volatilizes. When the treatment element is Se, the Se is cooled to a temperature below 100 degrees C., for example, to a temperature of about 50 degrees C. The rate of cooling may range from between about 5° C./m to about 100° C./m, for example, about 15.0° C./m. Again, the curves in FIG. 2 are representative of the invention, for example, sulfur volatilizes at a lower temperature, and tellurium volatilizes at a higher temperature.

In one aspect of the invention, the rapid cooling of the treatment element typically causes the vaporous element to recondense upon the cooled element whereby loss of the element to condensation on the surfaces of the furnace or associated surfaces is minimized or prevented. Thus, by controlled cooling of the treatment element, more of the treatment element is retained, for example, for further treatment.

FIG. 2 also displays a typical corresponding variation in the log of the partial pressure curve 35 of a treatment element as the temperature of the treatment element 34 varies. As shown, the partial pressure 35 tracks the changes in the temperature 34 very closely. For example, for a Se treatment element, at a temperature $T_{E2}$ of the Se of about 100 to about 400 degrees C., the partial pressure of the Se is about 5.0 Torr at about 400 degrees C. Also, for a Se temperature $T_{E3}$ of about 200 to about 550 degrees C., the partial pressure of the Se can be as high as about 80 Torr. The partial pressure curve 35 is a useful parameter in controlling the operation of the cooling heat exchanger or condenser/evaporator, as will be discussed more thoroughly below.

As shown in and described above with respect to FIG. 2, in one aspect of the invention, the temperature of a work piece to be treated and the temperature of a volatile element with which the work piece is to be treated with are independently controlled to optimize the reaction, for example, to improve reaction selectivity and/or reaction kinetics, and also to minimize the loss of treatment element, for example, sulfur or selenium. According to process 10 shown in FIG. 1 and the heating schedules shown in FIG. 2, a work piece may be treated with treatment element in a controlled environment whereby the release of treatment element is regulated to optimize the treatment and minimize the loss of treatment element. In one aspect, method 10 or sub-sequences of method 10 of FIG. 1 may be practiced repeatedly. For example, steps 14, 16, 18, and 20 may be practiced at least twice, possibly three or more times, to effect the desired treatment of the work piece. Also, steps 18 and 20 may be practiced at least twice (possibly three or more times), for example, before proceeding with step 22, to effect the desired treatment of the work piece.

The process 10 shown in FIG. 1 may also include the optional steps of charging the enclosure with treatment element 24 and cooling the treatment element 26 prior to or during the heating step 14. These optional steps are shown in phantom in FIG. 1. According to one aspect of the invention, the treating element may be introduced, or "charged," 24 to the enclosure before the work piece to be treated is introduced to the enclosure 12. This charging of the treatment element may be practiced by the steps illustrated in FIG. 24 and will be discussed below. The cooling step 26 may be practiced to prevent the element-containing material from volatilizing prematurely, that is, before the work piece is ready to be treated.

The method of the invention may be practiced in any suitable enclosure that can be adapted to regulate the temperature of the work pieces and the treatment material, for example, independently regulated. One enclosure that may be used to practice aspects of the invention is illustrated in FIGS. 3 through 9 and FIGS. 18A through 23. To those of skill in the art, the term "furnace" is sometimes reserved for devices in which work pieces are heated to temperatures of at least 1200 degrees C. while the term "oven" is sometimes reserved for devices in which work pieces are heated to temperatures of between about 200 degrees C. to about 300 degrees C. However, the use of the terms "furnace" or "oven" in the following discussion is not intended to limit the scope of the invention to these temperature ranges. Aspects of the present range may be used to heat work pieces in these and other temperature ranges, for example, as low as room temperature, for example, 20 degrees C., to as high a temperature that does not impact the performance or integrity of the disclosed devices, for example, at least 2000 degrees C.

Figure 3:
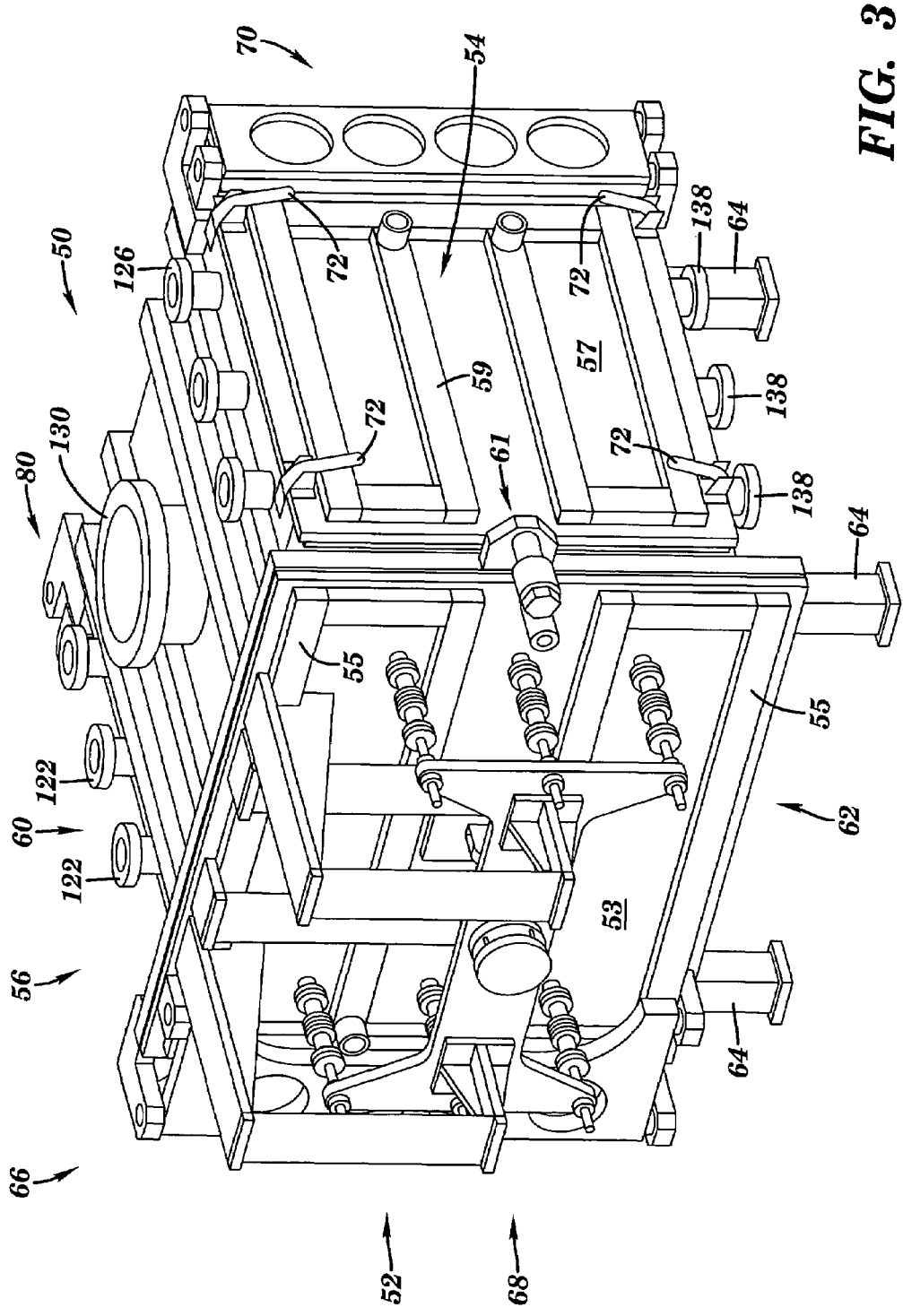
FIG. 3 is a perspective view of a treatment furnace according to another aspect of the invention.
Figure 4:
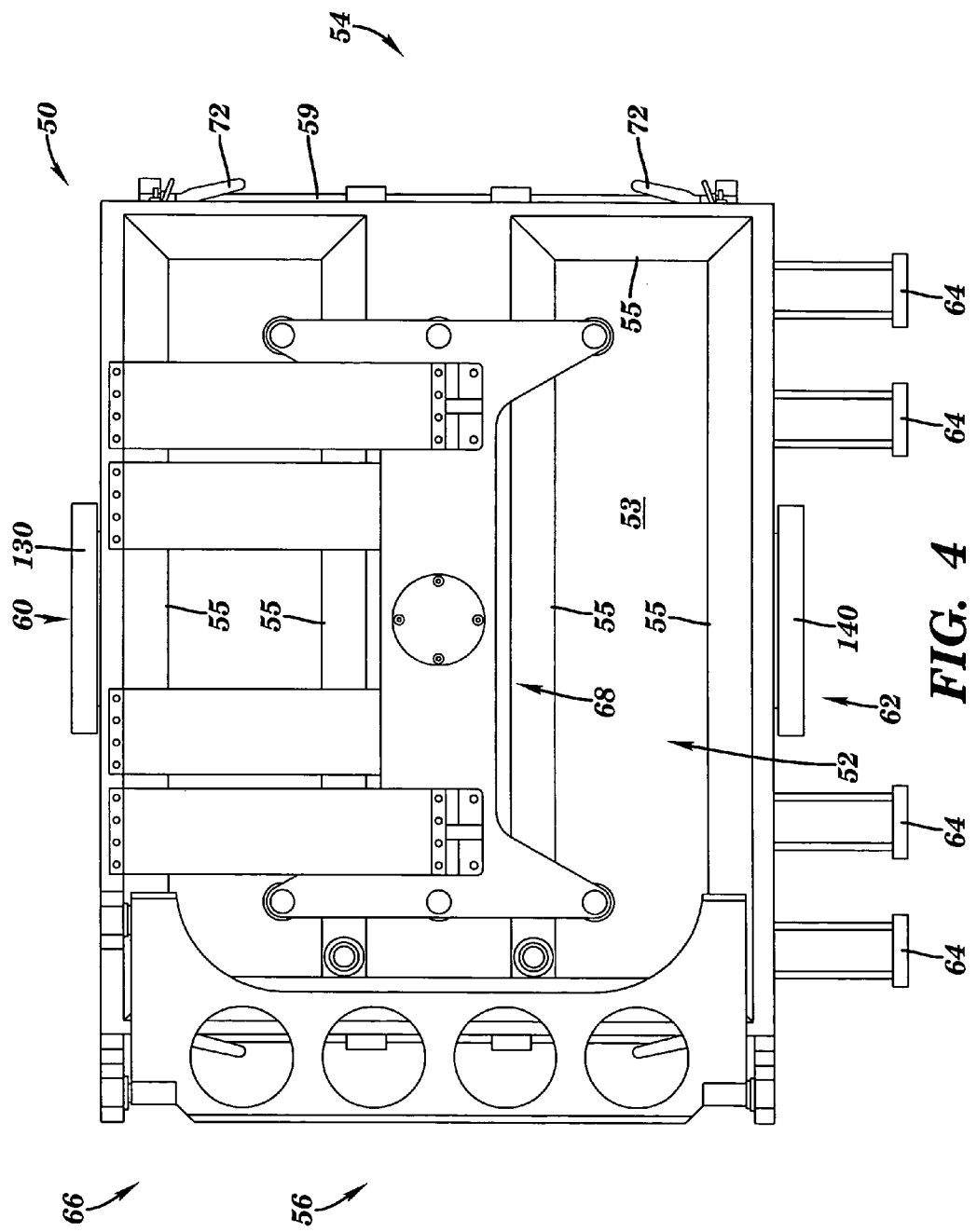
FIG. 4 is a front elevation view of the furnace shown in FIG. 3.
Figure 5:
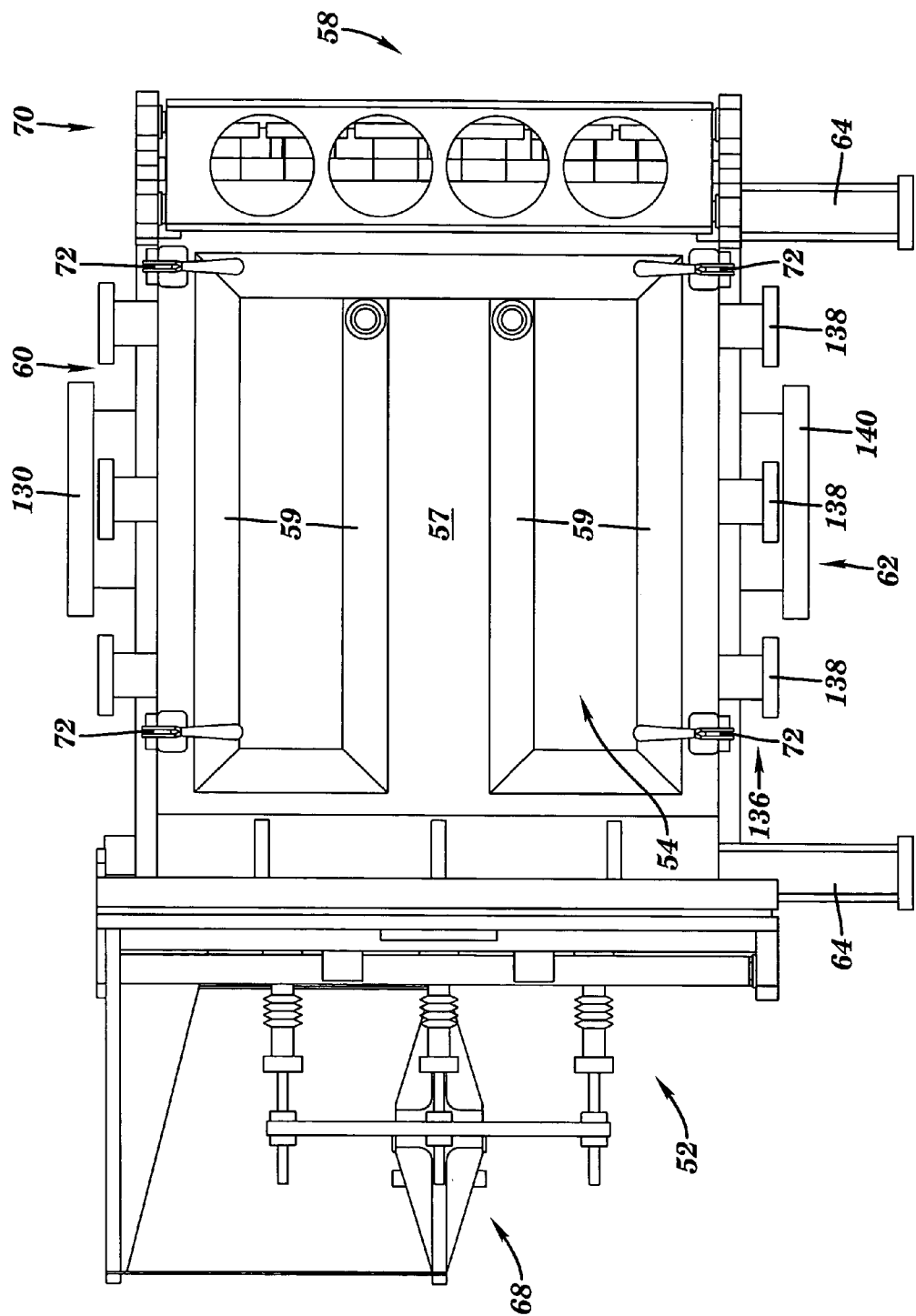
FIG. 5 is a right side elevation view of the furnace shown in FIG. 3.
Figure 6:
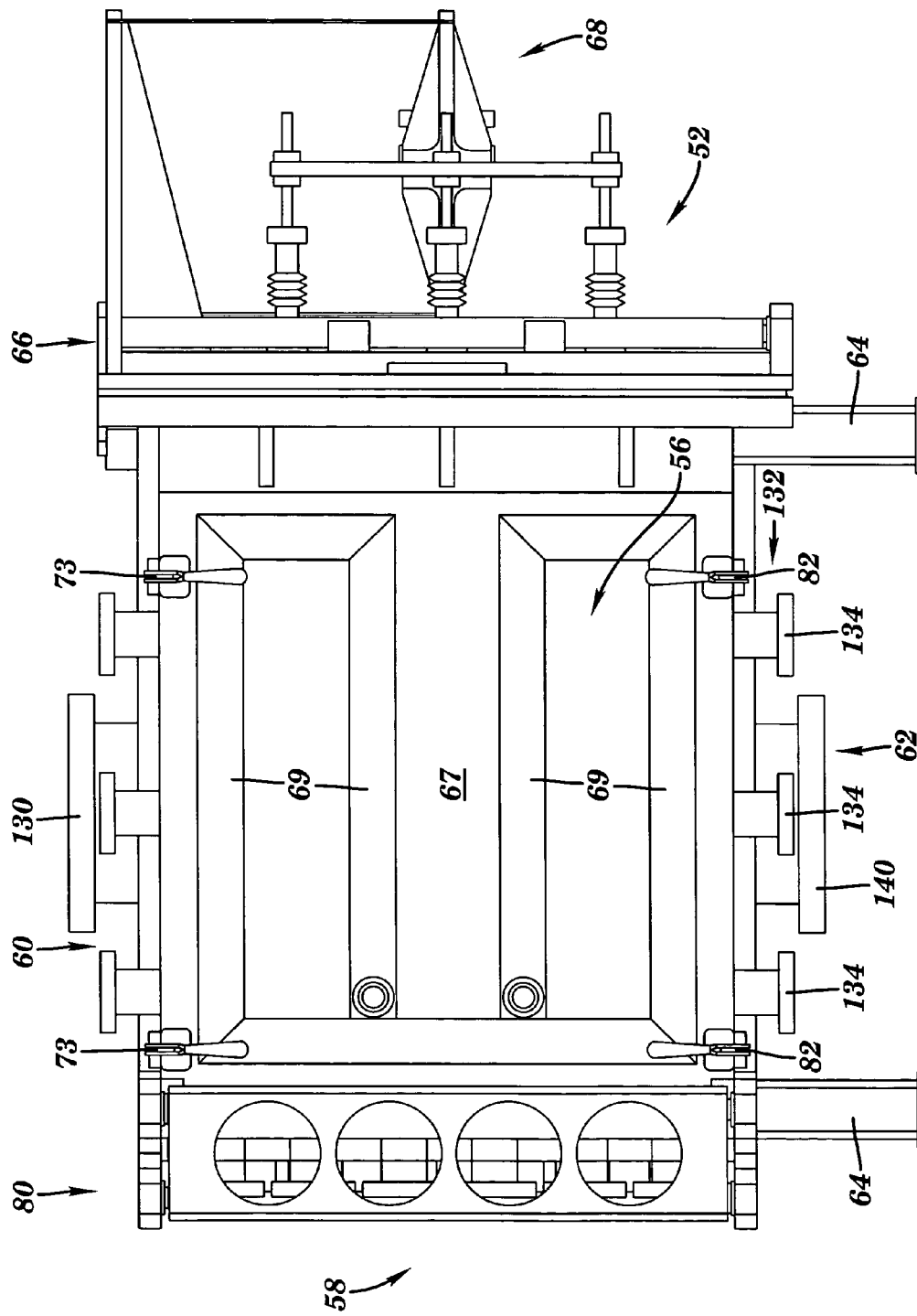
FIG. 6 is a left side elevation view of the furnace shown in FIG. 3.
Figure 7:
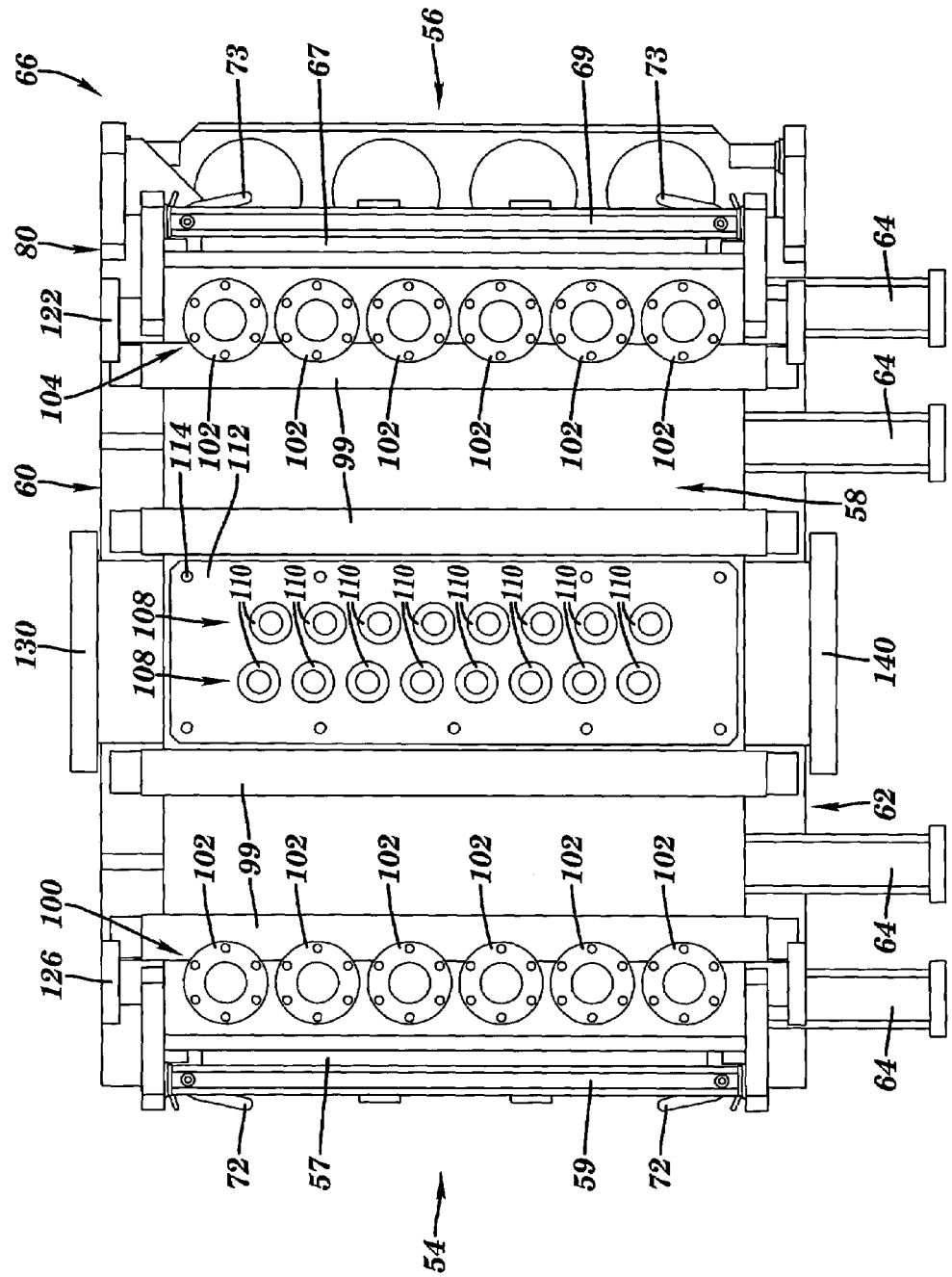
FIG. 7 is a rear elevation view of the furnace shown in FIG. 3.
Figure 8:
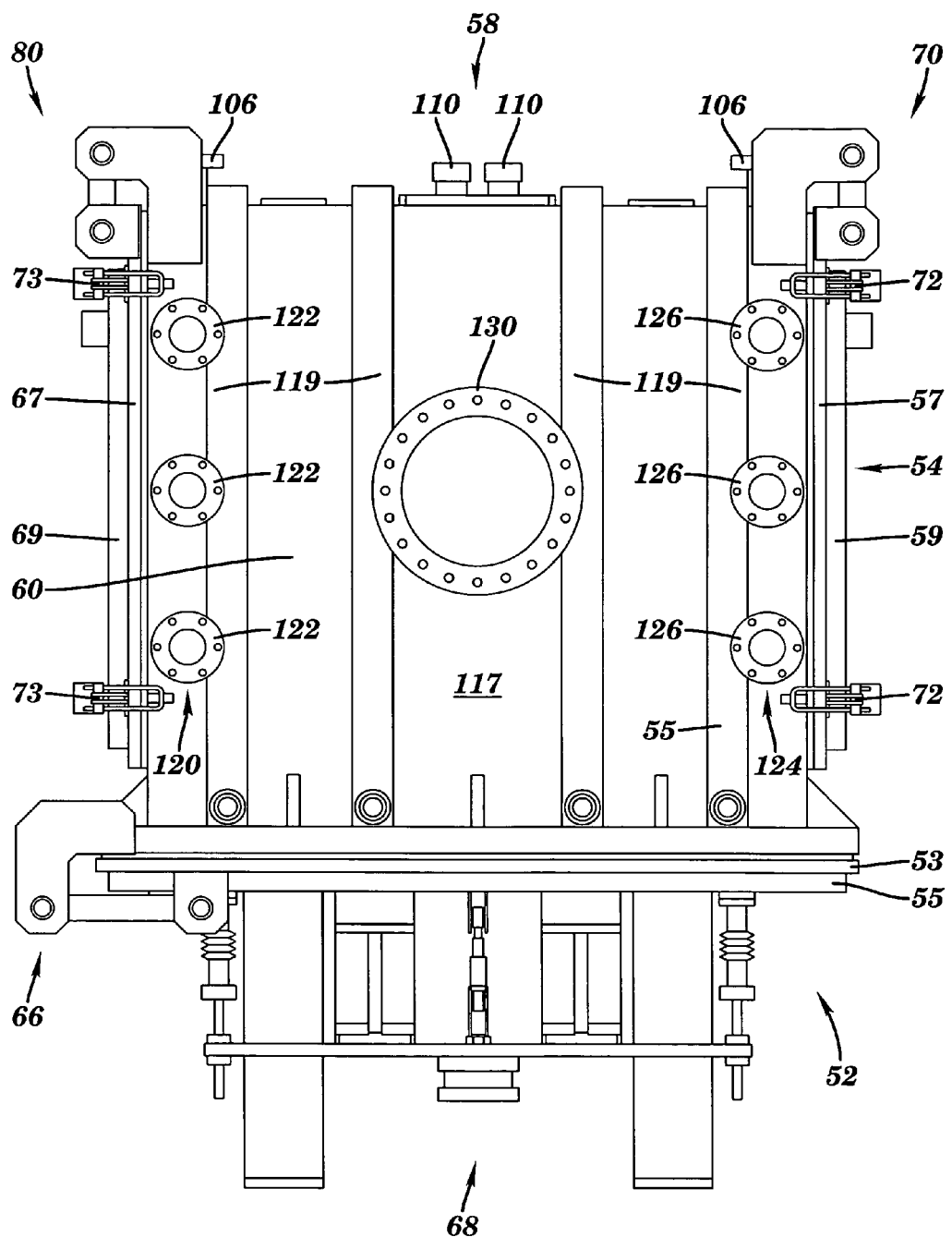
FIG. 8 is a top plan view of the furnace shown in FIG. 3.

FIG. 3 is a perspective view of a treatment furnace 50 according to one aspect of the invention. Treatment furnace 50 may be used to practice the invention illustrated in and described with respect to FIGS. 1 and 2. FIG. 4 is a front elevation view of furnace 50 shown in FIG. 3. FIG. 5 is a right side elevation view of the furnace 50 and FIG. 6 is a left side elevation view of furnace 50. FIG. 7 is a rear elevation view of furnace 50 and FIG. 8 is a top plan view of furnace 50 shown in FIG. 3. According to aspects of the invention, furnace 50 (and furnace 200 discussed below) are specially designed to operate under a broad range of operating conditions. For example, furnace 50 (and 200) may be operated under a broad range of temperatures, for example, from 0 to 2000 degrees C., and a broad range of pressures, for example, super-atmospheric pressures to sub-atmospheric pressures. For instance, furnace 50 (and 200) may be specially designed to operate under a vacuum ranging from just below about 1 standard atmosphere to $10^{-6}$ Torr.

As shown in FIGS. 3 through 8, furnace 50 includes a front door assembly 52, a right side door assembly 54, a left side door assembly 56, a rear panel assembly or back 58, a top 60, and a bottom 62. Furnace 50 may be mounted on a plurality of support legs 64. As shown in FIGS. 3 and 4, front door assembly 52 may be pivotally mounted to the furnace 50 by hinge assembly 66 and may comprise a plate 53 having appropriate reinforcing elements 55, for example, structural tubing or angles. Reinforcing elements 55 may also comprise conduits through which a heating or cooling medium may be passed to either heat or cool furnace 50. Plate 53 may also be heated and cooled by other means. Front door assembly 52 may include valve-actuating assembly 68 mounted to plate 53. Valve actuating assembly 68 may be adapted to actuate one or more isolation valves mounted within furnace 50. (See FIGS. 13 and 14 and their description for details of valve-actuating assembly 68.) Front door assembly 52 may typically provide means for opening furnace 50 to service furnace 50 or load work pieces, for example, photovoltaic material precursors, into furnace 50 for treatment. Front door assembly 52 may typically include a handle and locking assembly 57 for opening, closing, and securing front door assembly 52.

As shown in FIGS. 3 and 5, right side door assembly 54 of furnace 50 may comprise a plate 57 having appropriate reinforcing elements 59, for example, structural tubing or angles. Reinforcing elements 59 may also comprise conduits through which a heating or cooling medium may be passed to either heat or cool furnace 50. Plate 57 may also be heated and cooled by other means. Though right side door assembly 54 may be rigidly mounted to furnace 50 (that is, not adapted to be opened), as shown in FIG. 3, right side door assembly 54 may be removably mounted to furnace 50, for example, pivotally mounted to furnace 50 by means of hinge assembly 70. Right side door assembly 54 may be secured to furnace 50 by conventional means, for example, by means of mechanical fasteners or welding, such as, clamps 72. Clamps 72 may be conventional clamps adapted to secure right side door assembly 54. Right side door assembly 54 may typically provide means for opening furnace 50 for servicing, for example, servicing the work piece support structures, and related treatment devices, for example, the valves, heat exchangers, or heaters, discussed below.

As shown in FIGS. 3 and 6, left side door assembly 56 of furnace 50 may be similar in construction to right side door assembly 54 and may comprise a plate 67 having appropriate reinforcing elements 69, for example, structural tubing or angles. Again, reinforcing elements 69 may also comprise conduits through which a heating or cooling medium may be passed to either heat or cool furnace 50. Plate 67 may also be heated and cooled by other means. Left side door assembly 56 may also be rigidly mounted to furnace 50 (that is, not adapted to be opened). However, as shown in FIG. 6, left side door assembly 56 may be removably mounted to furnace 50, for example, pivotally mounted to furnace 50 by means of hinge assembly 80. Left side door assembly 56 may be also be secured to furnace 50 by conventional means, for example, by means of mechanical fasteners or welding, such as, clamps 73. Clamps 73 may be similar to clamps 72 provided on the right side door assembly 54 shown in FIGS. 3 and 5. Left side door assembly 56 may typically also provide means for opening furnace 50 for servicing, for example, servicing the work piece support structures, and related treatment devices, for example, the valves and heat exchangers, discussed below.

FIG. 7 illustrates the rear panel assembly 58 of furnace 50 which may comprise a plate 97 having appropriate reinforcing elements 99, for example, structural tubing or angles. Reinforcing elements 99 may also comprise conduits through which a heating or cooling medium may be passed to either heat or cool furnace 50. Plate 97 may also be heated and cooled by other means. Rear panel assembly 58 may also be rigidly mounted to furnace 50, that is, not adapted to be opened, but may also be removable, for example, pivotally mounted to furnace 50 by means of hinge assembly. As shown in FIG. 7, rear panel assembly 58 may also be secured to furnace 50 by conventional means, for example, by means of mechanical fasteners or welding.

In aspects of the invention, furnace 50 may include various access ports or openings for assorted purposes, for example, for introducing or removing process fluids (that is, liquids and/or gases), introducing or removing heating or cooling fluids, applying a vacuum, or providing pathways for wiring, cabling, or instrumentation, among other reasons. As shown in FIGS. 3 through 8, access ports or openings may be located in front door assembly 52, right side door assembly 54, left side door assembly 56, rear panel assembly 58, top 60 or bottom 62. As shown in FIG. 7, according to one aspect, rear panel assembly 58 may include a plurality of access ports, including a first row 100 of flanged ports 102 on the left side of rear panel 58 and a second row 104 of flanged ports 106 on the right side of rear panel 58. Ports 102 in row 100 and ports 104 in row 102 may provide ports providing power, such as to heating elements 88; or for instrumentation wiring, such as to temperature or pressure sensors. As also shown in FIG. 7, rear panel 58 may also include two rows 108 of ports 110 centrally mounted on rear panel 58. Ports 110 may be mounted in a common plate 112 and be mounted to plate 97 of rear panel 58 by a plurality of mechanical fasteners 114, for example, bolts or screws. According to one aspect of the invention, ports 110 may provide conduits for venting, purging, or introducing process or control fluids to furnace 50. For example, in one aspect, ports 110 may provide cooling or heating fluid (for example, liquid or gas) to an internal component, such as, to a heat exchanger (for example, heat exchanger 86 shown in FIGS. 15 and 16A).

The top assembly 60 of furnace 50 is illustrated in the top plan view of FIG. 8. Top assembly 60 may comprise a plate 117 having appropriate reinforcing elements 119, for example, structural tubing or angles. Again, reinforcing elements 119 may also comprise conduits through which a heating or cooling medium may be passed to either heat or cool furnace 50. Plate 117 may also be heated and cooled by other means. Top assembly 60 may also be rigidly mounted to furnace 50, that is, not adapted to be opened, but may also be removable, for example, pivotally mounted to furnace 50 by means of a hinge assembly (not shown). As shown in FIG. 8, top assembly 60 may also be secured to furnace 50 by conventional means, for example, by means of mechanical fasteners or welding. As shown in FIG. 8, top assembly 60 may include a plurality of access ports, including a first row 120 of flanged ports 122 on the left side of top assembly 60 and a second row 124 of flanged ports 126 on the right side of top assembly 60. Ports 122 in row 120 and ports 124 in row 122 may provide access ports for power, instrumentation, venting, purging, or process fluids, among other functions. As also shown in FIG. 8, top assembly 60 may also include one or more flanged ports 130, for example, a centrally mounted port in top assembly 60. Ports 130 may also provide an access for ports for power, instrumentation, venting, purging, or process fluids or simply provide a access for flushing or purging furnace 50.

As shown in FIGS. 3 through 8, a plurality of access ports may also be located in bottom 62. Similar to top 60, bottom 62 may include first row 132 of flanged ports 134 on the left side of bottom assembly 62 and a second row 136 of flanged ports 138 on the right side of bottom assembly 62. Ports 134 in row 132 and ports 138 in row 136 may also provide access to the inside of furnace 50 for providing purging, venting, process fluids, or instrumentation. Bottom 62 may also include one or more flanged ports 140 centrally mounted in bottom 62. Port 140 may also provide an access for ports for power, instrumentation, venting, or process fluids or simply provide a access for flushing or purging furnace 50.

Figure 9:
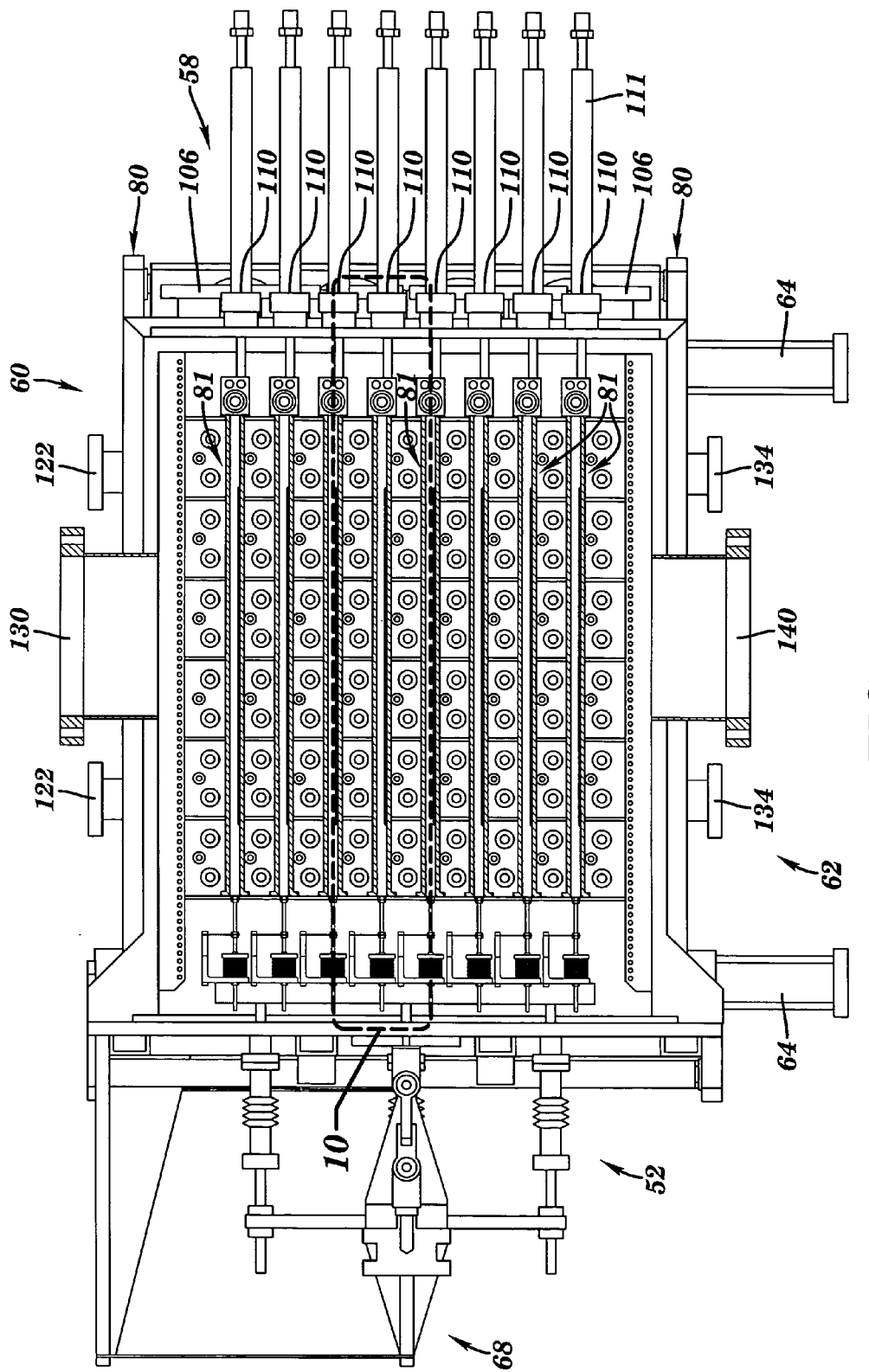
FIG. 9 is a right side elevation view of the furnace shown in FIG. 3 with the right side door removed
Figure 10:
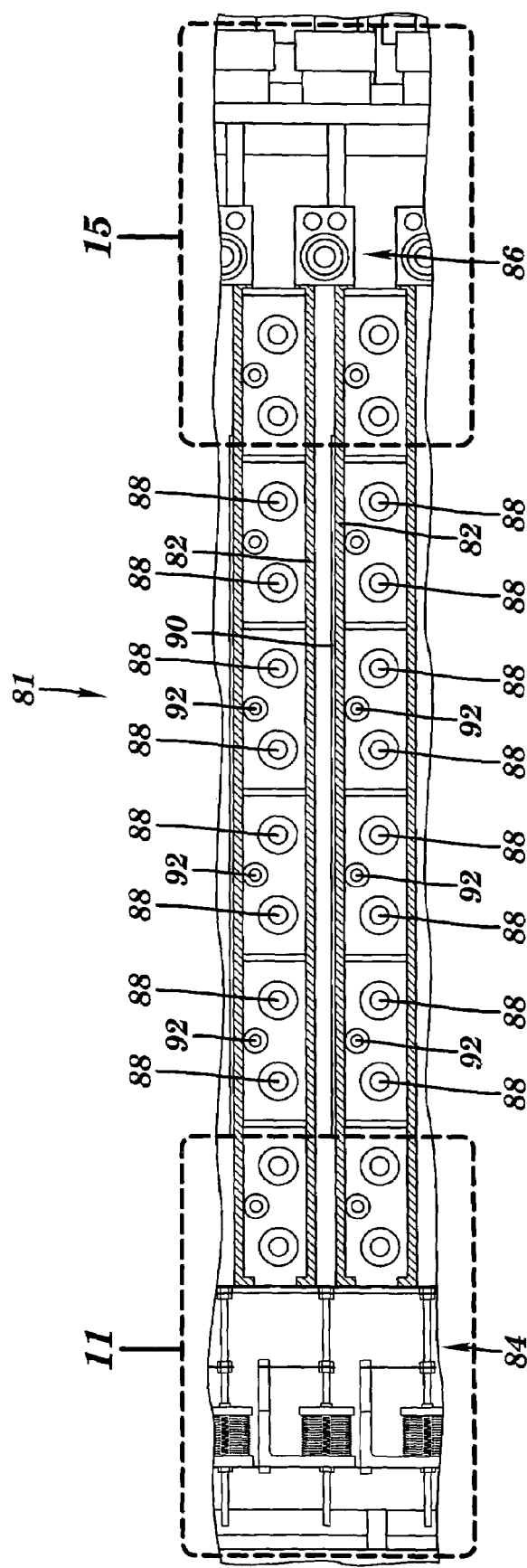
FIG. 10 is a detailed side elevation view of a tube assembly as shown as Detail 10 in FIG. 9.

FIG. 9 is a right side elevation view of the furnace 50 shown in FIGS. 3 through 8 with the right side door assembly 54 and hinge assembly 70 removed to reveal the internal structure of furnace 50. As shown in FIG. 9, furnace 50 includes at least one work piece treatment assembly 81, but typically includes a plurality of work piece treatment assemblies 81 mounted in furnace 50. FIG. 10 is a detailed side elevation view of one work piece treatment assembly 81 as shown as Detail 10 in FIG. 9. In one aspect of the invention, work piece treatment assemblies 81 may be mounted front door assembly 52, right side door assembly 54, left side door assembly 56, rear panel assembly 58, top 60, or a bottom 62. For example, in one aspect, the work piece treatment assemblies 81 may be mounted as rack on a door or side of furnace 50 whereby one or more treatment assemblies 81 may be manipulated or handled, for example, removed or installed, by means of a door or side of furnace 50.

As shown in FIG. 10, each treatment assembly 81 includes a treatment chamber, container, or tube 82; an isolation apparatus (or "flapper valve") assembly 84; and a material delivery (or "condenser/evaporator") assembly 86. Tubes 82 are adapted to accept one or more work pieces 90, for example, a photovoltaic precursor material, to be treated. According to aspects of the invention, work piece 90 is positioned in tube 82 and isolated from the rest of furnace 50 whereby the treatment environment within tube 82 can be controlled as desired, for example, at a desired temperature, pressure, and/or vapor content. The isolation of tubes 82 from the rest of furnace 50 minimizes the exposure of the rest of furnace 50 to gases and vapors present in tubes 82, for example, toxic gases and vapors. According to one aspect of the invention, the use of one or more tubes or inner enclosures 82 inside an outer enclosure, for example, as provided by the walls of chamber 50, isolates the hot treatment zone of the inner enclosure from the outer enclosure whereby low temperature sealing devices, for example, elastomeric seals, may be used to seal the outer enclosure from the ambient environment and minimize thermal damage to the sealing devices. It will be apparent to those of skill in the art that aspects of the invention provide enhanced functionality and enhanced throughput compared to prior art devices and methods.

As shown in FIG. 10, furnace 50 includes a plurality of heat sources 88 adapted to heat the one or more work pieces 90 in tube 82. Heat sources 88 may be an infrared heat source, an inductive heat source, or a convective heat source. For example, heat source 88 may be an infrared heating lamp. Tube 82 is typically fabricated from a material that readily permits the heating of work piece 90 by means of heat sources 88, for example, is made from a transparent or translucent material, such as, quartz, stainless steel (such as 316 stainless steel) or a corrosion-resistant alloy, such as a Hastelloy® alloy. Heat sources 88 may be mounted to the sides, roof, or floor of furnace 50 or mounted to a perforated mounting plate (not shown) having apertures sized to receive and support heat sources 88. Tube 82 may assume any appropriate cross-sectional shape, such as round, rectangular, and square, for example, depending upon the size and shape of the work piece being treated and the size and shape of furnace 50. A perspective view of one tube 82 that may be used in one aspect of the invention is shown in FIG. 16A. As shown in FIG. 10, tube 82 may be mounted on one or more supports 92, for example, one or more bars or support tubes mounted horizontally in furnace 50. Supports 92 may also be fabricated from a material that readily permits the heating of work piece 90 by means of heat sources 88, for example, is made from a transparent or translucent material, such as, glass or quartz. Tube 82 may be rigidly mounted to supports 92 or may be allowed to translate on supports 92, for example, to permit ease of handling, for instance, removal, of tubes 82 from furnace 50, for instance, through open rear panel assembly 58. Supports 92 may be mounted to the sides, roof, or floor of furnace 50 or mounted to a perforated mounting plate (not shown) having apertures sized to receive and support supports 92, for example, the same mounting plate adapted to support heat sources 88. Temperature sensing devices, for example, thermocouples, may be mounted in tubes 82 and/or supports 92.

Figure 11:
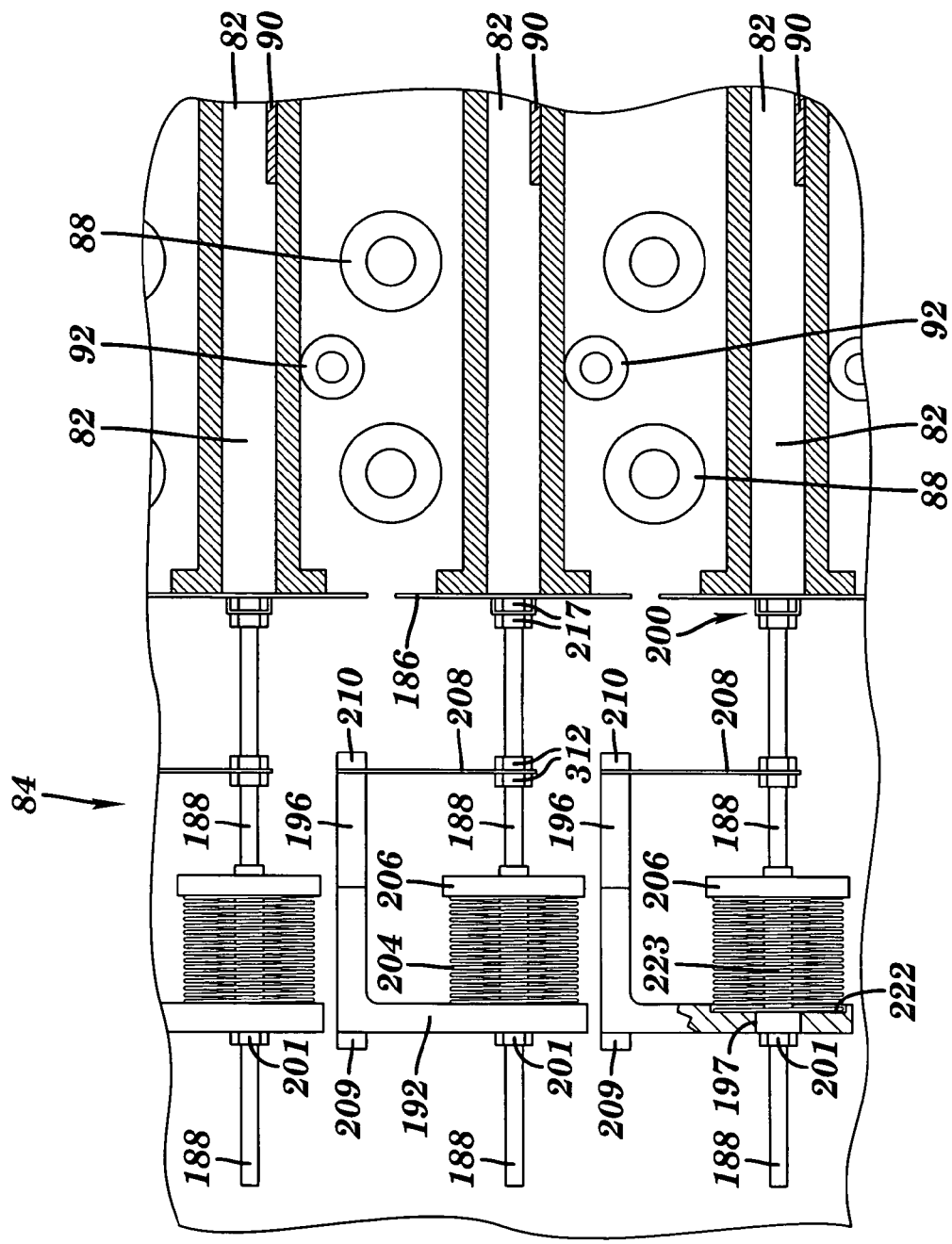
FIG. 11 is a detailed side elevation view of a treatment chamber isolation mechanism shown as Detail 11 in FIG. 10.
Figure 12A:
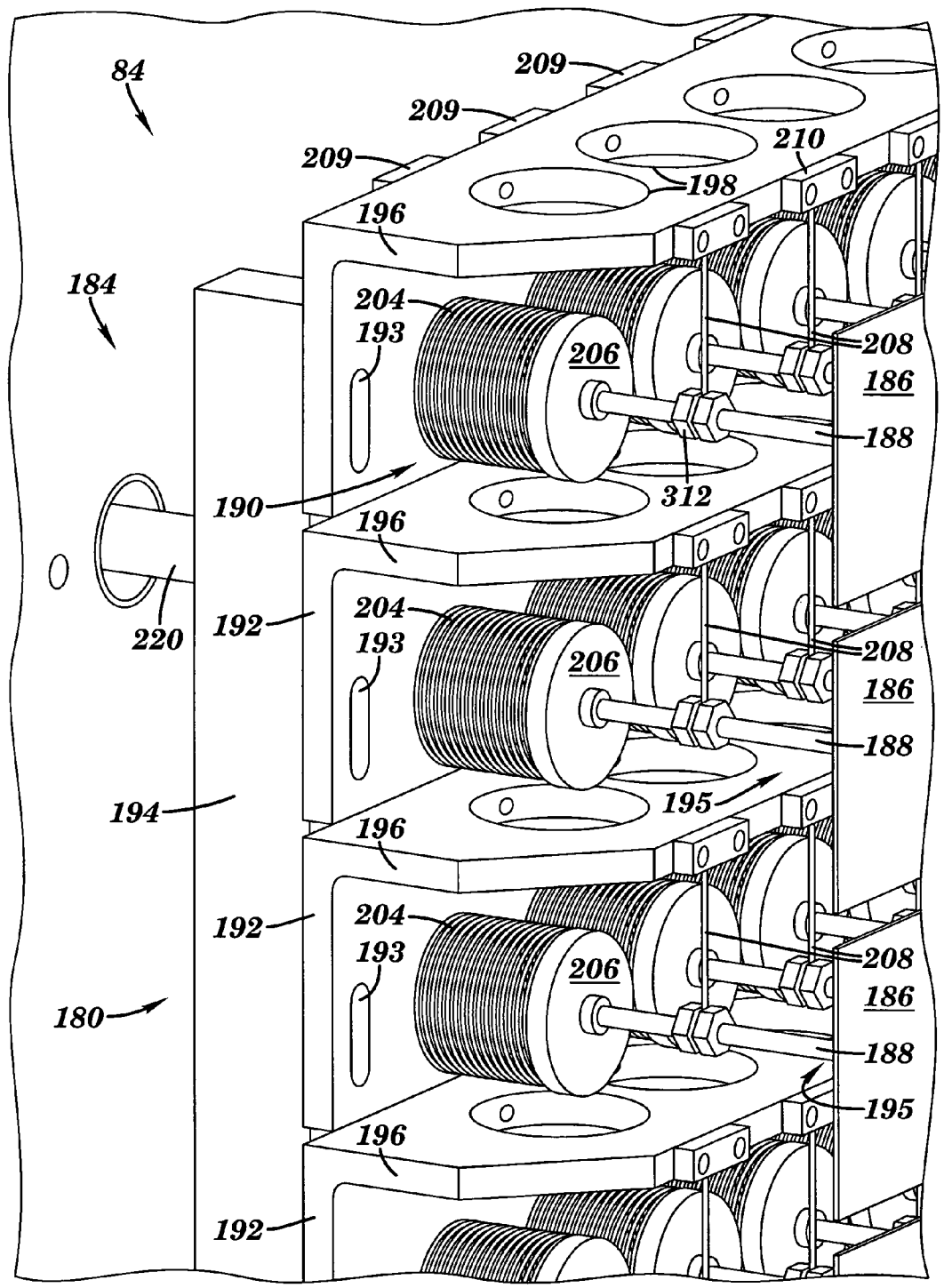
FIG. 12A is a right-hand perspective view of the treatment chamber isolation mechanism shown in FIG. 11.
Figure 12B:
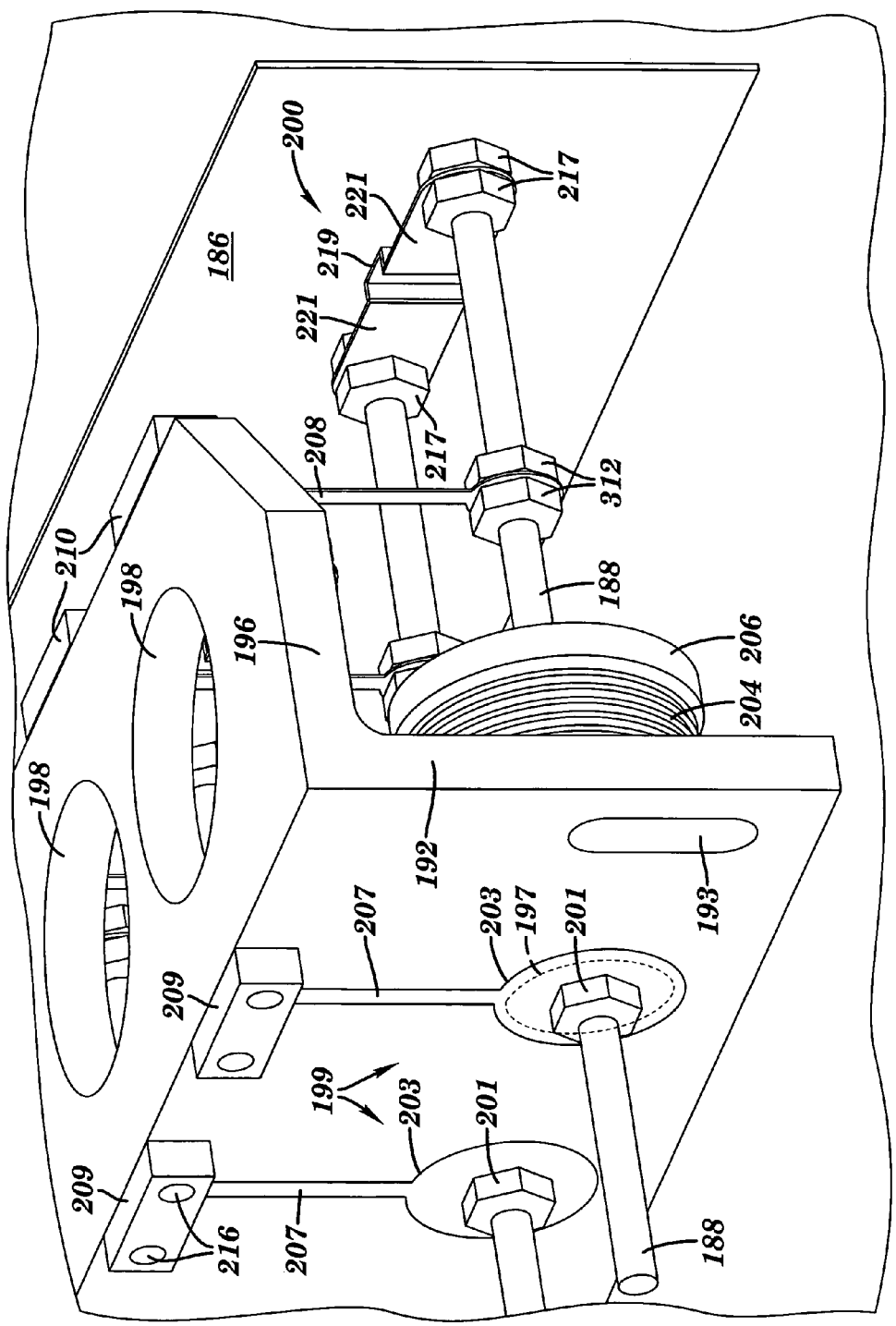
FIG. 12B is a left-hand perspective view of the treatment chamber isolation mechanism shown in FIG. 11.

FIG. 11 is a detailed side elevation view of a tube sealing assembly 84 shown as Detail 11 in FIG. 10. FIG. 12A is a right-hand perspective view of tube sealing assembly 84 shown in FIG. 11. FIG. 12B is a left-hand perspective view of the tube sealing assembly 84 shown in FIG. 11.

As shown in FIGS. 11, 12A, and 12B, sealing assembly 84 is adapted to close or seal the end of treatment chamber or tube 82 (shown in phantom). The sealing assembly 84 includes a sealing or "flapper valve" assembly 180 and means 182 for compressing the sealing assembly 180 against the treatment chamber or tube 82. Though in some aspects the sealing assembly 180 may provide an vapor-tight cover to the one or more treatment chambers 82, in another aspect, the engagement of sealing assembly 180 may not be vapor-tight, but may simply minimize the escape of fluids (that is, gases or liquids) from treatment chamber 82 during treatment. The sealing assembly 180 includes a support structure 184, at least one cover plate 186 adapted to engage the treatment chamber opening, and a plurality of rods 188. The plurality of rods 188 have a first end 190 mounted to support structure 184, for example, resiliently mounted to support structure 184, and a second end 195 adapted to engage cover plate 186.

Support structure 184 may be any support structure adapted to support the one or more cover plates 186 and adapted to engage the means 182 for compressing the sealing assembly 180 against the treatment chamber or tube 82 while withstanding the treatment temperatures, for example, up to 800 degrees C. In one aspect, support structure 184 may be a single plate, for example, a plate having sufficient stiffness that does not require the need for additional structural support bars or ribs. In another aspect, support structure 184 may comprise a plurality of plates 192, for example, a plurality of vertically or horizontally oriented plates. Plates 192 may be attached by means of mechanical fasteners, welding, or by common support bars or ribs. In the aspect shown in FIG. 11, support structure 184 may comprise a plurality of horizontal plates 192 mounted to a plurality of vertical support bars 194. Plates 192 may be mounted to bars 194 by mechanical fasteners or welding. Plates 192 may include holes or slots 193 through which mechanical fasteners (not shown) may adjustably engage support bars 194.

As shown in FIGS. 11 and 12A, plates 192 include a plurality of apertures 197 through which the first ends 190 of rods 188 pass through plates 192. Rods 188 may be mounted to plates 192 by conventional means, for example, by means of mechanical fasteners. As shown in FIGS. 11 and 12B, in one aspect, rods 188 may mount to plates 192 by means of a flexural member 199 and one or more fasteners 201, for example, one or more hex nuts. (Though not shown in FIG. 12B, rod 188 may be retained to flexural member 199 by a second fastener, for example, a hex nut located behind flexural member 199.) Flexural member 199 may comprise a "flexure" as discussed below. Flexural member 199 may include a circular disk section 203 and an elongated stem 207. Disk section 203 may be sized to ensure that disk section 203 cannot pass through aperture 197 in plate 192. Stem 207 may be mounted to plate 192 by conventional means, for example, by clamp plate 209 and fasteners 216. According to one aspect of the invention, the flexibility of flexural member 199 provides for at least some alignment for the positioning of plate 186 on tube enclosure 82. For example, flexural member 199 and pin 208 may provide a parallel flexure configuration that minimizes the misalignment of plate 186 while providing at least some resiliency or compliance in the alignment of the mating structures.

As shown in FIGS. 11, 12A, and 12B, plates 192 may include an extension 196, for example, plates 192 and extensions 196 may comprise structural angles. Extension 196 may be solid or include a plurality of through holes 198, for example, to facilitate assembly, to reduce the weight of support structure 184, or to provide a purge path to eliminate virtual leaks. Plates 192, bars 194, and extensions 196 may be made from any metal or non-metal structural material, for example, a steel, stainless steel, titanium, nickel, or any other structural metal. In one aspect, plates 192, bars 194, and extensions 196, may be made from stainless steel, for example, 304 stainless steel.

The one or more cover plates 186 may be metallic, but are typically made from stainless steel sheet having a thickness of from about 0.005 inches to about 0.125 inches. The size of cover plate 186 will vary depending upon the size of the treatment chamber and the treatment chambers sealing assembly 180 used to seal the treatment chamber. Cover plates 186 may be about 3 inches long to about feet long and may have a width from about 1 inch to about 1 foot. Typically cover plate 186 is about 2 feet long and about 2 inches in width. In one aspect of the invention, cover plate 186 may engage a single or a plurality of treatment chambers, for example, 2, 3, or more treatment chambers. That is, cover plate 186 may be adapted to seal a plurality of treatment chamber openings, for example, a plurality of tubes 82.

Rods 188 are adapted to transmit a load from support assembly 184 to the cover plates 186. Rods 188 may have any cross section, including square or rectangular, but are typically circular in cross section and may have a diameter of between about 0.125 inches and 0.5 inches. Rods 188 are typically about 0.375 inches in diameter and may be at least partially threaded. Rods 188 may engage plates 186 by conventional means, for example, by means of mechanical fasteners or welding. However, in one aspect, a first end 195 of rods 188 is not rigidly mounted to plates 186 but may be flexibly engaged to allow for some relative displacement between rods 188 and plates 186. One means of providing this non-rigid engagement to the first end 189 of rod 188 is illustrated in FIG. 12B, where first end 195 engages plates 186 by means of clips 200. As shown in FIG. 12B, clip 200 may comprise a central u-shaped portion 219 and at least one, typically, two, cantilevered plate sections 221. Cantilevered plate sections 221 may comprise "flexures" as discussed below. Plate sections 221 may have at least one, typically, two, holes (not shown) adapted to engage and retain the first end 195 of rods 188, for example, by means of one or more fasteners 217, for example, hex nuts threaded to rods 188. Clip 200 may be mounted to plate 186 by mechanical fasteners or welding, for example, simple resistance welding at section 219. Clip 200 is typically also made from stainless steel, for example, 304 stainless steel.

As discussed above, the second end 190 of rod 188 is adapted to engage support structure 180. As shown in FIGS. 11 and 12B, second end 190 may pass through at least one hole 197 in plate 192 and, for example, engage flexural member 199. As also shown in FIGS. 11 and 12B, rod 188 may include a resilient mounting to plate 192, for example, by means of one or more springs 204, for example, coil springs. Springs 204 are preferably made from a temperature resistant material, for example, a high strength austenitic nickel-chromium-iron alloys, for instance, a Special Metals Corporation's Inconel® alloy, such as Inconel® 750 alloy, or its equivalent. Rod 188 may include one or more spring capturing or retaining devices, for example, a cup-like spring retaining device 206 mounted to rod 188. In this aspect, retaining device 206 receives springs 204 to promote engagement between spring 204 and rod 188. Retaining device may also include a sleeve 223 (see FIG. 11) though which rod 188 passes. In one aspect, the end of sleeve 223 may provide a surface against which fastener 201 captures flexural member 199 when attaching flexural member 199 to rod 188. Plates 192 may also include a recess or counter bore 222 (see FIG. 11) for receiving spring 204 to facilitate assembly and ensure alignment during operation. Rods 188 and retaining devices 206 may be made from any metal or non-metal structural material, for example, a steel, stainless steel, titanium, nickel, or any other structural metal. In one aspect, rods 188 and retaining devices 206 may be made from stainless steel, for example, 304 stainless steel.

In one aspect, sealing assembly 84 may include additional support members for rods 188, for example, to position rods 188 and cover plates 186 in the desired position to engage treatment chambers 82. As shown in FIG. 11, sealing assembly 184 may include one or more retaining members, pins, or bars 208 to support rods 188. In one aspect of the invention, bars 208 may comprise "flexures" as discussed below. Bars 208 may be mounted to any convenient location on support structure 180 and engage rods 188 by conventional means, for example, mechanical fasteners. In the aspect shown in FIG. 11, bars 208 are mounted to extension 196 (for example, to the leg of the structural angle) by means of mechanical fasteners and a clamp plate 210. Bars 208 may be mounted to rods 188 by conventional means, including welding or mechanical fasteners. As also shown, bars 208 may be mounted to rods 188 by capture between two or more fasteners 312, for example, hex nuts, threaded to rod 188. It will be apparent to those of skill in the art that the threaded mounting of bar 208 to rod 188 via nuts 312 permits the assembler to vary the position of engagement whereby the elevation of rods 188 (and of plates 186) may be varied as desired.

According to aspect of the invention, the sealing assembly 84 illustrated in FIGS. 11 and 12 is displaced into engagement with one or more treatment chambers or tubes 82 to at least partially limit the escape of fluids from treatment chamber 82 during treatment. The displacement of sealing assembly 84 into engagement with treatment chambers 82 is effected by means of valve-actuation assembly 68 (see FIGS. 3-5 and 9). Though valve-actuation assembly 68 may be positioned within furnace 50 or outside of furnace 50, in the aspect shown in FIGS. 3-5, valve-actuation assembly 68 is positioned outside of furnace 50 and is adapted to engage sealing assembly 84 by means of a plurality of rods extending through a wall of furnace 50.

Figure 14:
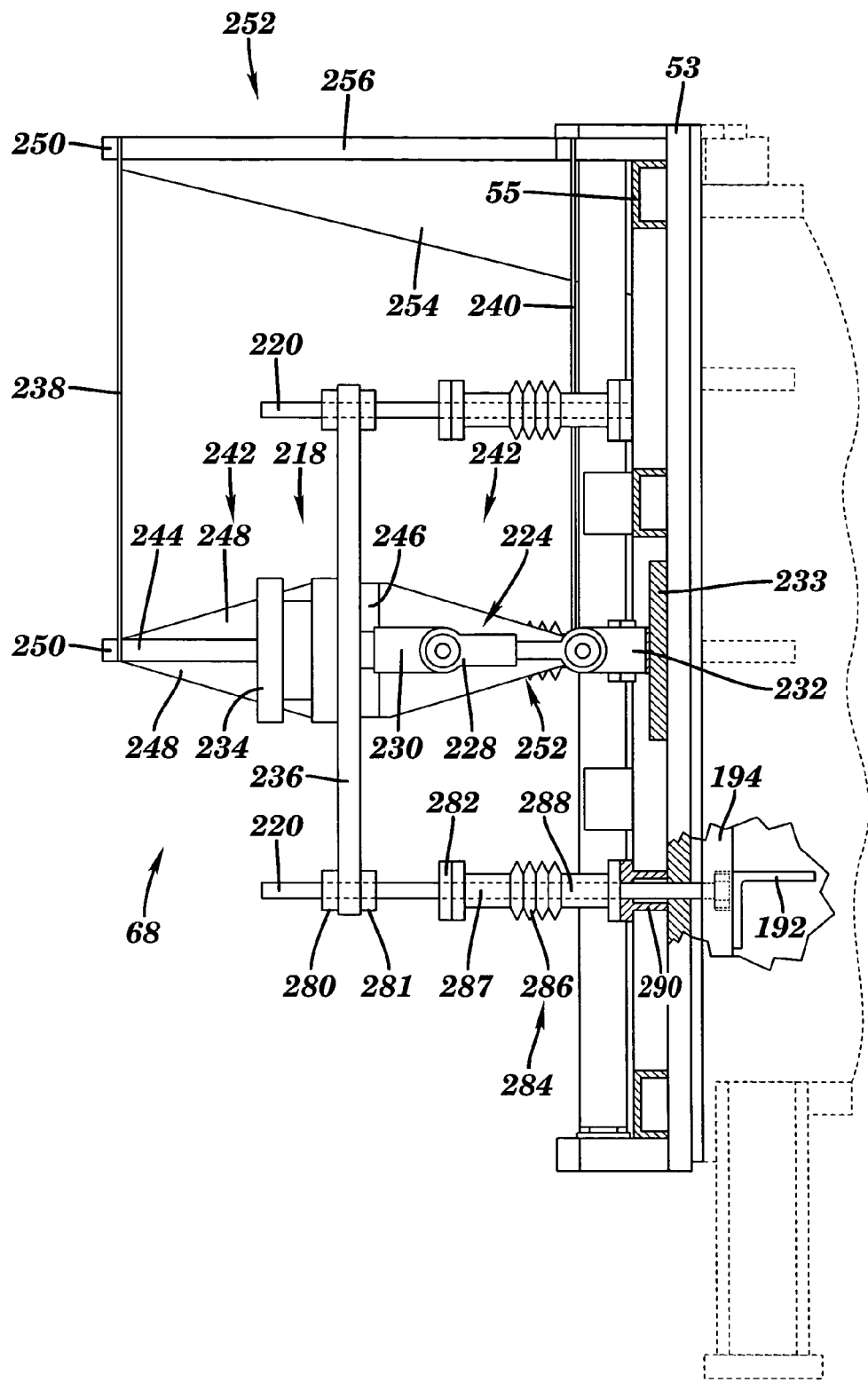
FIG. 14 is a side elevation view of the valve actuating assembly shown in FIG. 9.

FIG. 13 is a perspective view of valve actuation assembly 68 shown in FIG. 9. FIG. 14 is a side elevation view of the valve actuation assembly 68 shown in FIG. 9. As shown, valve actuation assembly 68 is mounted to front door plate 53 by means of a structural support 218 and is adapted to displace at least one actuation rod 220, typically, a plurality of rods 220. In the aspect shown, six actuation rods 220 are displaced by valve actuation assembly 68. Valve actuation assembly 68 includes one or more linkage assemblies 224, for example, a spherical linkage assembly, mounted to door 53 and a piston assembly 234 mounted to structural support 218 and to linkage assembly 224. According to the present invention, piston assembly 234 displaces structural support 218 to which rods 220 are mounted to displace rods 220 and sealing assembly 84 (see FIGS. 11 and 12).

As shown in FIG. 14, linkage assembly 224 includes a body 228, a first bracket 230 by which body 228 is mounted to piston assembly 234 and a second bracket 232 mounted to plate 233 which is mounted to door plate 53, for example, by conventional mechanical fasteners or welding. One or more pneumatic or hydraulic lines (not shown) may be provided to actuate piston assembly 234. Hydraulic or pneumatic cylinder 234, for example, a short-stroke cylinder, mounted to support structure 218.

Support structure 218 may include a variety of structural elements for transmitting the displacement provided by piston assembly 224 to rods 220. Piston assembly 224 is mounted to main plate 236 of support structure 218 to which the plurality of rods 220 are mounted. Main plate or actuation plate 236 may take a variety of shapes depending upon the size and number of rods 220, to which main plate 236 is mounted. In the aspect shown in FIG. 13, main plate 236 takes the general form of the letter "H" where the rods 220 are mounted to the uprights and the piston assembly 224 mounts to the cross beam. In one aspect, the main plate 236 may be relatively stiff, for example, at least about 0.375 inches in thickness, to promote uniform displacement of rods 220, for example, to minimize misalignment of rods 220. In one aspect, main plate 236 may include one or more reinforcing ribs to increase the stiffness of plate 236.

Support structure 218 may also include at least one flexural plate 238, 240 mounted to main plate 236. In one aspect, plates 238 and 240 comprise flexures, that is, precision flexural elements that can control the accuracy of deflection, for example, parallel flexures. (See Slocum, *Precision Machine Design* (1992), the disclosure of which is incorporated by reference herein.) Flexural plates 238 and 240 not only support the main plate 236 and rods 220, but flexural plates 238 and 240 may also provide at least some flexibility to support structure 218 whereby rods 220 can be more uniformly displaced. Flexural plates 238 are mounted to main plate 236 by mounts 242. Mounts 242 may assume a variety of shapes and sizes, but, as shown in FIGS. 13 and 14, mounts 242 may comprise a center plate 244, a base plate 246 mounted to the center plate, and two gussets 248 mounted to the sides of the center plate. Mounts 242 may be fabricated by welding or mechanical fasteners. Flexural plates 238 may be mounted to mounts 242 by a mounting plate 250 and mechanical fasters.

Flexural plates 238 are also mounted to furnace 50, for example, to the front door plate 53, by any conventional mounting means. As shown in FIGS. 13 and 14, flexural plates 238 may be mounted to furnace 50 via flanged support 252. As shown in FIG. 14, flanged support 252 may include a center web plate 254 and a flange plate 256. Flanged supports 252 may be mounted to furnace 50 by conventional means, for example, mechanical fasteners or welding. Flexural plates 238 may be mounted to flanged support 252 by a mounting plate 250 and mechanical fasters.

Flexural plates 240 may also be mounted to main plate 236 by mounts 252, that is, structural members similar to or identical to mounts 242 discussed above. Flexural plates 240 may be mounted to mounts 252 by a mounting plate 250 and mechanical fasteners. Flexural plates 240 are also mounted to furnace 50, for example, to the front door plate 53, by any conventional mounting means. As shown in FIGS. 13 and 14, flexural plates 240 may be mounted to furnace 50 via plates 254. As shown in FIG. 13, plates 254 may be mounted to furnace 50 by conventional means, for example, mechanical fasteners or welding. Flexural plates 240 may be mounted to plates 254 by a mounting plate 250 and mechanical fasters.

According to one aspect of the invention, the function of valve actuation assembly 68 is to displace sealing assembly 84 against the treatment tubes 82. This displacement of sealing assembly 84 is typically effected via rods 220. As shown in FIG. 14, rods 220 are mounted to main plate 236. Rods 220 may be mounted to plate 236 by conventional mechanical fasteners, for example, as shown in FIG. 14, rods 220 are mounted to plate 236 by a pair of collars 280 and 281. Rod 220 extends into furnace 50 through flange 282 and flanged bellows assembly 284. Bellows assembly may provide some flexibility to the insertion of rods 220 into furnace 50. Bellows assembly 284 includes a bellows 286 and two flanged pipes 287 and 288. Bellows assembly 284 may be a typical off-the-shelf item. According to one aspect, rods 220 may be rigidly mounted to flange 282, for example, by mechanical fasteners or welding, whereby the displacement of rods 220 is accompanied by the displacement, for example, compression, of bellows 286. Flanged pipe 288 is mounted to a flanged nipple 290 mounted to front door plate 53. The flanged connections may typically comprise "conflat" flanges, for example, conflat flanges provided by the Kurt J. Lesker Company of Clairton, Pa., or their equivalent. ISO and/or ASA flange systems may also be used. After passing through front door plate 53, rods 220 engage sealing assembly 84. Rods 220 may engage sealing assembly 84 in any fashion effective to displace sealing assembly 84. In one aspect, rods 220 are mounted to support structure 184 of sealing assembly 84 by mechanical fasteners, for example, by bolts or screws, to plates 192 or bars 194 (see FIGS. 11 and 12) of support structure 184. Rods 220 may also be welded to support structure 184.

Figure 15:
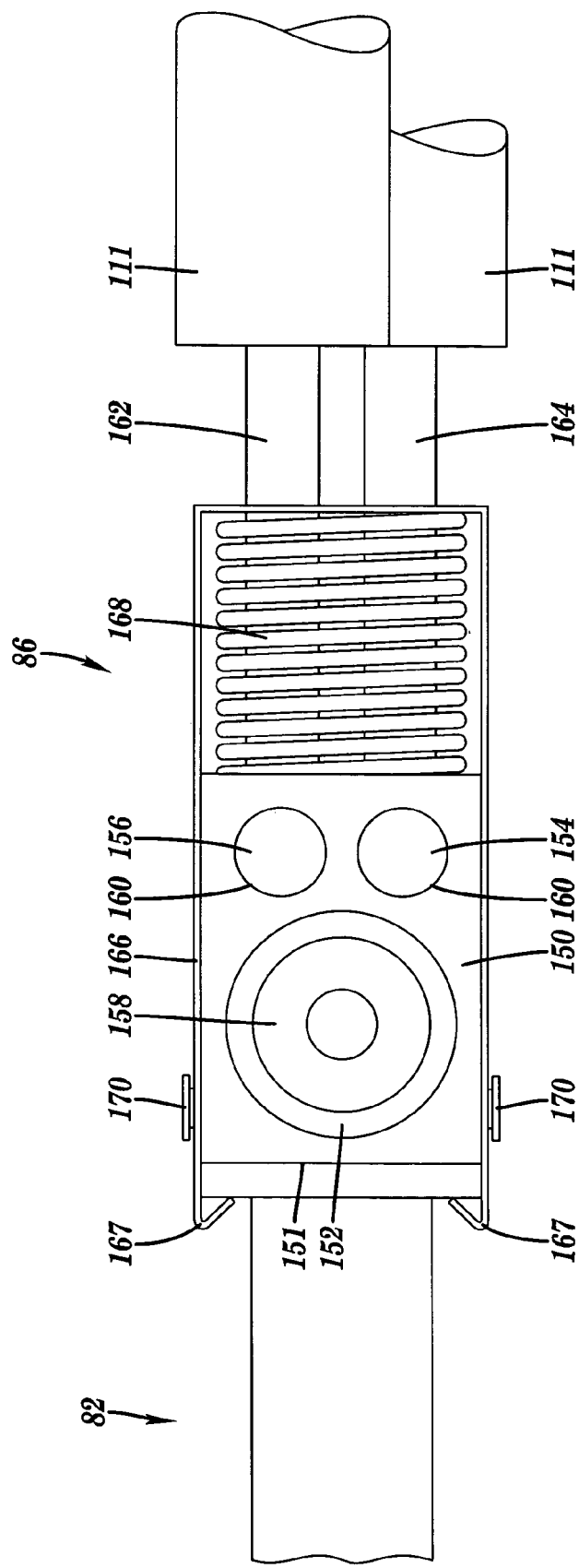
FIG. 15 is a detailed side elevation view of a heat exchanger shown as Detail 15 in FIG. 10.

FIG. 15 is a detailed side elevation view of a heat exchanger or condenser/evaporator 86 shown as Detail 15 in FIG. 10. A perspective view of heat exchanger 86 along with tube 82 is shown in FIG. 16A. FIG. 16B is a detailed cross section of the conduit mounting shown in FIG. 16A. FIG. 17 is an exploded view of heat exchanger 86 shown in FIGS. 15 and 16A. According to aspects of the invention, heat exchanger 86 (and any other heat exchanger identified herein) may be a device that exchanges heat between the body of the device and a working fluid passing through the device to vary the temperature of at least one surface of the device. In one aspect of the invention, heat exchanger 86 (and any other heat exchanger identified herein) may function as a "condenser," that is a device having at least one surface upon which a volatilized material may condense upon, for example, by lowering the temperature of the surface. In one aspect of the invention, heat exchanger 86 (and any other heat exchanger identified herein) may function as an "evaporator," that is, a device having at least one surface upon which a volatilizable material is applied and from which the volatilizable material may be volatilized or "evaporated," for example, by raising the temperature of the surface. In another aspect of the invention, heat exchanger 86 (and any other heat exchanger identified herein) may function as both a "condenser" and an "evaporator," and may be referred to as a "condovator."

Figure 16:
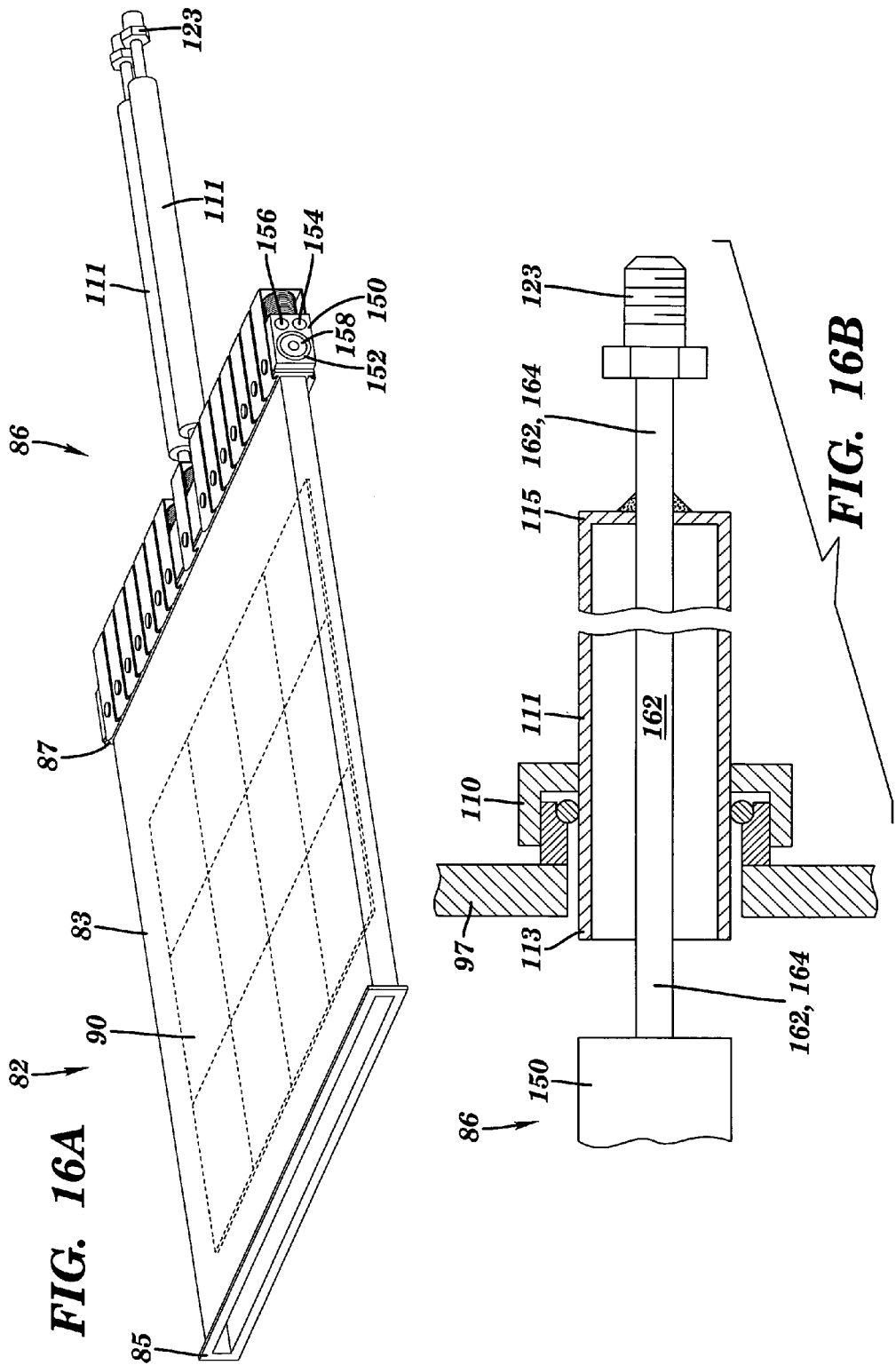
FIG. 16A is a perspective view of the tube and heat exchanger assembly as shown in FIG. 10.
FIG. 16B is a detailed cross section of a conduit mounting shown in FIG. 16A.
Figure 17:
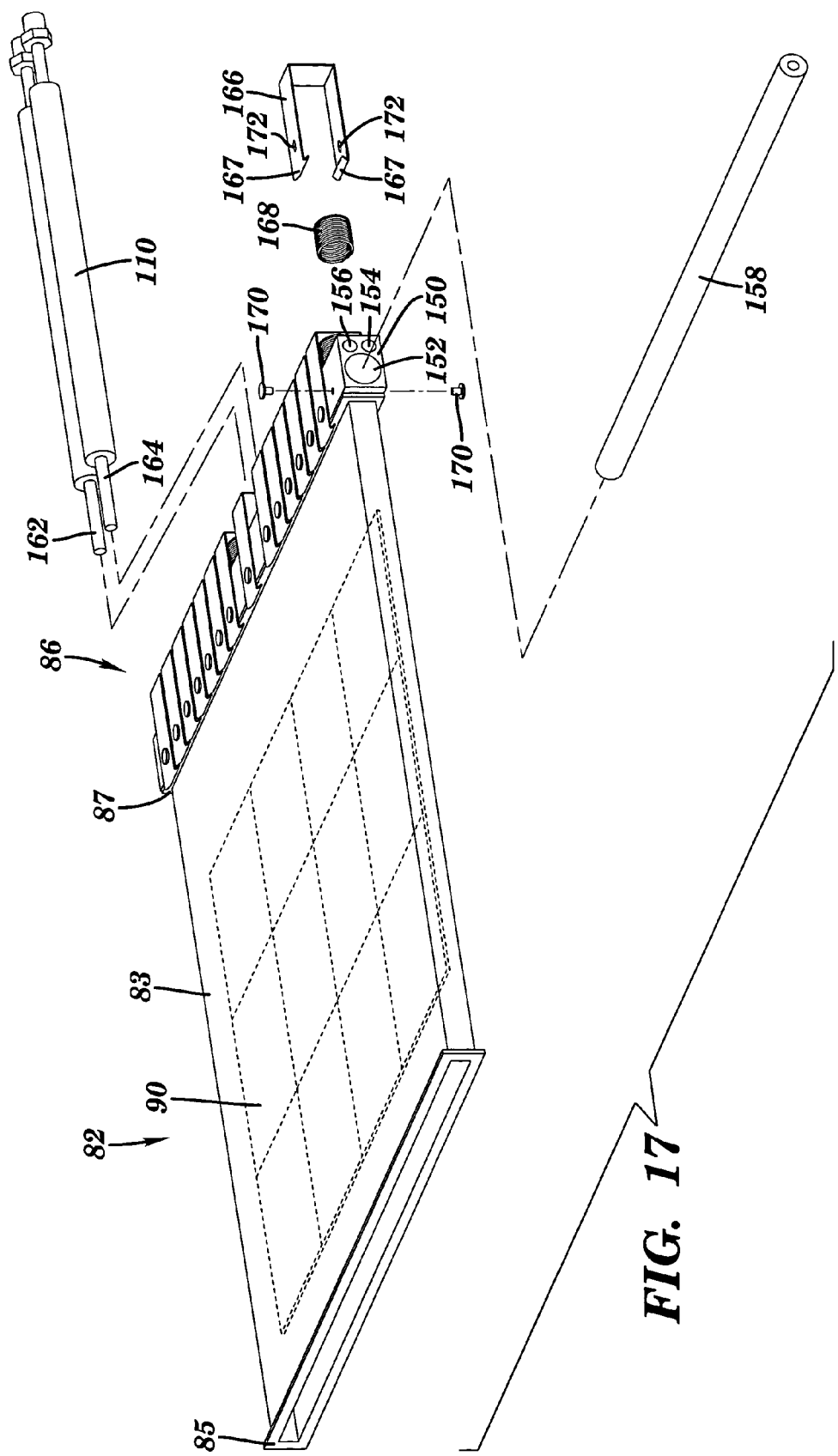
FIG. 17 is an exploded view of the heat exchanger shown in FIGS. 15 and 16A.

As shown in FIGS. 15-17, tube 82 comprises a main cylindrical section 83, an open first end having a first flange 85, and open second end having a second flange 87. Heat exchanger 86 is mounted to flange 87 of the open second end of tube 82 wherein a surface of heat exchanger 86 is exposed to the open end of tube 82. In one aspect of the invention heat exchanger 86 may comprise a material delivery device, that is, a device for use in regulating the delivery of a vaporous material or element, for example, vaporous Se or S, to tube 82. As shown in FIGS. 15-17, heat exchanger 86 consists of an elongated cylindrical body 150 having at least one surface 151 exposed to the open end of tube 82. According to one aspect of the invention, surface 151 is adapted to receive at least some volatilizable element, for example, by means of the "charging" process described below. The temperature of surface 151 is then regulated, for example, heated or cooled, whereby the element volatilizes and the vaporous element is released into tube 82 to treat work piece in tube 82.

Cylindrical body 150 of heat exchanger 86 may be a rectangular, square, or circular cylindrical body, or any other shaped cylindrical body adapted to be mounted to a treatment tube, such as, treatment tube 82. Cylindrical body 150 may include at least one first passage 152, for example, a circular passage, extending the substantially the entire length of body 150, and two smaller passages, 154 and 156, for example, also circular, and also extending substantially the entire length of body 150. According to one aspect of the invention, passage 152 is adapted to retain at least one heating device 158, for example, an infrared heat source, an inductive heat source, or a convective heat source, among other devices. Passage 152 may be circular, square, rectangular, or any other shape adapted to retain a heating device 158. According to one aspect, heating device 158 may comprise one or more heating devices positioned along one or more passages 152. Heating device 158 typically may have a power output of at least about 200 watts, typically, at least 500 watts. For instance, heating device 158 may be an off-the-shelf infrared light tube. Heating device 158 is typically supplied with electric power by means of a wire or cable and an appropriate electrical connector not shown (for example, through port 102 shown in FIG. 7).

Passages 154 and 156 may be coolant or heating fluid flow passages, for example, passages for transmitting a working fluid, that is, a liquid or a gas, through body 150 to heat or cool body 150 and surface 151. The working fluid may be air; nitrogen; water; an inert gas, for example, helium; an oil; or an alcohol, for example, ethylene glycol; among other working fluids. Passages 154 and 156 are typically capped at either end by plugs 160. Passages 154 and 156 communicate with two or more working fluid source conduits 162 and 164 adapted to receive and discharge a working fluid to and from an external source. Conduits 162 and 164 may be positioned anywhere along body 150, and, as shown in FIG. 16A, may be positioned in about the middle of body 150. Conduits 162 and 164 may have about ¼-inch nominal diameter and be mounted in conduits 111, as discussed below with respect to FIG. 16B. Conduits 162 and 164 typically supply working fluid to heat exchanger 86 from a source outside furnace 50 (also shown in FIGS. 7-9). For example, coolant flow, such as, air, may be provided to conduit 162 which passes the coolant to passage 156. The coolant may then flow through one or more cross passages (not shown) to passage 154 and then be returned to conduit 164 at a hotter temperature when cooling (or a colder temperature when heating) than the coolant introduced through conduit 162. The hotter coolant discharged through conduit 164 may be vented or passed through a heat exchanger for cooling (or heating) or to heat recovery, for example, the coolant may be cooled and reintroduced as coolant to conduit 162. In one aspect, the temperature of the working fluid introduced to heat exchanger may be varied to effect the desired temperature of surface 151. For example, the temperature of surface 151 may be regulated by varying the temperature of the working fluid introduced to heat exchanger 86 by means of an external heat exchanger (not shown).

As shown in FIG. 15, heat exchanger 86 is mounted to tube 82 whereby surface 151 is exposed to the inside of tube 82. Since tube 82 may typically be made from a material (for example, quartz) having a different thermal expansion coefficient than the material (for example, 304 stainless steel) of the body 150 of heat exchanger 86, the mounting of heat exchanger 86 to tube may make allowance for differences in thermal expansion. As shown in FIGS. 15-17, in one aspect, heat exchanger 86 may be mounted to tube 82 by means of one or more brackets or clips 166 and one or more resilient materials 168, for example, one or more coil springs or flexures. According to this aspect, the clips 166 and coil springs 168 provide for a thermally expandable mounting of heat exchanger 86 to tube 82 while maintaining contact, for example, vapor-tight contact, between surface 151 of body 150 and tube 82.

FIG. 16B is a detailed cross section of the mounting of conduits 162 and 164 in conduit 111. Conduit 111 comprises a cylindrical tube, for example, about ¼-inch nominal diameter, having an open first end 113 and a closed second end 115. Conduits 162 and 164 typically extend from cylindrical body 150 of heat exchanger 86 and pass through conduit 111 and through closed end 115. Conduits 162 and 164 may have an appropriate coupling 123, for example, the mail pipe coupling shown, to connect to a source of coolant, for example, air. Conduits 162 and 164 may be mounted to the closed end 115 of conduit 111 by means of mechanical fasteners or welding. Conduits 111 may be mounted to chamber 50, for example, into ports 110 in the rear wall 97 of chamber 50, by means of an appropriate mechanical fastener. For example, port 110 may comprise an appropriate vacuum fitting, for example, an Ultra-Torr® vacuum fitting provided by the Swagelok Company, or its equivalent fitting. According to aspects of the invention, the mounting of conduits 162 and 164 in conduit 111 allows for some compliance in the mounting of tubes 82 in furnace 50. For example, the flexibility of the mounting of conduits 162 and 164 in conduit 111 permits some adjustment in the alignment of heat exchanger 86 and tube 82 in furnace 50.

As shown in FIG. 17, clip 166 may comprise a thin sheet metal, for example, stainless steel plate having a thickness of around 0.040 inches, bent into a U-shape. The thickness of the plate or sheet from which clip 166 is made may vary from about 0.005 inches to about 0.125 inches. Though the aspect of the invention shown in FIGS. 15-17 includes a plurality of clips 166 retaining a plurality of springs 168, aspects of the invention may include one or more clips 166 or clip-like structures having the function of clips 166 and one or more spring-like elements performing the function of springs 168.

As shown, the ends 167 of clip 166 may be crimped or bent to attach clip 166 to the end of tube 82, for example, to a flange of tube 82. Clip 166 may be mounted to body 150 by one or more fasteners 170, for example, screws or rivets, through one or more slotted holes 172 in clip 166. Slotted holes 172 allow clip 160 to translate with respect to body 150, for example, due to differences in thermal expansion. The mounting of heat exchanger 86 to tube 82 may also include two or more springs 168, for example, coil springs or Belleville springs, among others, mounted concentrically or axially with respect to each other.

Figure 18A:
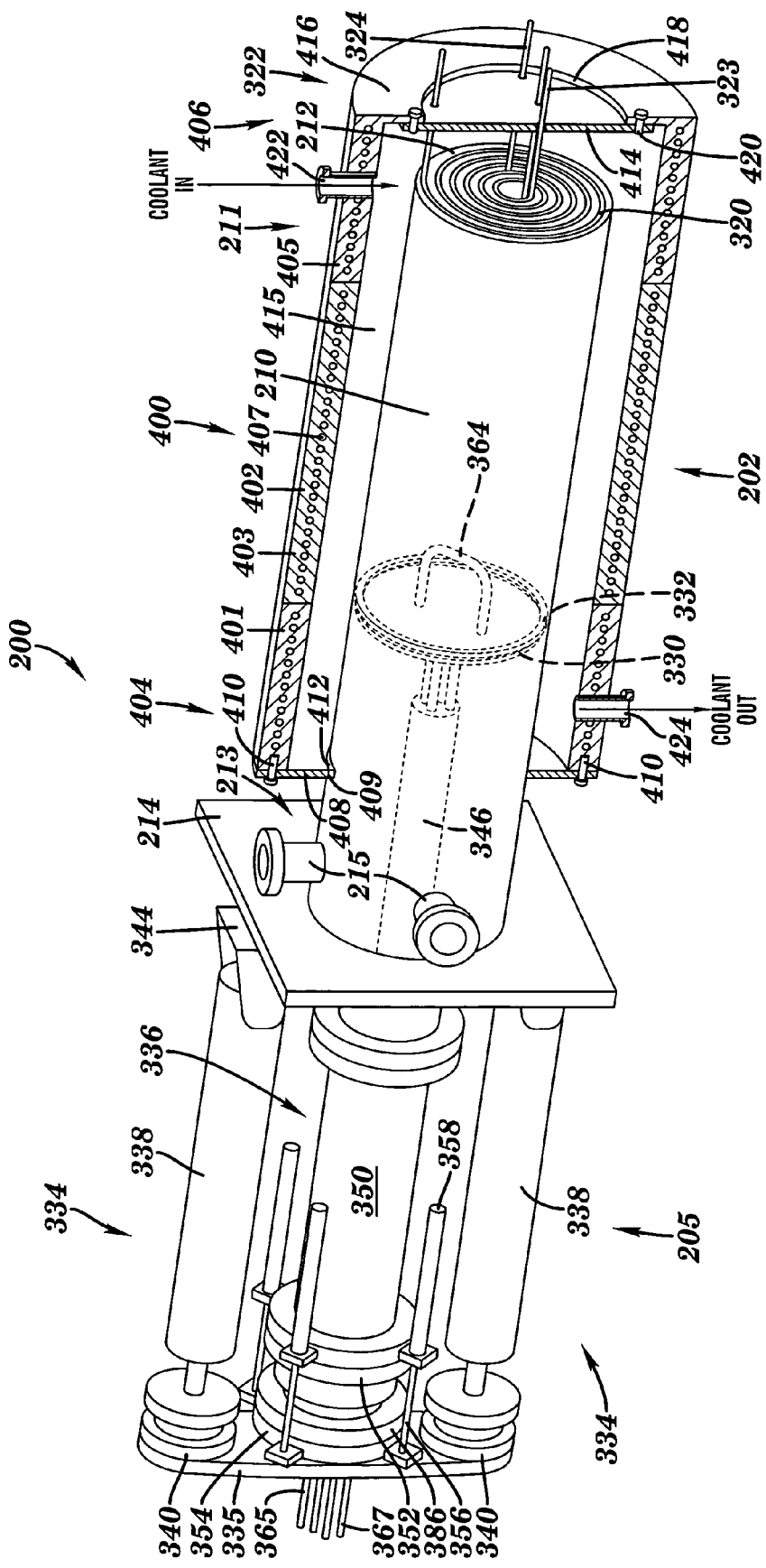
FIG. 18A is a perspective view of a furnace assembly according to another aspect of the invention.
Figure 18B:
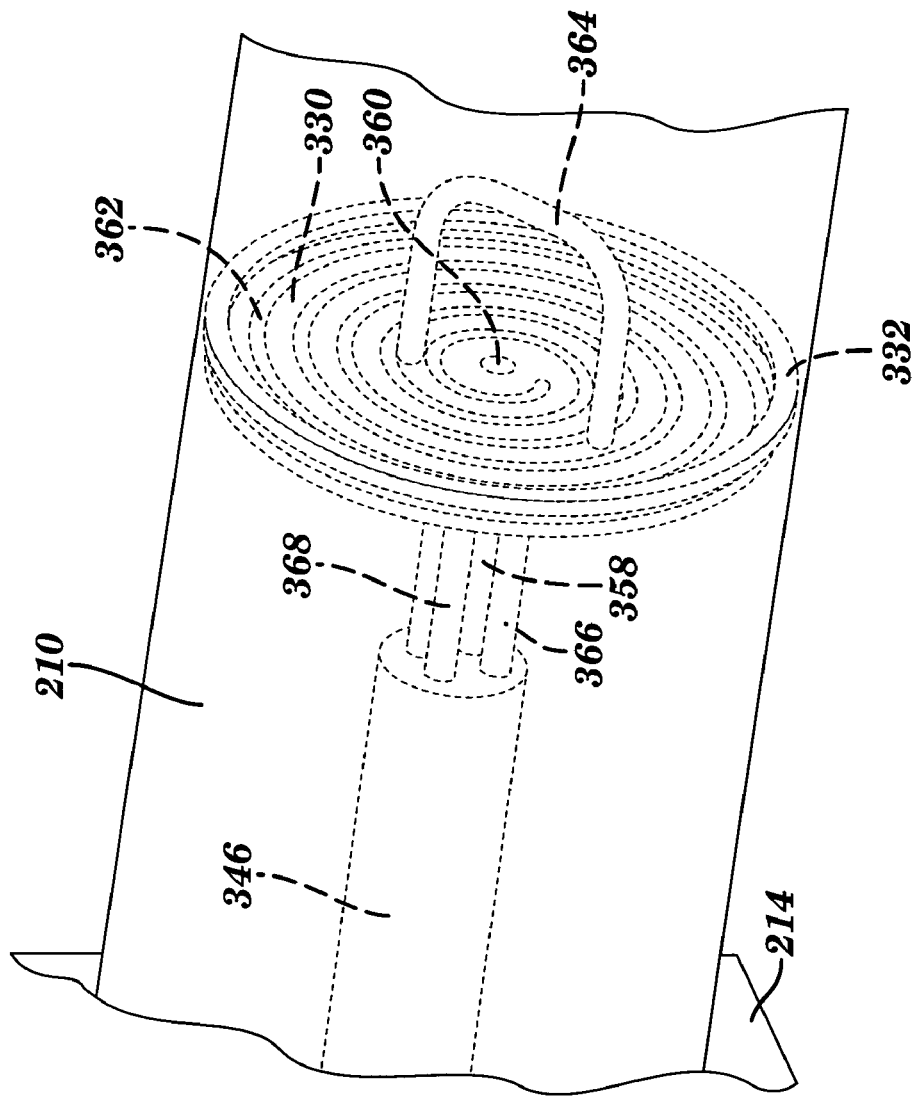
FIG. 18B is a detailed view of one aspect of the furnace assembly shown in FIG. 18A.
Figure 19:
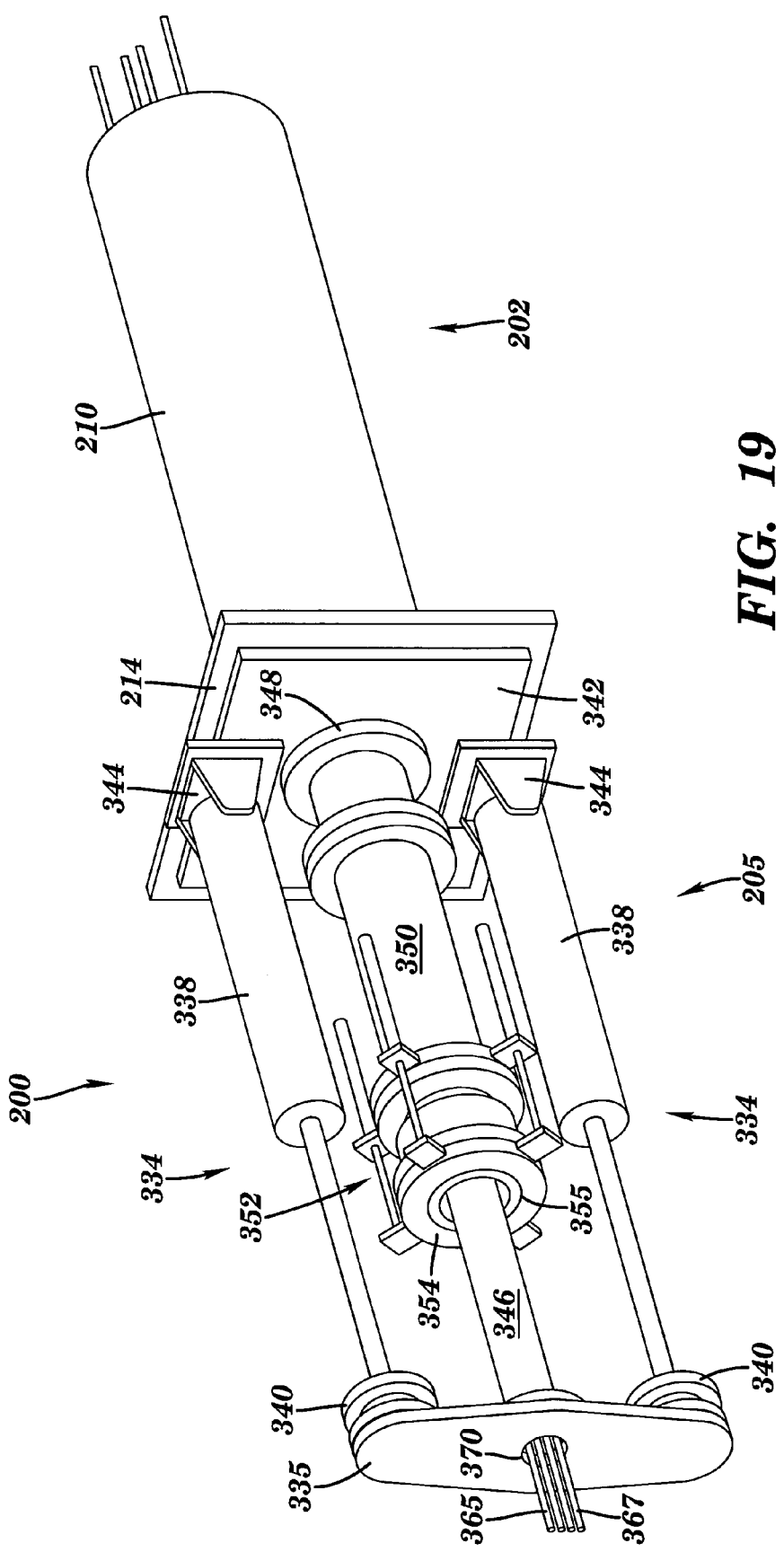
FIG. 19 is a left-hand perspective view of a tube furnace assembly shown in FIG. 18A.
Figure 20:
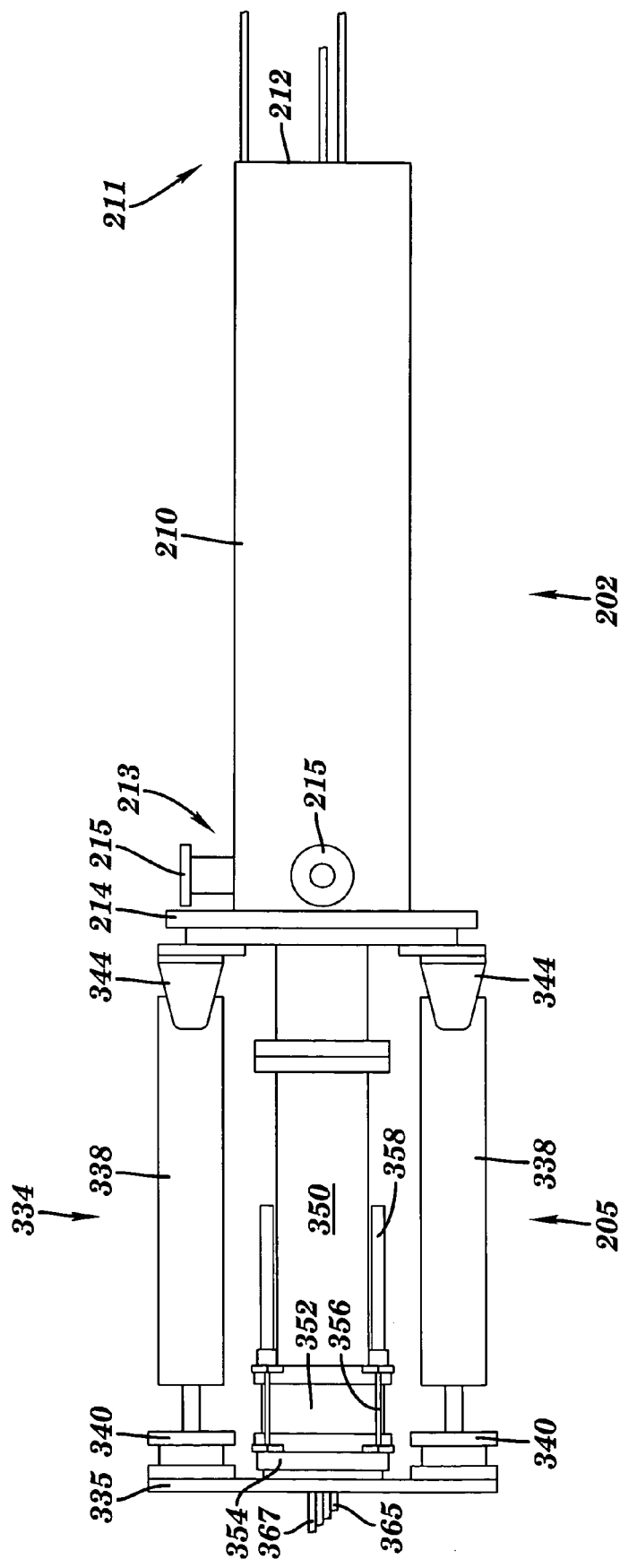
FIG. 20 is a front elevation view of the tube furnace shown in FIG. 18A.
Figure 21:
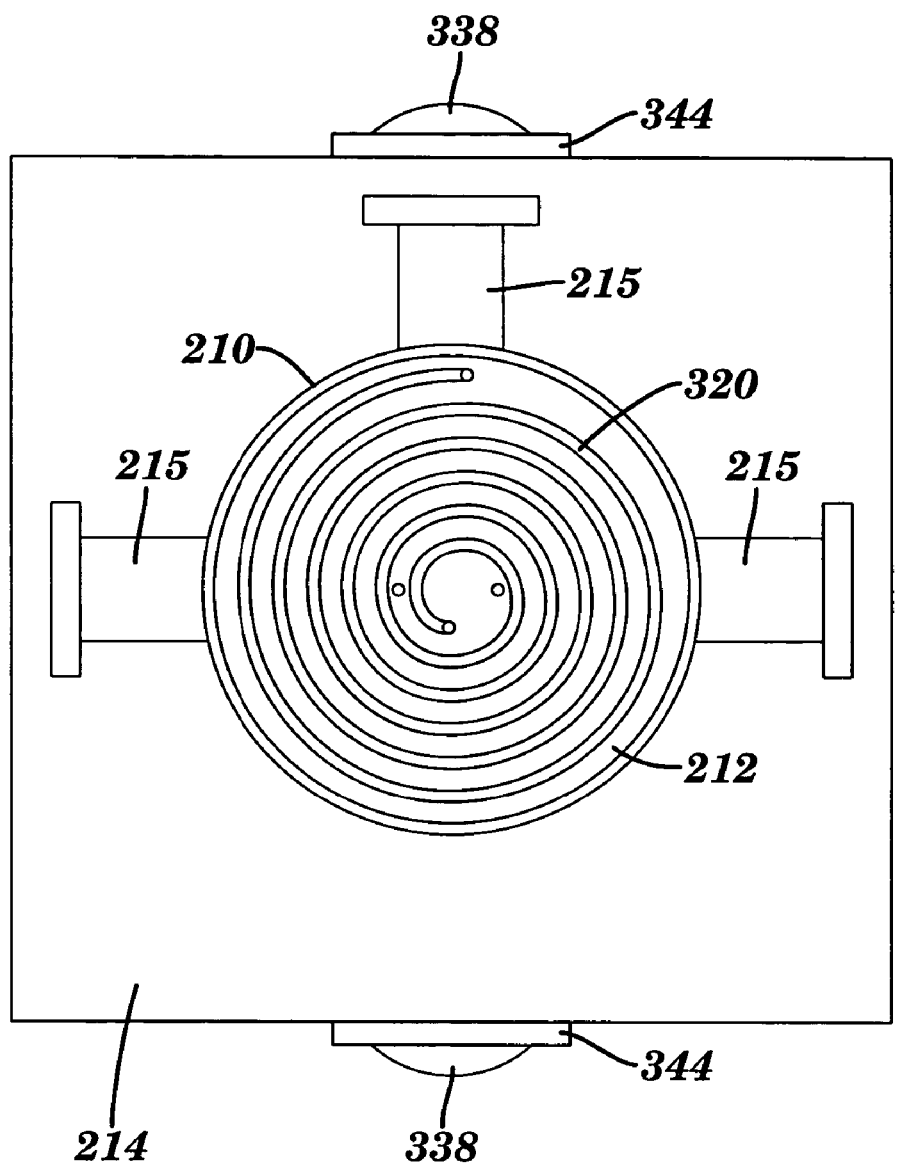
FIG. 21 is a right side elevation view of the tube furnace shown in FIG. 18A.
Figure 22:
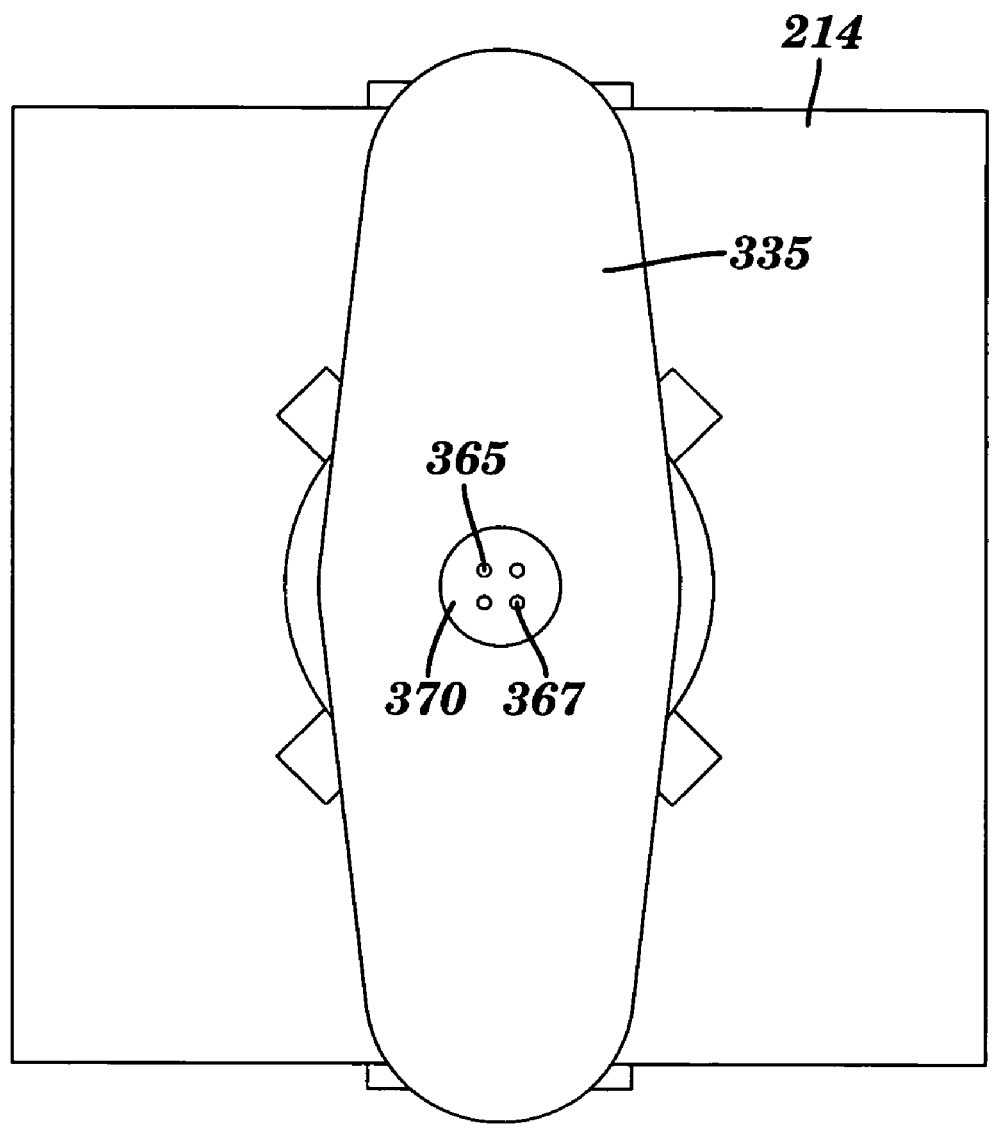
FIG. 22 is a left side elevation view of the tube furnace shown in FIG. 18A.
Figure 23:
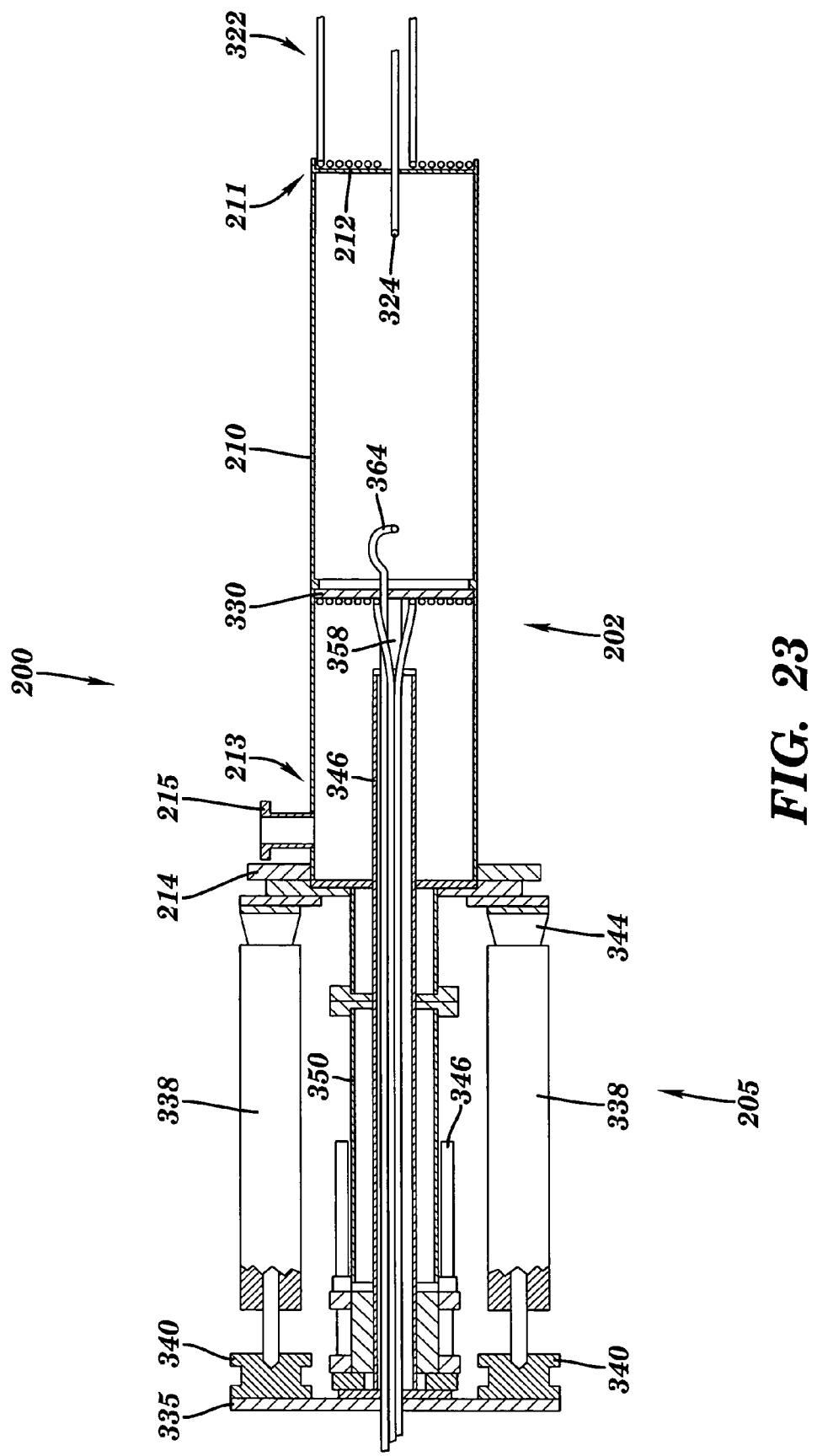
FIG. 23 is a cross sectional view of the tube furnace shown in FIGS. 18A-22

FIG. 18A is a right-hand perspective view of a furnace assembly 200 according to another aspect of the invention. FIG. 18B is a detailed view of one aspect of the furnace 200 shown in FIG. 18A. FIG. 19 is a left-hand perspective view of a tube furnace assembly 200 shown in FIG. 18A with the extraction assembly extended according to aspects of the invention. FIG. 20 is a front elevation view of the furnace shown in FIG. 18A. FIG. 21 is a right side elevation view of the furnace shown in FIG. 18A. FIG. 22 is a left side elevation view of the furnace shown in FIG. 18A. FIG. 23 is a cross sectional view of the furnace assembly 200 shown in FIGS. 18A-22.

As shown in FIG. 18A, furnace assembly 200 includes a treatment chamber 202 and a chamber isolation actuator assembly 204. The contents of treatment chamber 202 are shown in phantom in FIG. 18A. Treatment chamber 202 comprises a cylindrical tube 210 capped at a distal end 211 by a cover 212. Though shown as a circular cylindrical tube in FIG. 18A, tube 210 may comprise any cylindrical shape, for example, circular cylindrical, rectangular cylindrical, and oval cylindrical, among others. Though not shown in FIG. 18A, one or more work pieces, for example, photovoltaic precursors, may typically be positioned within tube 210, for example, on a support structure or "boat." The proximal end 213 of tube 210 typically is mounted to a plate 214, for example, for structural support and/or mounting to other fixtures. Treatment chamber 202 may also include one or more access ports 215, such as flanged ports, for electrical power, instrumentation, or the introduction or removal (that is, purging or venting) of process fluids.

In a fashion similar to furnace 50 shown in FIGS. 3-9, according to aspects of the invention, work pieces, for example, photovoltaic material precursors, may be treated in treatment chamber 202 with vaporous elements, for example, vaporous Se or S. Furnace assembly 200 includes heating means and/or cooling means for treating work piece for example, according to predetermine temperature schedules, such as the schedule shown in FIG. 2. Furnace assembly 200 may include heating means 320 and cooling means 322 in the distal end 211 of tube 210. Heating means 320 may comprise an electric heating element (for example, a concentric coil heating element) or tubing through which a working fluid, for example, heated air, water, or oil, may be passed (for example, a concentric coil tubing). Heating means 320 may be mounted to the inside or outside surfaces of cover 212 or tube 210 and the heating means may be energized by wire 323. Cooling means 322 may also comprise tubing through which a coolant is passed, for example, one or more of the coolants referenced above. The coolant tubing may be provided in concentric coil or as one or more cooling coils 324 shown in FIGS. 18A and 23.

As also shown in FIG. 18A, furnace 50 may also include a heating assembly 400, that is, a heating assembly 400 mounted about cylindrical tube 210. In FIG. 18A, heating assembly 400 is shown in perspective cross-sectional view. Heating assembly 400 may include a cylindrical housing 402 having a first end 404 and a second end 406. According to aspects of the invention, cylindrical housing 402 comprises some form of annular heating elements, for example, infrared, conductive, or convective heating elements. In one aspect, housing 402 includes at least one, but typically a plurality of sets of annular heating elements. In the aspect of the invention shown in FIG. 18A housing 402 comprises three sections of heating elements: a first section 401 adjacent first end 404 of housing 402; a second middle section 403; and third section 405 adjacent second end 406 of housing 402. Sections 401, 402, and 405 may each include a plurality of heating elements 407, for example, a plurality of resistive heating elements power and controlled by devices not shown.

First end 404 includes an annular cover plate 408 having an inside diameter 409 sized to accommodate tube 210. Plate 408 that may be mounted to housing 402 by a plurality of mechanical fasteners 410, for example, screws. Plate 408 may be adapted to thermally isolate the heating assembly 400 from tube 210; for example, plate 408 may be made from an insulating material, such as a ceramic. First end 404 may also include a sealing element 412 adapted to at least partially seal the space between the outside diameter of tube 210 and inside diameter 409 of plate 408. Sealing element 412 may be an elastomeric sealing element or a fiberglass, such as Nextel fiberglass, or its equivalent. Second end 404 may include an annular flange 416 having an inside diameter 418. A cover plate 414 may be mounted to annular flange 416 by a plurality of mechanical fasteners 420, for example, screws. In one aspect, cover plate 414 includes at least one aperture through which cooling means 322, heater wire 323, or cooling tube 324 may pass. The apertures in cover plate 414 may include a sealing element to minimize the escape of fluids.

Heating assembly 400 may include at least one port 422 for introducing a cooling medium to and at least one port 424 for removing a cooling medium from heating assembly 400. Port 422 may comprise a radial hole in cylindrical housing 402 for introducing a cooling medium, for example, a gas, such as air, or a fluid, such as water, to the cavity 415 between heating assembly 400 and tube 210. Port 424 may be adapted to remove the medium introduced. Ports 422 and 424 may be equipped with appropriate fittings (not shown) to facilitate mounting conduits, such as, tubing, to ports 422 and 424.

According to aspects of the invention, heating assembly 400 may be adapted to regulate heating of tube 210 and its contents by means of individual heating zones, for example, at least two distinct heating zones. In the aspect of the invention shown in FIG. 18A, tube 210 is heated by five (5) heating zones. Heating zone 1 may be associated with the heating means mounted to sealing plate 330, heating zone 2 may be associated with the heating section 410 in first end 404 of housing 402, heating zone 3 may be associated with the middle heating section 403 of housing 402, heating zone 4 may be associated with heating section 405 of second end 406 of housing 402, and heating zone 5 may be associated with the heating means mounted to cover plate 212. According to aspects of the invention, the temperature of these zones may be regulated to provide the desired treatment of the work piece introduced to tube 210, for example, to regulate the heating and/or cooling of a photovoltaic precursor to provide a solar cell with enhanced performance or reliability.

The isolation of treatment chamber 200 may be effected by chamber isolation actuator assembly 205 that is adapted to compress a sealing plate 330 against an internal flange 332 in cylinder 210 to isolate a volume of cylinder 210. Isolation actuator assembly 205 includes at least, and typically two, cylinder actuator assemblies 334, a common mounting plate 335, and a central tube assembly 336. Cylinder actuator assemblies 334 may each include a long stroke cylinder 338 and a short stroke cylinder 340. Long stroke cylinder 338 and short stroke cylinder 340 may be pneumatic or hydraulic; the fluid control lines are omitted from FIGS. 18A and 19. Long stroke cylinders 340 are mounted at a first end to mounting plate 342 (see FIG. 19), by means of bracket 344 and the second end, or working end, of long stroke cylinder 340 is mounted to short stroke cylinder 340, for example, by means of mechanical fasteners. Door 342 may represent a portion of a housing into which furnace 200 is mounted. Short stroke cylinder 340 is mounted to mounting plate 335 by means of mechanical fasteners. Cylinders 338 and 340 displace plate 335 and rod 346 and sealing plate 330. Long stroke cylinders 338 may be used for large displacements of sealing plate 330, for example, during gross insertion or extraction. Short stroke cylinders 340 may be used for fine displacement of sealing plate 330, for example, during engagement or disengagement of sealing plate 330 and internal flange 332. FIG. 19 illustrates an aspect of the invention in which long stoke cylinders 338 are extended. Mounting plate 335, which may be displaced by one or more cylinder actuator assemblies 334, is mounted to support rod or tube 346. Support rod 346 is mounted to sealing plate 330 which is translated with the movement of mounting plate 335. Support rod 346 is positioned inside of central tube assembly 336. The displacement of sealing plate 330 may also be practiced manually, for example, by means of a handle and camming mechanism. The configuration of the sealing plate 330 mounted to a support rod 346, cylinders 338, and ball bearings (not shown) enables a pressure gradient between the treatment tube 210 and the area disposed between 214 and the back of the sealing plate 330 to be about one atmosphere.

Central tube assembly 336 provides a housing that, among other things, isolates the inside of tube 210 and supports rod 346. Central tube assembly 336 includes a flanged nozzle 348 mounted to plate 342, a dual-flanged spool 350, a dual flanged bellows assembly 352, and a seal plate 354. Seal 354 may provide a vacuum-tight sealing means between the bellows assembly 352 and mounting plate 335, for example, by means of one or more elastomeric o-rings 355. According to one aspect of the invention, seal plate 354 and o-rings 355 are located at a distal location from the treatment zone in tube 210, that is, between sealing plate 330 and cover plate 212, whereby low-temperature sealing means may be used and the likelihood of thermal damage to the sealing means is minimized or prevented. This aspect of the invention further comprises an o-ring disposed between door 342 and plate 214, which allows an additional low-temperature sealing means. Bellows assembly 352 includes rods 356 which retain the bellows assembly 352 in the compressed state when the cylinders 338 retract support rod 346. The compression of bellows assembly 352 may be varied by means of a biasing device 358, for example, a spring, a flexure, or a pneumatic cylinder. Central tube assembly 336 may also include a bearing support for rod 346, for example, a low-friction bearing or roller bearing (not shown) mounted within spool 350, for instance, centrally mounted within spool 350. The bearing support may support tube 346 during insertion, extraction, and operation of furnace 200.

As shown most clearly in the detail of FIG. 18B, sealing plate 330 is mounted to support rod 346 by means of short mounting rod 358, for example, by means of welding or mechanical fastener 360. As shown in FIG. 18B, sealing plate 330 mates with internal annular surface or flange 332 of tube 210 to provide a seal for treatment tube 210. Due to the high temperatures under which treatment may be practiced, the mating surfaces of sealing plate 330 and flange 332 typically exhibit metal-to-metal contact with no additional sealing means there between. In one aspect, a sealing element may be provided, for example, an elasotomeric sealing element that can withstand the typical treatment temperatures expected. However, in another aspect of the invention, no elastomeric seals are needed.

In one aspect of the invention, sealing plate 330 may also include heating or cooling means and provide a surface upon which an element may be mounted and delivered to tube 210. For example, sealing plate 330 may include an electric heating element or heating fluid coils 362 similar to distal end 211 of tube 210. Also, sealing plate 330 may include tube 364 through which a working fluid can be passed. The outer surface of tube 364 may provide a surface (similar to surface 151 of heat exchanger 86) to which a treatment element, for example, Se, may be applied and subsequently volatilized for introducing an element-containing vapor to tube 210. An electrical conduit 365 to heat the heating means or the cooling fluid tubing 367 may be located within support tube 346. For example, support tube 346 may include tube connections 366 or electrical connections 368. The tubing or wiring may access the inside of support tube 346 through an aperture 370 through plate 335 (see FIG. 19).

According to aspects of the invention, tube furnace 200 may be used to treat work pieces, for example, CIG precursors, in a fashion similar to the operation of furnace 50. Tube furnace 200 may first be "charged" with treatment element, for example, by introducing and heating the solid element, for example, Se, to volatilize the element, and then cooling to an internal surface of furnace 200 to cause the vaporous element to condense. In one aspect, the cover plate 212 at the distal end 211 of tube 202 may be cooled by means of cooling tube 324, which may extend inside tube 210, whereby the element condenses on an external surface of tube 324. As in other aspects of the invention, after charging, the work piece to be treated may be introduced to furnace 200, the furnace 200 may be closed by activating isolation actuator assembly 205 whereby plate 230 engages flange 232 to isolate tube 210. The work piece to be treated and the treatment element may then be heated, for example, according to the schedule shown in FIG. 2, to treat the work piece and minimize the loss of treatment element.

According to aspects of the present invention, work piece may be treated in furnaces 50 and 200 by means of the following procedures. According to aspects of the present invention, the temperatures of multiple elements of furnaces 50 and 200 are controlled to optimize the treatment. For example, as shown in FIG. 18A, the temperature of the sealing plate 330, end plate 212, tube 210 may be independently controlled. With respect to furnace 200, shown in FIG. 3, the temperature of the tubes 82 and the housing walls (for example, walls 53 and 57) may be independently controlled. The following process may be practiced for both furnace 50 and furnace 200, but the following discussion references furnace 50 only to facilitate the disclosure of the invention.

With reference to FIG. 9, furnace 50 is first opened and one or more treatment elements, for example, Se, is introduced to the furnace. As noted above, it is to be understood that the expression "treatment element" is used herein to facilitate the disclosure of the invention. The treatment element may comprise a treatment compound comprising two or more elements. According to aspects of the invention, the element comprises elemental sulfur or selenium or combinations of sulfur, selenium, tellurium, indium, gallium, or sodium. The introduction of the treatment element may be practiced by means of the "charging" process described below. In the following discussion, it is assumed that furnace 50 has been charged with Se on the surface 151 of heat exchanger 86 shown in FIG. 15.

The work piece to be treated with, for example, Se-containing vapor, is then introduced to the treatment tubes 82, for example, through open door assembly 52 (See FIG. 9.). One or more work pieces may be introduced to treatment tube 82 on a sheet or tray to facilitate handling of the work pieces. The work piece introduced to tubes 82 may comprise any material, but in one aspect, the work piece comprises a photovoltaic cell precursor deposited on a substrate, such as the precursor on substrate shown in FIG. 16A. The substrate may be a metallic or non-metallic substrate, such as, a glass, a steel, a stainless steel, titanium, a ceramic, or a metal-coated plastic, such as a molybdenum-coated polyimide, among other substrate materials. In one aspect of the invention, where hydrogen may be present during treatment, stainless steel substrates are avoided due to stainless steel's susceptibility to hydrogen embrittlement that may cause instability in the resulting photovoltaic cell. The substrate may be provided as a thin substrate having a thickness of between about 5 microns and about 1 mm, for example, as a metallic foil. In the following discussion, reference will be made to work piece 90, but it will be understood that in aspects of the invention any material may correspond to work piece 90.

In aspects of the invention, the photovoltaic cell precursor may be any precursor material that can be treated with a vaporous element or compound. In one aspect of the invention, the precursor comprises a precursor containing one or more elements from group 11 (that is, the "coinage metals"), group 12, group 13, and group 16 (that is, the "chalcogens") of the Periodic Table (group numbering based upon IUPAC convention; the corresponding groups in the "old" convention being 1B, 2B, 3A, and 6A, respectively). For example, in one aspect, the precursor may contain one or more of copper (Cu), indium (In), gallium (Ga), selenium (Se), sulfur (S), or sodium (Na), or combinations thereof. The precursor may be a Cu—In—Ga containing material, that is, a "CIG" material; a Cu—In—Ga—Se-containing material; or a Cu—In—Ga—Se—S-containing material.

After introducing work piece 90 to be treated into tubes 82, the front door assembly 52 is closed and the furnace 50 is evacuated, for example, by applying a vacuum to one or more of the access ports, for instance a vacuum of, typically, about $10^3$ Torr gage. The furnace 50 may then be purged with a gas, for example, a dry gas, for instance, a dry inert gas, to remove as much moisture as possible. Heat may so applied to remove moisture. The inert gas may be, for example, nitrogen, argon, or helium.

According to one aspect of the invention, the treatment tubes 82 may be filled with a treatment gas, for example, a gas that may assist in the subsequent reaction or treatment. The treatment gas may be a forming gas, such as, hydrogen, nitrogen, or combinations thereof. A treatment gas that may also be introduced to tubes 82 may include oxygen, hydrogen selenide ($H_2Se$), hydrogen sulfide ($H_2S$), or an inert gas, such as argon or helium, among other treatment gases that may be used. For example, a sulfur-containing gas, such as $H_2S$, may be introduced to tubes 82 whereby the $H_2S$ is present during the release of Se to effect a S—Se treatment, for example, to produce CIGSS. In one aspect, no forming gas may be used. The forming gas may also include hydrogen-containing gas other than $H_2Se$ or $H_2S$, for example, water ($H_2O$) vapor, ammonia ($N_2H_3$), an alcohol, or a ketone. In one aspect, the hydrogen-containing gas may provide for the in-situ formation of $H_2Se$ during treatment with a Se-containing gas. Trace amounts of hydrogen, for example, in the work piece or in the chamber, for example, provided by moisture ($H_2O$) in the chamber, may produce trace amounts of $H_2Se$ formed in situ that, for example, may react with the work piece. In one aspect of the invention, little or no hydrogen is introduced to the treatment chamber. For example, only non-hydrogen-containing gases or no forming gases at all are introduced prior to or during treatment. The gas may be introduced through one or more of the ports distributed about furnace 50. A vacuum may also be present in tubes 82. After introducing the gas to furnace 50, treatment tubes 82 may be closed, for example, by activating valve actuation assembly 68 whereby sealing assembly 84 engages the openings of tubes 82, for example, to maintain the gas and/or vacuum within tubes 82. After isolation of tubes 82 by sealing assembly 84, the volume between the tubes 82 and the walls of furnace 50 may be purged by an inert gas or vacuum to, for example, remove any excess gases or moisture.

According to aspects of the invention, upon isolation of tubes 82, the heating of the work piece 90 can commence. Again, the heating of work piece 90 may be practiced according to the heating schedule shown by curve 32 in FIG. 2 or another similar heating schedule. The heating of work piece 90 may be practiced by energizing heating elements 88. The temperature of work piece 90 may be monitored by one or more temperature sensing devices mounted in furnace 50, for example, thermocouples, resistive thermal devices (RTDs), infrared thermocouples, or a non-contact pyrometer. According to aspects of the invention, the temperature of work piece 90 is elevated to a temperature, for example, above 500 degrees C., at which the vaporous element will react with work piece 90.

As shown, for example, in FIG. 2, before, at about the same time, or shortly after the heating work piece 90 per curve 32, the temperature of the treatment element, for example, the selenium charged to heat exchanger 86, is raised, for example, according to curve 34 in FIG. 2. As discussed above, the temperature of the treatment element may be regulated by controlling the energizing of lamp 158 in heat exchanger 86 and/or controlling the flow and/or temperature of working fluid, for example, air, through heat exchanger 86. For example, the lower the flow of coolant through heat exchanger 86, the hotter the element applied to the surface of the heat exchanger 86. The temperature of the element is raised to a temperature at which the element volatilizes to form an element-containing vapor, for example, for Se, at least about 100 degrees C. However, as discussed above with respect to FIG. 2, for example, the temperature may be increased to accelerate the release of element-containing vapor. For example, Se may be elevated to temperature of 500 degrees C. or more to release sufficient Se-containing vapor to provide sufficient reaction with work piece 90. Again, according to aspects of the present invention, the temperature of the treatment element may be controlled independently of the control of the temperature of work piece 90.

After treatment at temperature, the treatment element and the work piece 90 may be cooled to complete the treatment, cooled prior to further treatment, or cooled for further handling. In one aspect, the temperature of the element is cooled to encourage the condensation of the vaporous element back on the element. This preferred cooling may be effected by rapidly cooling the element, for example, as shown by curve 34 in FIG. 2 and/or maintaining the work piece 90 and other surfaces inside furnace 50 at an elevated temperature, for example, above 170 degrees C., to discourage condensation on work piece 90 or on other surfaces within furnace 50. The element can be cooled by de-energizing or reducing the power on lamp 158 in heat exchanger 86 and/or increasing the flow of coolant through heat exchanger 86. The cooling of work piece 90 may be effected by de-energizing lamps 88. Typically, work piece 90 is cooled in a controlled fashion to prevent damage to work piece 90, for example, to prevent cracking or delaminating from the substrate or damage to the substrate itself. In one aspect, furnace 50 and its contents, for example, work pieces 90, may be rapidly cooled, for example, by forced air convective cooling. A cooling fluid my be introduced to one or more ports of furnace 50, for example, to flanged port 130 and vented through flanged port 140, to rapidly cool furnace 50 and its contents. The cooling fluid, for example, air, may be propelled by an air mover, such as a fan or blower, and the fluid may be passed through a cooling device, for example, a cooling heat exchanger or chiller.

In one aspect of the invention, the treatment or delivery of work piece 90, for example, the selenization of work piece 90, may comprise a steady-state treatment, a pulsed treatment, a cyclic treatment, a ramped treatment, a dual-source treatment, or a combination thereof. The treatment of work piece 90 with the element-containing vapor may be practiced with an excess amount of element-containing vapor, that is, an amount greater than the stoichiometric amount typically required. In steady-state treatment, the temperature of work piece 90 and the treatment element are elevated to treatment temperature, for example, above 400 degrees C., and maintained at the treatment temperature for the duration of treatment. In pulsed treatment, the temperature of work piece 90 is maintained at treatment temperature and the temperature of the treatment element is varied, for example, varied rapidly during treatment. In cyclic treatment, the temperature of work piece 90 is maintained at treatment temperature and the temperature of the treatment element is cyclically varied through, for example, a predetermined temperature cycle. In ramped treatment, the temperature of work piece 90 is maintained at treatment temperature and the temperature of the treatment element is ramped, for example, ramped slowly to a desired temperature during treatment. In dual source treatment or delivery, a gas containing two or more elements, for example, Se and S, may be exposed to work piece 90 at substantially the same time.

Dual treatment may also comprise treatment of work piece 90 with two or more vaporous elements or compounds provided by two or more heat exchangers (for example, condensers/evaporators). For example, two or more heat exchanges may be operated at different temperatures depending upon the volatilization temperature of the element or compound being delivered. In one aspect, two or more elements or compounds may be delivered by one heat exchanger, such as heat exchanger 86 shown in FIG. 15, for example, by depositing two or more elements or compounds on the surface 151 of heat exchanger 86. The two or more elements or compounds deposited on the surface of a heat exchanger may typically have different volatilization temperatures, whereby species delivery may be varied by temperature. In another aspect, two or more elements or compounds may be delivered by two or more heat exchangers, such as heat exchanger 86 shown in FIG. 15. These two or more heat exchangers adapted to deliver two or more elements or compounds to a treatment chamber may include isolation devices that limit or prevent the release of one or more vaporous elements or compounds while one or more of other vaporous elements or compounds are being released to the treatment chamber. These isolation devices may comprise seal plate or "flapper valve" type devices, for example, devices similar to the devices shown in FIGS. 11 and 12. The sequence of treatment with the two or more vaporous elements or compounds may be varied depending upon the desired treatment, for example, the delivery of the two or more vaporous elements may be provided individually or substantially simultaneously. Treatment may also be practiced repeatedly or alternated from one vaporous element to another vaporous element. In one aspect, care may be taken to avoid or prevent the condensation of one vaporous element upon another vaporous element, for example, an element having a higher condensation temperature. Again, undesirable condensation on treatment elements or compounds may be avoided by use of suitable isolation means, such as the sealing devices discussed above.

In one aspect of the invention, dual treatment may be practiced for staged release of treatment vapors. For example, one or more heat exchangers may be used having Se and In and/or Ga compounds deposited on their outer surface. The precursor, for example, a Cu—In—Ga precursor, may first be treated with Se by raising the one or more heat exchangers to a first temperature at which Se volatilizes, but In and/or Ga compounds do not. After treatment with Se, the temperature of the one or more heat exchangers may be raised to volatilize, for example the In compound. The In compound vapor may then treat the precursor or the In compound vapor may react with the Se vapor present in the chamber to form indium selenide in situ, where the precursor may then be treated with the indium selenide vapor. A similar staged treatment may be practiced for Ga compounds, where gallium selenide may be formed in situ. Sulfur and In and/or Ga compounds may also be handled in a similar fashion to provide dual treatment with S and In and/or Ga compounds. In one aspect, this dual treatment may be an effective alternative for treating copper-rich precursors to provide effective photovoltaic materials that could not be formed otherwise. Copper-rich precursors are known to have inferior performance due to the electrical shorting effect of the excess copper compounds, for example, copper selenide. Dual treatment of copper-rich precursors according to aspects of the invention, can improve the performance of the resulting absorber.

The treatment of work piece 90 with the vaporous element may be practiced repeatedly, for example, three or more times, to provide the desired treatment. Upon completion of the treatment, sealing assembly 84 can be disengaged from treatment tubes 82 and the furnace purged or vented. The vented gases are typically processed to prevent release of gases to the environment.

Figure 24:
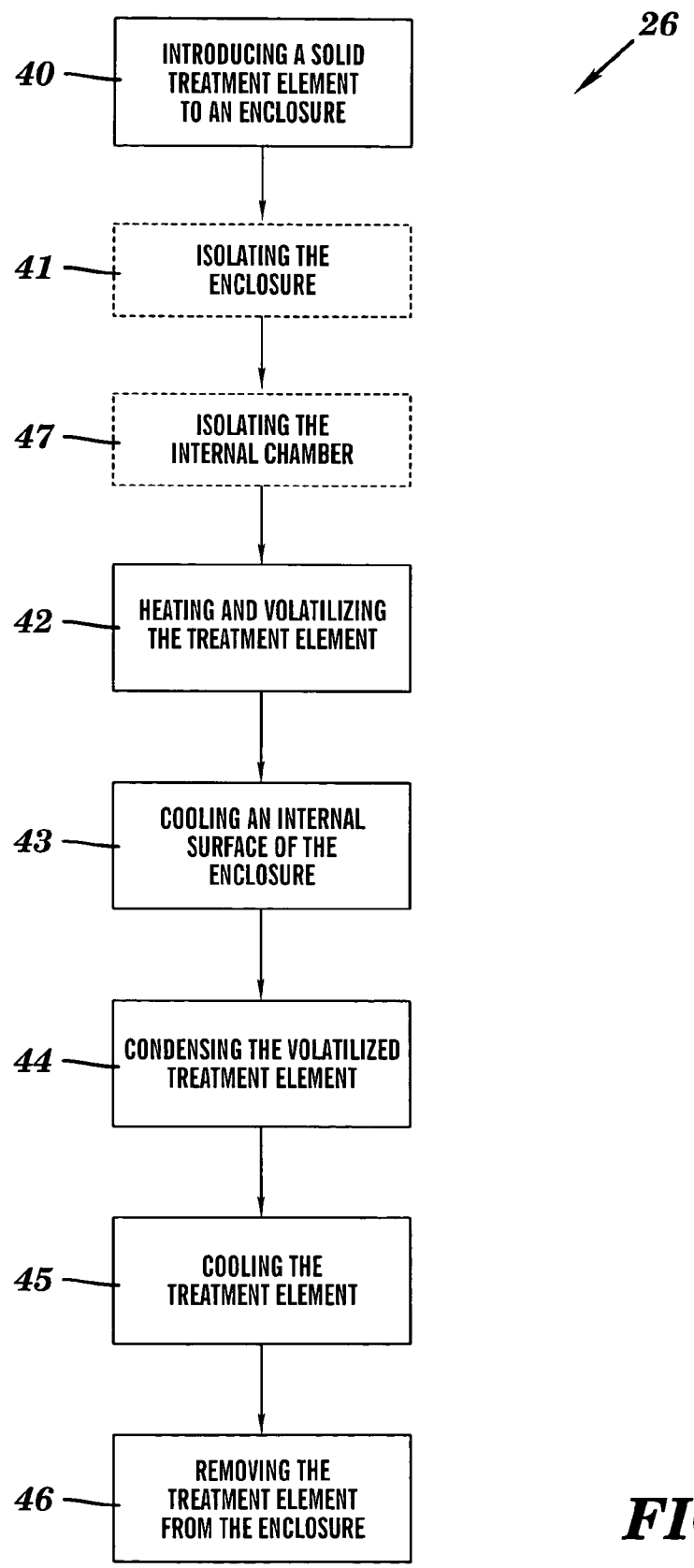
FIG. 24 is a schematic block diagram of a process for charging the treatment element to the enclosure according to one aspect of the invention

FIG. 24 is a schematic block diagram 26 of a process for charging the treatment element to the enclosure according to one aspect of the invention. In one aspect of the invention, the "charging" of the element to the treatment chamber comprises the process of introducing the treatment element to the treatment enclosure whereby the treatment element can be subsequently released in a vaporous form to react with the work piece being treated. As shown in FIG. 24, the process of charging 26 the enclosure with the treatment element may be initiated by introducing a solid treatment element to an enclosure 40. For example, the treatment element may be introduced as a powder, as beads, or as an ingot. The treatment element may be introduced to the enclosure by simply placing the solid element on the bottom of the enclosure, placing a container (for example, a "boat") containing the element into the enclosure, or placing the element on an appropriate support means, for example, a shelf or cavity, located in the enclosure. The element may also be automatically fed into the furnace, for example, by means of an automated feeder, for example, an automated wire-element feeder. As noted above, it is to be understood that the expression "treatment element" is used herein to facilitate the disclosure of the invention. The treatment element may comprise a treatment compound comprising two or more elements. According to aspects of the invention, the solid element or compound introduced to the treatment chamber may be an element of group 11, 12, 13, or 16 of the Periodic Table, for example, selenium, sulfur, indium, gallium, indium selenide, indium sulfide, gallium selenide, gallium sulfide, or combinations thereof. The element or compound may also include sodium or a sodium-containing compound.

Next, the enclosure is closed, sealed, or otherwise isolated 41 to minimize or prevent the leakage of vaporous element from the enclosure. In one aspect, after isolating the enclosure 41, the enclosure may be evacuated, for example, by applying a vacuum to the enclosure. In one aspect, a typical vacuum of 10−3 Torr gage may be applied to the enclosure. The vacuum may be maintained during the charging process. When the enclosure includes an internal treatment chamber, for example, the tube 82 shown in FIG. 16A, process 26 may include the optional step 47 of isolating the internal treatment chamber. This isolation of the internal chamber may be practiced using a chamber isolation assembly, such as sealing assembly 84 shown in FIGS. 11 and 12, for example, where a "flapper" valve isolates the internal chamber.

As shown in FIG. 24, according to process 26, the treating element is then heated 42 to a temperature above which the element will volatilize at the prevailing pressure; for example, when the treatment element is Se, the Se is heated to a temperature of between about 100 and about 400 degrees C. The heating of step 42 may, for example, be effected by infrared lamps 88 shown in FIG. 10, heating assembly 400 shown in FIG. 18A, or heating coils 320 shown in FIG. 18A. At this temperature, the Se begins to volatilize to create a selenium-containing gas into the enclosure. However, to increase the volatilization, the temperature of the element may typically be increased to a temperature greater than the initial volatilization temperature to ensure a plentiful supply of the vaporous element. For example, when Se is used, the Se is typically heated to at least about 500 degrees C. to ensure an adequate supply of Se in vaporous form.

Prior to, during, or after the heating the treatment element 42, at least one surface inside the enclosure is cooled 43 to provide a temperature less than the temperature at which the element volatilizes. For example, again, for Se, this temperature may typically be a temperature less than 100 degrees C., for example, a temperature of about 80 degrees C. or lower. In one aspect, the cooling is practiced to maintain the surface at a temperature below the vapor pressure temperature of the element, for example, Se or S. The cooling of a surface inside the enclosure is typically provided by some form of heat exchanger having a working fluid passing through it. One typical heat exchanger that may be used for aspects of this invention is heat exchanger 86 shown in and described with respect to FIGS. 15-17. According to aspects of the invention shown in FIG. 24, the cooled surface of the heat exchanger provides a condensation site for the condensation 44 of the vaporous element provided by heating 42. The heating 42, cooling 43, and condensing 44 steps of the charging process 26 may be practiced repeatedly (for example, three or more times) or for an extended period of time (for example, at least about 20 minutes) to provide the desired content of treatment element on a surface inside the enclosure.

After sufficient element has been condensed upon the surface, the surface and solid element may be cooled 45 (assuming that the solid element has not completely volatilized) to terminate the volatilization. In one aspect, the cooling of the surface and the treatment element is practiced rapidly, for example, at rate of at least about 10° C./min, to allow at least some of the vaporous element released in step 42 to condense onto the solid element and/or surface. This recapture of the treatment element through controlled or rapid cooling of the solid element and/or surface minimizes the loss of the element to condensation on other surfaces of the enclosure and related structures. In one aspect, during cooling of the element for recapture, the temperature of the surfaces of the enclosure and of any surfaces within the enclosure may be maintained at an elevated temperature, for example, a temperature above 170 degrees C. for Se, to discourage condensation on surfaces other than the cooled surface or solid element. When cooling of the element 45 is completed, the element may be removed from the enclosure 46. When an internal chamber is used, process 26 may also include the step of opening the internal chamber, for example, disengaging the sealing assembly 84 shown in FIGS. 11 and 12. The enclosure, and any internal treatment chambers, may be vented, for example, in preparation for subsequent treatment in the enclosure. With completion of the charging process 26, with treatment element provided on a surface within the enclosure, the treatment of a work piece as shown and described with respect to FIGS. 1 and 2 may commence.

Figure 25:
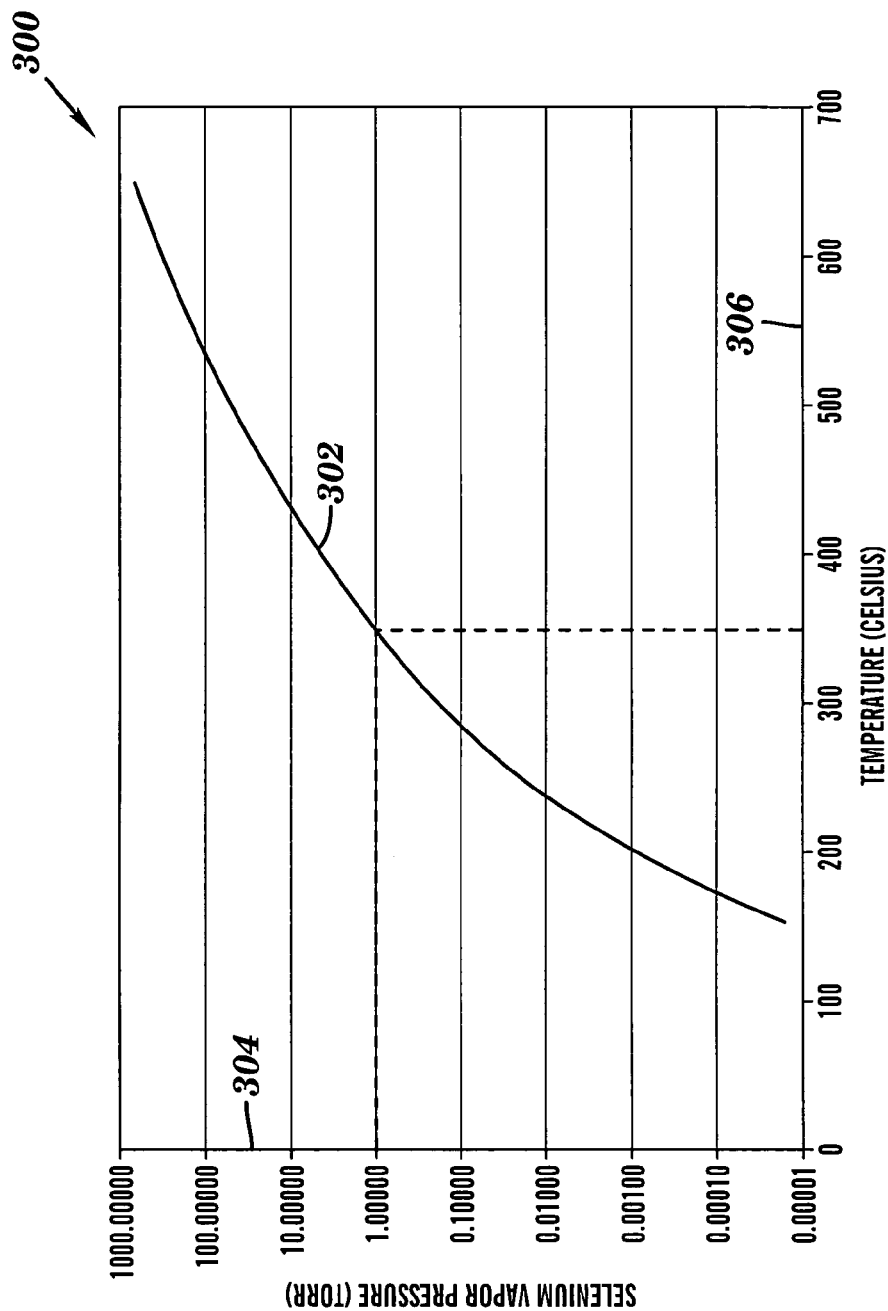
FIG. 25 is a plot of treatment element vapor pressure as a function of temperature.
Figure 26:
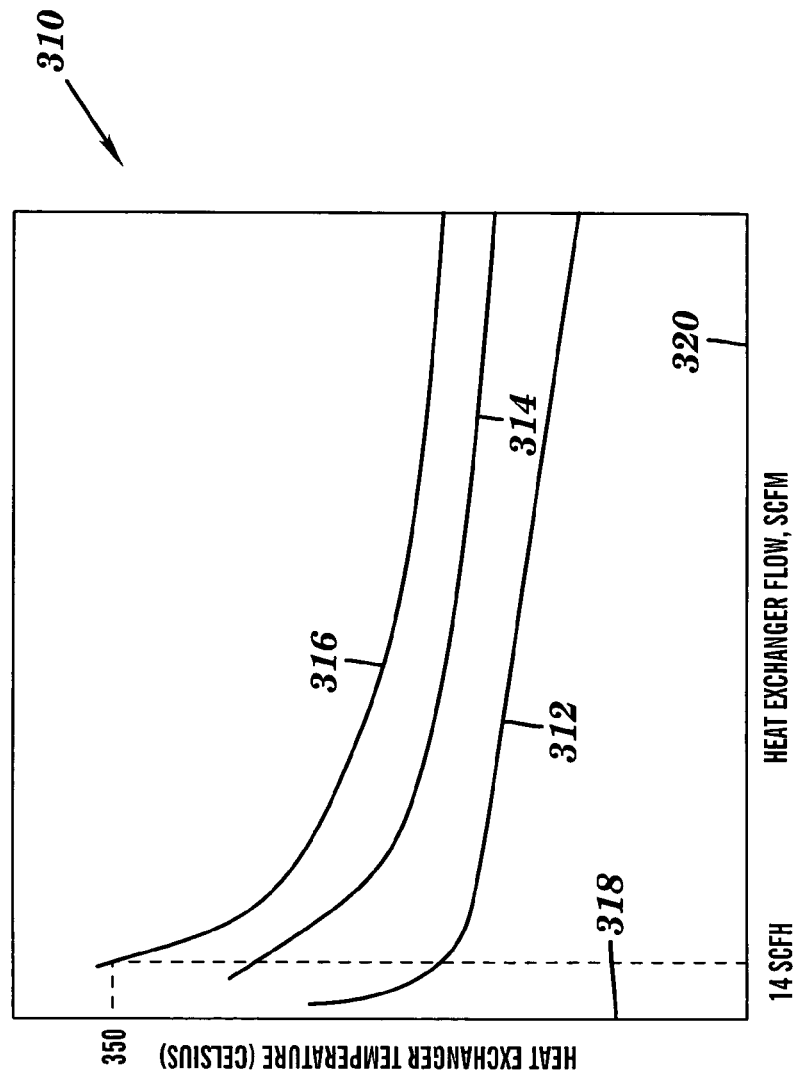
FIG. 26 is a plot of heat exchanger temperature as a function of coolant flow according to one aspect of the invention.

FIG. 25 is a plot 300 of treatment element vapor pressure as a function of temperature for selenium, though a similar curve may be provided for other treatment elements. FIG. 26 is a plot 310 of heat exchanger (for example, condenser/evaporator) temperature as a function of coolant flow according to one aspect of the invention. The curves shown in FIG. 26 were determined for one specific heat exchanger, for example, the tube type device shown in FIGS. 18A through 23. Similar curves may be provided for other heat exchangers relating coolant flow to temperature. The curves for other heat exchangers may vary depending upon the size of the heat exchanger, the type of coolant used, and the thermal characteristics of the material from which the heat exchanger is made, among other things. According to one aspect of the invention, the curves shown in FIGS. 25 and 26 may be used in conjunction with the curves shown in FIG. 2 to control the operation of a treatment furnace, for example, to control the operation of furnace 50 shown in FIGS. 3-9 or furnace 200 shown in FIGS. 18-23.

As shown in FIG. 25, the curve 302 in plot 300 represents the relationship of the vapor pressure of selenium, in Torr, as shown in the log scale on ordinate 304 in FIG. 26, and temperature, in degrees C., shown on abscissa 303. Clearly, the vapor pressure of selenium increases with temperature. Plot 310 in FIG. 26 displays three curves 312, 314, and 316 that correspond to the relationship of the heat exchanger temperature (for example, evaporator/condenser), in degrees C., as shown on ordinate 318 for three furnace temperatures as a function of coolant flow, in standard cubic feet per minute (SCFM), shown on the abscissa 320. In the aspect of the invention shown in FIG. 26, curves 312, 314, and 315 correspond to representative furnace temperatures of 300 degrees C., 400 degrees C., and 500 degrees C., respectively. Again, the shape and magnitude of curves 312, 314, and 318 may vary for other heat exchangers or other furnace operating temperatures.

According to aspects of the present invention, the curves that appear in FIGS. 2, 25, and 26 may be used to control the operation of a treatment furnace as follows. FIG. 2 provides one desired temperature schedule for treating a work piece, for example, a photovoltaic precursor, with a vaporous element, for example, vaporous selenium or sulfur. As discussed above, to ensure an adequate supply of vaporous element, for example, Se, to obtain the desired reaction with the work piece, for example, the precursor, the temperature of the element is increased to provide a desired partial pressure of element vapor in the treatment chamber. The desired partial pressure for one aspect of the invention is shown by curve 35 in FIG. 2. In order to obtain this element partial pressure, the temperature of the element must be regulated according to the temperature-pressure curve 302 shown in FIG. 25. The temperature determined by curve 302 is then used to regulate the flow of coolant through the heat exchanger as indicated by curves 312, 314, and 316 in FIG. 26. The flow of coolant, for example, air, to the heat exchanger is then regulated, for example, by a control valve, to obtain the desired coolant flow. In another aspect of the invention, the temperature of the coolant, for example, air, may be varied to effect the desired element temperature. For example, the temperature of the coolant may be regulated by varying the temperature of a heat exchanger adapted to heat or cool the working fluid, for example, an external heat exchanger having a working fluid passing through it.

For example, assuming that from curve 35 in FIG. 2, the desired partial pressure for treating a precursor with Se at a temperature $T_{E3}$ is about 1.0 Torr. From FIG. 25, curve 302, and pressure 1.0 Torr on ordinate 304, the desired heat exchanger temperature is about 350 degrees C. By comparing a desired heat exchanger temperature of 350 degrees C. with curve 316 in FIG. 26, a desired heat exchanger flow rate of, for example, about 14 standard cubic feet per hour (SCFH) is obtained. Therefore, to obtain the desired temperature $T_{E3}$, the flow of coolant, for example, air, through the heat exchanger is regulated to about 14 SCFH. The flow of coolant, for example, air, through a heat exchanger according to aspects of the invention may vary from about 10 SCFH to about 25 SCFM, and is typically between about 0.1 SCFM and 3 SCFM.

This control of the operation of the coolant flow to regulate the heat exchanger may be practiced manually, but is preferably, practiced in an automated fashion, for example, by means of computer, programmable logic controller (PLC), temperature feedback loop, PID controller, or another automated controller. For example, in one aspect, the curves illustrated in FIGS. 2, 25, and 26, may be programmed into a computer or PLC and operated to control the operation of, for example, an automated valve controller of a coolant flow valve.

The methods and apparatus according to aspects of the invention described above may be used to manufacture an improved photovoltaic material, for example, a material having little or no hydrogen content. Such a material has the advantage of not being prone to the deterioration in performance that characterizes prior art materials having hydrogen. For example, as discussed above, in one aspect of the invention, a precursor may be treated with a treatment gas, such as a selenium-containing vapor, with little or no presence of hydrogen. In prior art methods, selenium is typically introduced in the form of $H_2Se$ whereby hydrogen (H) inherently is introduced to the reaction and to the absorber matrix. According to aspects of the invention, the treatment chamber can be effectively purged of essentially all hydrogen by means of vacuum and/or non-hydrogen purge gas. As a result, the precursor, for example, the CIG precursor, can be treated with a Se— or S-containing vapor (that is, a H-free vapor) to produce an essentially H-free absorber. In one aspect of the invention, the absorber comprises a CIGS absorber having less then 5% hydrogen content, or typically less than 1% hydrogen content, or can be substantially hydrogen free. Such a low-hydrogen or hydrogen free absorber, for example, a low-H or H-free CIGS or CIGSS absorber, can provide more reliable performance without the degradation that characterizes hydrogen-containing absorbers.

The control and operation of furnaces 50 and 200 may be performed manually or by means of one or more automated controllers, for example, a personal computer or PLC. These control devices may include specially designed software designed to monitor and control the operation of furnaces 50 and 200. Furnaces 50 and 200 may typically include sensors, for example, temperature sensors, pressure sensors, and flow sensors, and controllers, for example, automatic temperature, pressure, or flow controllers to regulate and control the operation of furnaces 50 and 200. The electrical connections associated with these sensors and controllers may pass through one or more of the many access ports associated with furnaces 50 and 200.

In one aspect of the invention, the methods and apparatuses disclosed herein may be practiced or utilized in a batch mode, for example, one or more work pieces may be treated in furnaces 50 or 200 and the work pieces removed for subsequent treatment of further work pieces. However, according to another aspect of the invention, the methods and apparatuses disclosed herein may be adapted for continuous treatment whereby a substantially continuous flow of work pieces may be processed according to the disclosed methods or handled by, for example, introduced and removed from, the disclosed apparatus. In one aspect, unlike the temperature variations shown FIG. 2, the treatment conditions of the continuous methods may be substantially stable as work pieces are introduced and removed from the treatment chambers.

Aspects of the present invention provide improved means of treating work pieces, especially, improved means of treating and producing photovoltaic cells. Methods and apparatus according to aspects of the present invention can assist in reducing the production costs of photovoltaic cells whereby photovoltaic energy can be a cost effective alternative to the diminishing supply of fossil fuels.

While several aspects of the present invention have been described and depicted herein, alternative aspects may be conceived by those skilled in the art to accomplish the same objectives. Accordingly, it is intended by the appended claims to cover all such alternative aspects that fall within the true spirit and scope of the invention.

The invention claimed is:

1. A method for treating a work piece with one or more vaporous elements, the method comprising:

introducing the work piece and a source of an element-containing material to an enclosure;

heating the work piece to a first temperature;

independent of the heating of the work piece, heating the source of the element-containing material to a temperature sufficient to volatilize the element and release an element-containing vapor into the enclosure;

reacting at least some of the element-containing vapor with the work piece;

regulating the temperature of the source of the element-containing material at a temperature sufficient to condense at least some of the element from the element-containing vapor on the source of the element-containing material; and cooling the work piece to provide an element-treated work piece;

wherein regulating the temperature of the source of the element-containing material comprises cooling the source of the element-containing material wherein unreacted element-containing vapor condenses on the source of the element-containing material to provide at least a 90% utilization rate of the element; and wherein the utilization rate comprises a percent ratio of the amount of the element that condenses on the source to a difference of an amount of the element volatilized and an amount of element that reacts with the work piece.

2. The method as recited in claim 1, wherein the element-containing material comprises one of sulfur, selenium, tellurium, indium, gallium, sodium, and combinations thereof.

3. The method as recited in claim 1, wherein reacting at least some of the element-containing vapor with the work piece comprises one of treating the work piece with the element-containing vapor and providing an overpressure of the element-containing vapor to the work piece.

4. The method as recited in claim 1, wherein the method further comprises cooling the source of the element-containing material wherein substantially all of the unreacted element-containing vapor condenses on the source of the element-containing material.

5. The method as recited in claim 4, wherein cooling the source of the element-containing material comprises active cooling.

6. The method as recited in claim 1, wherein the method further comprises introducing a treatment gas to the enclosure.

7. The method of claim 6, wherein the treatment gas comprises one or more of a forming gas, hydrogen, oxygen, hydrogen selenide, hydrogen sulfide, argon, and helium.

8. The method as recited in claim 1, wherein the work piece comprises a photovoltaic precursor.

9. The method as recited in claim 8, wherein the photovoltaic precursor comprises an element from at least one of group 11, group 12, and group 13 of the Periodic Table.

10. The method as recited in claim 9, wherein the photovoltaic precursor comprises at least copper, indium, and gallium.

11. The method as recited in claim 1, wherein the method further comprises providing a chamber surrounding the enclosure.

12. The method as recited in claim 1, wherein introducing the source of the element-containing material to the enclosure comprises:
introducing a solid source of the element-containing material to the enclosure;
isolating the enclosure;
heating the solid source of the element-containing material to a temperature above which the solid source of the element-containing material will volatilize to produce an element-containing vapor; and
condensing at least some of the element-containing vapor upon an internal surface of the enclosure to provide at least some of the source of the element-containing material to the enclosure.

13. The method as recited in claim 12, wherein introducing the solid source of the element-containing material to the enclosure comprises automatically feeding the solid element-containing material to the enclosure.

14. The method as recited in claim 12, wherein isolating the enclosure comprises closing the enclosure to minimize leakage of the element-containing vapor.

15. The method as recited in claim 12, wherein the method further comprises, after isolating the enclosure, applying a vacuum to the enclosure.

16. The method as recited in claim 12, wherein heating the solid source of the element-containing material comprises heating the solid source of the element-containing material to a temperature from about 100 degrees C. to about 500 degrees C.

17. The method as recited in claim 12, wherein the method further comprises cooling the at least one internal surface of the enclosure to promote condensation of the element-containing vapor.

18. The method as recited in claim 17, wherein cooling the at least one internal surface comprises cooling the at least one internal surface to a temperature below the temperature at which the element in the solid source of the element-containing material volatilizes.

19. The method as recited in claim 18, wherein cooling the at least one internal surface to a temperature below the temperature at which the element in the solid source of the element-containing material volatilizes comprises cooling the at least one internal surface to a temperature less than 100 degrees C.

20. The method as recited in claim 17, wherein the heating, condensing, and cooling steps are practiced repeatedly.

21. The method as recited in claim 1, wherein cooling the source of the element-containing material is practiced while controlling at least one surface of the enclosure at a temperature above the temperature of the source of the element-containing material to minimize condensation of the element-containing material on other than the source of the element-containing material.

22. The method as recited in claim 1, wherein heating the work piece to a first temperature comprises heating the work piece to a temperature of at least about 100 degrees C.

23. The method as recited in claim 22, wherein heating the work piece further comprises heating the work piece to a second temperature greater than the first temperature.

24. The method as recited in claim 23, wherein the second temperature is between about 400 degrees C. and about 600 degrees C.

25. The method as recited in claim 1, wherein heating the source of the element-containing material comprises heating the source of the element containing material to a first temperature below the volatilization temperature of the element in the source of the element-containing material to minimize volatilization of the element.

26. The method as recited in claim 25, wherein heating the source of the element-containing material to the first temperature below the volatilization temperature of the element in the source of the element-containing material to minimize volatilization of the element comprises heating the source of the element-containing material to a temperature below 100 degrees C.

27. The method as recited in claim 25, wherein heating the source of the element-containing material comprises heating the source of the element-containing material to a second temperature higher than the first temperature to promote volatilization of the element.

28. The method as recited in claim 27, wherein the second temperature comprises a temperature between about 100 degrees C. and 400 degrees C.

29. The method as recited in claim 1, wherein heating the source of the element-containing material comprises heating the source of the element-containing material to a temperature at or above the volatilization temperature of the element in the source of the element-containing material to promote volatilization of the element.

30. The method as recited in claim 29, wherein the temperature is at or above 100 degrees C.

31. The method as recited in claim 1, wherein cooling the work piece comprises active cooling.

32. The method as recited in claim 31 wherein active cooling is practiced at a rate of at least about 5 degrees C. per minute to minimize cracking or delamination of the work piece.

33. The method as recited in claim 1, wherein heating the work piece, heating the source of the element-containing material, reacting, and cooling are practiced repeatedly.

34. The method as recited in claim 1, wherein introducing the work piece and the source of the element-containing material to the enclosure comprises introducing the work piece and the source of the element-containing material to the same enclosure.

35. The method as recited in claim 1, wherein introducing the work piece and the source of the element-containing material to the enclosure comprises introducing the work piece and one of a solid and a liquid source of the element-containing material to the same enclosure.

36. The method as recited in claim 1, wherein the method is practiced substantially sequentially.

37. The method as recited in claim 1, wherein the utilization rate comprises the percent ratio of the element that reacts with the work piece to the element that is volatilized.

38. The method as recited in claim 1, wherein the work piece comprises at least some selenium.

39. A method for treating a work piece with one or more vaporous elements, the method comprising:
  introducing the work piece and a source of an element-containing material to an enclosure;
  heating the work piece to a first temperature;
  independent of the heating of the work piece, heating the source of the element-containing material to a temperature sufficient to volatilize the element and release an element-containing vapor into the enclosure;
  reacting at least some of the element-containing vapor with the work piece;
  cooling the source of the element-containing material to a temperature sufficient to condense substantially all of the unreacted element-containing vapor on the source of the element-containing material; and
  cooling the work piece to provide an element-treated work piece.

40. The method as recited in claim 39, wherein the element-containing material comprises one of sulfur, selenium, tellurium, indium, gallium, sodium, and combinations thereof.

41. The method as recited in claim 39, wherein reacting at least some of the element-containing vapor with the work piece comprises one of treating the work piece with the element-containing vapor and providing an overpressure of the element-containing vapor to the work piece.

42. The method as recited in claim 39, wherein the method further comprises introducing a treatment gas to the enclosure.

43. The method of claim 42, wherein the treatment gas comprises one or more of a forming gas, hydrogen, oxygen, hydrogen selenide, hydrogen sulfide, argon, and helium.

44. The method as recited in claim 39, wherein the work piece comprises a photovoltaic precursor.

45. The method as recited in claim 44, wherein the photovoltaic precursor comprises an element from at least one of group 11, group 12, and group 13 of the Periodic Table.

46. The method as recited in claim 45, wherein the photovoltaic precursor comprises at least copper, indium, and gallium.

47. The method as recited in claim 39, wherein the method further comprises providing a chamber surrounding the enclosure.

48. The method as recited in claim 39 wherein the method provides a utilization rate of the element-containing material of substantially 100%.

49. The method as recited in claim 48, wherein the utilization rate comprises the percent ratio of the element that reacts with the work piece to the element that is volatilized.

50. The method as recited in claim 39, wherein introducing the source of the element-containing material to the enclosure comprises:
  introducing a solid source of the element-containing material to the enclosure;
  isolating the enclosure;
  heating the solid source of the element-containing material to a temperature above which the solid source of the element-containing material will volatilize to produce an element-containing vapor; and
  condensing at least some of the element-containing vapor upon an internal surface of the enclosure to provide at least some of the source of the element-containing material to the enclosure.

51. The method as recited in claim 50, wherein introducing the solid source of the element-containing material to the enclosure comprises automatically feeding the solid element-containing material to the enclosure.

52. The method as recited in claim 50, wherein isolating the enclosure comprises closing the enclosure to minimize leakage of the element-containing vapor.

53. The method as recited in claim 50, wherein the method further comprises, after isolating the enclosure, applying a vacuum to the enclosure.

54. The method as recited in claim 50, wherein heating the solid source of the element-containing material comprises heating the solid source of the element-containing material to a temperature from about 100 degrees C. to about 500 degrees C.

55. The method as recited in claim 50, wherein the method further comprises cooling the at least one internal surface of the enclosure to promote condensation of the element-containing vapor.

56. The method as recited in claim 55, wherein cooling the at least one internal surface comprises cooling the at least one internal surface to a temperature below the temperature at which the element in the solid source of the element-containing material volatilizes.

57. The method as recited in claim 56, wherein cooling the at least one internal surface to a temperature below the temperature at which the element in the solid source of the element-containing material volatilizes comprises cooling the at least one internal surface to a temperature less than 100 degrees C.

58. The method as recited in claim 55, wherein the heating, condensing, and cooling steps are practiced repeatedly.

59. The method as recited in claim 39, wherein cooling the source of the element-containing material is practiced while controlling at least one surface of the enclosure at a temperature above the temperature of the source of the element-containing material to minimize condensation of the element-containing material on other than the source of the element-containing material.

60. The method as recited in claim 39, wherein heating the work piece to a first temperature comprises heating the work piece to a temperature of at least about 100 degrees C.

61. The method as recited in claim 60, wherein heating the work piece further comprises heating the work piece to a second temperature greater than the first temperature.

62. The method as recited in claim 61, wherein the second temperature is between about 400 degrees C. and about 600 degrees C.

63. The method as recited in claim 39, wherein heating the source of the element-containing material comprises heating the source of the element containing material to a first temperature below the volatilization temperature of the element in the source of the element-containing material to minimize volatilization of the element.

64. The method as recited in claim 63, wherein heating the source of the element-containing material to the first temperature below the volatilization temperature of the element in the source of the element-containing material to minimize volatilization of the element comprises heating the source of the element-containing material to a temperature below 100 degrees C.

65. The method as recited in claim 63, wherein heating the source of the element-containing material comprises heating the source of the element-containing material to a second temperature higher than the first temperature to promote volatilization of the element.

66. The method as recited in claim 63, wherein the second temperature comprises a temperature between about 100 degrees C. and 400 degrees C.

67. The method as recited in claim 39, wherein heating the source of the element-containing material comprises heating the source of the element-containing material to a temperature at or above the volatilization temperature of the element in the source of the element-containing material to promote volatilization of the element.

68. The method as recited in claim 39, wherein cooling the source of the element-containing material comprises active cooling.

69. The method as recited in claim 39, wherein cooling the source of the element-containing material substantially recaptures vaporized element to provide substantially 100% utilization of the element.

70. The method as recited in claim 39, wherein heating the work piece, heating the source of the element-containing material, reacting, and cooling are practiced repeatedly.

71. The method as recited in claim 39, wherein introducing the work piece and the source of the element-containing material to the enclosure comprises introducing the work piece and one of a solid and a liquid source of the element-containing material to the same enclosure.

72. The method as recited in claim 39, wherein the method is practiced substantially sequentially.

73. The method as recited in claim 39, wherein the work piece comprises at least some selenium.

74. The method as recited in claim 39, wherein regulating the temperature of the source of the element-containing material comprises cooling the source of the element-containing material wherein the unreacted element-containing vapor condenses on the source of the element-containing material to provide substantially 100% utilization rate of the element.

75. The method as recited in claim 74, wherein the utilization rate comprises a percent ratio of the amount of the element that condenses on the source to a difference of an amount of the element volatilized and an amount of element that reacts with the work piece.

* * * * *

UNITED STATES PATENT AND TRADEMARK OFFICE
CERTIFICATE OF CORRECTION

PATENT NO. : 7,442,413 B2　　　　　　　　　　　　　　　　　　　　　　Page 1 of 1
APPLICATION NO. : 11/282934
DATED : October 28, 2008
INVENTOR(S) : Zwaap et al.

It is certified that error appears in the above-identified patent and that said Letters Patent is hereby corrected as shown below:

In the Claims:

Claim 66, Col. 39, Line 23: Delete "as recited in claim 63," and insert -- as recited in claim 65, --

Signed and Sealed this

Tenth Day of February, 2009

JOHN DOLL
*Acting Director of the United States Patent and Trademark Office*